(12) United States Patent
Kim et al.

(10) Patent No.: US 12,063,817 B2
(45) Date of Patent: Aug. 13, 2024

(54) DISPLAY APPARATUS AND METHOD OF MANUFACTURING THE SAME

(71) Applicant: Samsung Display Co., Ltd., Yongin-si (KR)

(72) Inventors: Seungrae Kim, Yongin-si (KR); Hyun Kim, Yongin-si (KR); Shoyeon Kim, Yongin-si (KR); Seulki Kim, Yongin-si (KR); Youngrok Kim, Yongin-si (KR); Kwangsoo Lee, Yongin-si (KR); Jaehyun Lee, Yongin-si (KR); Hyunsoo Lee, Yongin-si (KR); Kisu Jin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 282 days.

(21) Appl. No.: 17/406,579

(22) Filed: Aug. 19, 2021

(65) Prior Publication Data

US 2022/0181411 A1    Jun. 9, 2022

(30) Foreign Application Priority Data

Dec. 7, 2020   (KR) .......................... 10-2020-0169837

(51) Int. Cl.
*H01L 27/32*    (2006.01)
*H01L 51/56*    (2006.01)
(Continued)

(52) U.S. Cl.
CPC ....... *H10K 59/122* (2023.02); *H10K 59/1213* (2023.02); *H10K 59/124* (2023.02);
(Continued)

(58) Field of Classification Search
CPC ............................. H10K 59/12; H10K 59/131
See application file for complete search history.

(56) References Cited

U.S. PATENT DOCUMENTS 7,884,543 B2    2/2011  Doi
9,245,905 B2    1/2016  Park
(Continued)

FOREIGN PATENT DOCUMENTS

KR      10-1373276       3/2014
KR      10-2014-0140984  12/2014
(Continued)

*Primary Examiner* — Victoria K. Hall
(74) *Attorney, Agent, or Firm* — KILE PARK REED & HOUTTEMAN PLLC

(57) ABSTRACT

A display apparatus includes a substrate including a display area and a peripheral area; a thin-film transistor disposed on the substrate and including a semiconductor layer; a conductive layer disposed between the substrate and the semiconductor layer and including a pad electrode disposed in the peripheral area; a first insulating layer disposed between the conductive layer and the semiconductor layer and including a first opening exposing at least a part of an upper surface of the pad electrode; and a second insulating layer disposed on the thin-film transistor and including a second opening coinciding with the first opening, wherein an opening area of the second opening of the second insulating layer is greater than an opening area of the first opening of the first insulating layer.

13 Claims, 33 Drawing Sheets

(51) Int. Cl.
    *H10K 59/121*         (2023.01)
    *H10K 59/122*         (2023.01)
    *H10K 59/124*         (2023.01)
    *H10K 59/131*         (2023.01)
    *H10K 71/00*          (2023.01)
    *H10K 59/12*          (2023.01)

(52) U.S. Cl.
    CPC ........... *H10K 59/131* (2023.02); *H10K 71/00* (2023.02); *H10K 59/1201* (2023.02)

(56) References Cited

U.S. PATENT DOCUMENTS

| | | |
|---|---|---|
| 9,287,299 B2 | 3/2016 | Kim et al. |
| 2011/0210355 A1* | 9/2011 | Yamazaki ......... H01L 29/78618 438/23 |
| 2013/0316475 A1* | 11/2013 | Yu ......................... H10K 71/00 438/26 |
| 2017/0186831 A1* | 6/2017 | Nam .................... H10K 50/814 |
| 2017/0207416 A1 | 7/2017 | Kim et al. |
| 2020/0227509 A1 | 7/2020 | Yoon et al. |
| 2021/0343811 A1* | 11/2021 | Kim ..................... H10K 59/122 |
| 2022/0139970 A1* | 5/2022 | Kim ....................... H10K 71/00 257/72 |
| 2023/0032902 A1* | 2/2023 | Usui ................... H10K 59/873 |

FOREIGN PATENT DOCUMENTS

| | | |
|---|---|---|
| KR | 10-2017-0078969 | 7/2017 |
| KR | 10-1890215 | 8/2018 |
| KR | 10-2015873 | 10/2019 |
| KR | 10-2020-0088940 | 7/2020 |

\* cited by examiner

DISPLAY APPARATUS AND METHOD OF MANUFACTURING THE SAME

CROSS-REFERENCE TO RELATED APPLICATION(S)

This application claims priority to and benefits of Korean Patent Application No. 10-2020-0169837 under 35 U.S.C. § 119, filed on Dec. 7, 2020, in the Korean Intellectual Property Office, the entire contents of which are incorporated herein by reference.

BACKGROUND

1. Technical Field

One or more embodiments relate to a display apparatus and a method of manufacturing the same.

2. Description of the Related Art

Display apparatuses visually display data. Display apparatuses may be used as displays of small-sized products such as mobile phones or may be used as displays of large-sized products such as televisions.

These display apparatuses include a substrate divided into a display area and a non-display area, and gate lines and data lines may be formed in the display area and insulated from each other. A plurality of pixel regions may be defined in the display area, and pixels respectively arranged in the plurality of pixel regions receive electrical signals from the gate line and the data line intersecting each other and emit light, thereby displaying an image. A thin-film transistor and a pixel electrode electrically connected to the thin-film transistor are provided in each of the pixel regions, and an opposite electrode may be commonly provided over the pixel regions. Various wirings for transmitting an electrical signal to the pixels in the display area, a gate driver, and pads to which a data driver and a controller may be electrically connected may be provided in the non-display area.

Recently, display apparatuses have been used for various purposes. Because display apparatuses have become thinner and lighter, their range of use is expanding. Recently, as the use of display apparatuses has increased, various designs for improving the quality of display apparatuses have been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments provide a display apparatus and a method of manufacturing the same, in which a surface of an insulating layer on which a pixel electrode is disposed is prevented from being damaged and a light-emitting element is prevented from deteriorating due to damage to a thin-film encapsulation layer. However, this is merely an example, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus may include a substrate including a display area and a peripheral area adjacent to the display area; a thin-film transistor disposed in the display area of the substrate and including a semiconductor layer; and a gate electrode which overlaps a channel region of the semiconductor layer; a conductive layer disposed between the substrate and the semiconductor layer and including a first electrode disposed in the display area; and a pad electrode disposed in the peripheral area; a first insulating layer disposed between the conductive layer and the semiconductor layer and including a first opening exposing at least a part of an upper surface of the pad electrode; and a second insulating layer disposed on the thin-film transistor and including a second opening coinciding with the first opening, wherein an opening area of the second opening of the second insulating layer may be greater than an opening area of the first opening of the first insulating layer.

The first insulating layer may include a first sidewall defining the first opening, the second insulating layer may include a second sidewall defining the second opening, and the second sidewall may be disposed outside of the first sidewall.

The display apparatus may further include a third insulating layer disposed on the second insulating layer and exposing at least a part of an upper surface of the second insulating layer in the peripheral area.

The display apparatus may further include a pixel electrode disposed on the third insulating layer and electrically connected to the thin-film transistor; a pixel-defining layer disposed on the third insulating layer and exposing at least a part of the pixel electrode; an intermediate layer disposed on at least the part of the pixel electrode; and an opposite electrode disposed on the intermediate layer.

The pixel-defining layer may at least partially expose an upper surface of the third insulating layer.

At least a part of the opposite electrode may directly contact the upper surface of the third insulating layer at least partially exposed by the pixel-defining layer.

The third insulating layer may include a first portion having a first thickness; and a second portion having a second thickness less than the first thickness of the first portion.

The display apparatus may further include a pixel electrode disposed on the first portion of the third insulating layer and electrically connected to the thin-film transistor; a pixel-defining layer disposed on the third insulating layer and exposing at least a part of the pixel electrode and at least a part of the second portion of the third insulating layer; an intermediate layer disposed on the at least part of the pixel electrode; and an opposite electrode disposed on the intermediate layer.

At least a part of the opposite electrode may directly contact the second portion of the third insulating layer at least partially exposed by the pixel-defining layer.

The second opening of the second insulating layer may define a pad portion including pad electrodes in the peripheral area.

The first opening of the first insulating layer may be provided in plural such that a plurality of first openings expose at least a part of each of the pad electrodes, and the plurality of first openings may overlap the second opening of the second insulating layer.

The pad electrode may include a first layer; and a second layer disposed on the first layer and at least partially exposed by the first opening of the first insulating layer.

The conductive layer may further include a second electrode at least partially overlapping the channel region of the semiconductor layer.

According to one or more embodiments, a method of manufacturing a display apparatus may include preparing a substrate including a display area and a peripheral area adjacent to the display area; forming, on the substrate, a conductive layer including a first electrode in the display area and a pad electrode in the peripheral area; forming a first insulating layer on the conductive layer; forming, on the first insulating layer, a semiconductor layer including a channel region overlapping the first electrode of the conductive layer; forming an electrode layer including a gate electrode overlapping the channel region of the semiconductor layer, forming, on the electrode layer, a pixel electrode electrically connected to the semiconductor layer; forming, on the pixel electrode, an organic material layer exposing at least a part of an upper surface of the pad electrode; and forming, in the first insulating layer, a first opening exposing at least the part of the upper surface of the pad electrode by using the organic material layer as an etching mask.

The forming of the organic material layer may include forming a pixel-defining material layer on the pixel electrode; and forming the organic material layer by patterning the pixel-defining material layer, the organic material layer including a first preliminary pixel-defining layer on the display area, and a second preliminary pixel-defining layer on the display area, surrounding at least a part of the first preliminary pixel-defining layer, and covering an edge of the pixel electrode.

The forming of the organic material layer may further include forming the organic material layer by patterning the pixel-defining material layer, the organic material layer further including a third preliminary pixel-defining layer in the peripheral area, and exposing the at least the part of the upper surface of the pad electrode.

A second thickness of the second preliminary pixel-defining layer may be greater than a first thickness of the first preliminary pixel-defining layer and greater than a third thickness of the third preliminary pixel-defining layer.

The method may further include exposing at least part of the pixel electrode by etching the first preliminary pixel-defining layer; forming an intermediate layer on the at least part of the pixel electrode; and forming an opposite electrode on the intermediate layer.

The forming of the pixel electrode may include forming, on the electrode layer, a pixel electrode layer electrically connected to the semiconductor layer; and forming the pixel electrode by partially etching the pixel electrode layer by using the organic material layer on the pixel electrode layer as an etching mask.

The method may further include thermally treating the organic material layer to cover an edge of the pixel electrode before the forming of the first opening of the first insulating layer.

The method may further include removing the organic material layer.

The method may further include forming a second insulating layer between the electrode layer and the pixel electrode; and forming a third insulating layer between the second insulating layer and the pixel electrode, the third insulating layer exposing the at least part of the upper surface of the pad electrode.

The method may further include forming a second opening in the second insulating layer to expose the at least part of the upper surface of the pad electrode by using the third insulating layer as an etching mask.

Other aspects, features, and advantages other than those described above will become apparent from the following detailed description, claims and drawings for carrying out the embodiments.

These general aspects may be implemented by using a system, a method, a computer program, or any combinations thereof.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
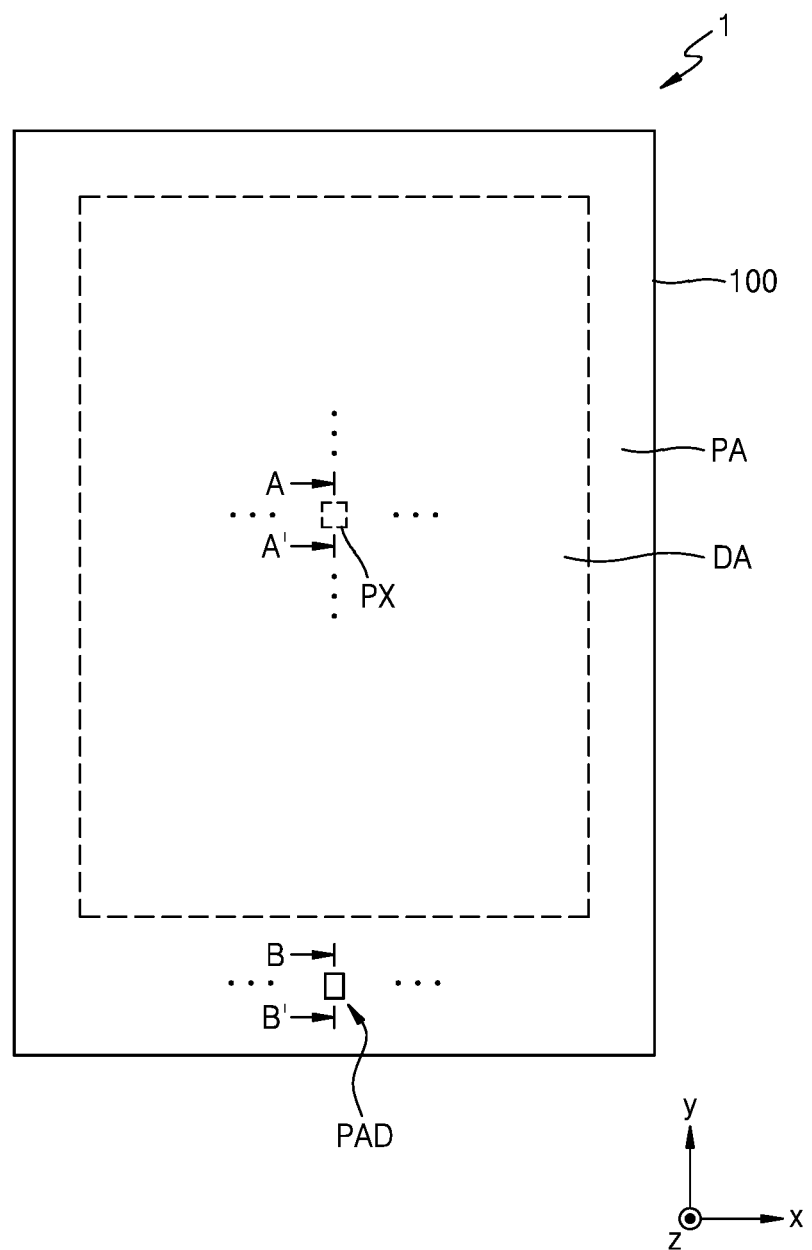
FIG. 1 is a schematic plan view of a display apparatus according to an embodiment.

Reference will now be made in detail to embodiments, examples of which are illustrated in the accompanying drawings, wherein like reference numerals refer to like elements throughout the disclosure. In this regard, embodiments may have different forms and should not be construed as being limited to the descriptions set forth herein. Accordingly, the embodiments are merely described below, by referring to the figures, to explain aspects of the disclosure. As used herein, the term "and/or" includes any and all combinations of one or more of the associated listed items.

Throughout the disclosure, the expression "at least one of a, b, or c" indicates only a, only b, only c, both a and b, both a and c, both b and c, all of a, b, and c, or any variations thereof. The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Since the disclosure may have various modifications and embodiments, embodiments are illustrated in the drawings and will be described in detail in the detailed description. Effects and features of the disclosure, and methods for achieving them will be clarified with reference to embodiments described below in detail with reference to the drawings. However, the disclosure is not limited to the following embodiments and may be embodied in various forms.

The embodiments will now be described more fully with reference to the accompanying drawings. When describing embodiments with reference to the accompanying drawings, the same or corresponding elements are denoted by the same reference numerals and a redundant description thereof will be omitted.

It will be understood that although the terms "first", "second", etc. may be used herein to describe various elements, these elements should not be limited by these terms. These elements are only used to distinguish one element from another. For example, a first element may be referred to as a second element, and similarly, a second element may be referred to as a first element without departing from the scope of the disclosure.

The singular forms "a," "an," and "the" as used herein are intended to include the plural forms as well unless the context clearly indicates otherwise.

It will be understood that the terms "including," "having," and "comprising" and their variations are intended to indicate the existence of the features or elements described in the specification, and are not intended to preclude the possibility that one or more other features or elements may exist or may be added.

It will be understood that when a layer, an area, or an element is referred to as being "on," another layer, area, or element, it may be directly on the other layer, area, or element, or intervening layers, areas, or elements may be present therebetween.

Sizes of elements in the drawings may be exaggerated for convenience of explanation. For example, because sizes and thicknesses of elements in the drawings are arbitrarily illustrated for convenience of explanation, the disclosure is not limited thereto.

When an embodiment may be implemented differently, a specific process order may be performed differently from the described order. For example, two consecutively described processes may be performed substantially at the same time or may be performed in an order opposite to the described order.

Throughout the disclosure, the expression "at least one of A and/or B" indicates only A, only B, or both A and B. In addition, the expression "at least one of A and B" indicates only A, only B, or both A and B.

It will be understood that when a layer, region, or element is referred to as being "connected to" another layer, region, or element, it can be directly connected to the other layer, region, or element, and/or indirectly connected thereto with intervening layers, regions, or elements therebetween. For example, it will be understood that when a layer, region, or element is referred to as being "electrically connected to" another layer, region, or element, it can be directly electrically connected to the other layer, region, or element, and/or indirectly electrically connected thereto with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

FIG. 1 is a schematic plan view of a display apparatus 1 according to an embodiment.

Referring to FIG. 1, the display apparatus 1 may include a display area DA where an image is displayed and a peripheral area PA disposed around the display area DA. The display apparatus 1 may provide an image to the outside by using light emitted from the display area DA. Because the display apparatus 1 may include a substrate 100, the substrate 100 may include portions corresponding to the display area DA and the peripheral area PA.

The substrate 100 may include any of various materials, for example, glass, metal, or plastic. According to an embodiment, the substrate 100 may include a flexible material. The flexible material refers to a substrate that is well bendable, foldable, or rollable. The substrate 100 including the flexible material may include ultra-thin glass, metal, or plastic.

Pixels PX including various display elements such as an organic light-emitting diode (OLED) may be disposed in the display area DA of the substrate 100. The pixels PX may include a plurality of pixels, and the plurality of pixels PX may be arranged or disposed in any of various patterns such as a stripe pattern, a PenTile® pattern, or a mosaic pattern to form an image.

In case that the display area DA is viewed in a plan view, the display area DA may have a substantially rectangular shape as shown in FIG. 1. In an embodiment, the display area DA may have a substantially polygonal shape (for example, a substantially triangular shape, a substantially pentagonal shape, or a substantially hexagonal shape), a substantially circular shape, a substantially elliptical shape, or an irregular shape.

The peripheral area PA of the substrate 100 disposed around or adjacent to the display area DA may be an area where an image is not displayed. The peripheral area PA may entirely or partially surround the display area DA. Various wirings for transmitting electric signals to be applied to the display area DA, and a pad portion PAD to which a printed circuit board (PCB) or a driver integrated circuit (IC) chip is attached may be located or disposed in the peripheral area PA.

Figure 2:
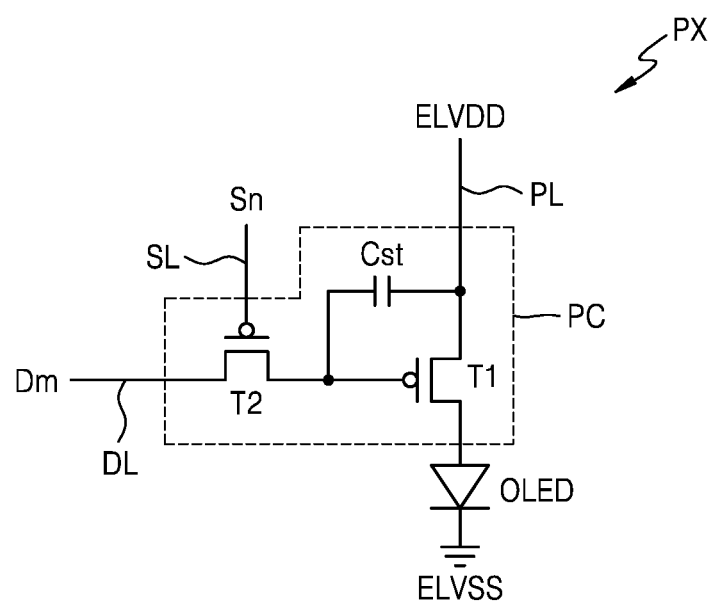
FIG. 2 is a schematic equivalent circuit diagram of a pixel of a display apparatus, according to an embodiment.

FIG. 2 is a schematic equivalent circuit diagram of a pixel PX of a display apparatus, according to an embodiment.

Referring to FIG. 2, each pixel PX may include a pixel circuit PC electrically connected to a scan line SL and a data line DL, and an organic light-emitting diode OLED electrically connected to the pixel circuit PC. The cathode of the organic light-emitting diode OLED may be a common electrode to which a common voltage ELVSS is applied.

The pixel circuit PC may include a driving thin-film transistor (TFT) T1, a switching TFT T2, and a storage capacitor Cst. The switching TFT T2 may be electrically connected to the scan line SL and the data line DL, and transmit a data signal Dm input through the data line DL to the driving TFT T1 according to a scan signal Sn input through the scan line SL.

The storage capacitor Cst may be electrically connected to the switching TFT T2 and a driving voltage line PL and stores a voltage corresponding to a difference between a voltage received from the switching TFT T2 and a driving voltage ELVDD supplied to the driving voltage line PL.

The driving TFT T1 may be electrically connected to the driving voltage line PL and the storage capacitor Cst and may control driving current flowing from the driving voltage line PL to the organic light-emitting diode OLED according to a value of the voltage stored in the storage capacitor Cst. The organic light-emitting diode OLED may emit light having a certain or given brightness due to the driving current.

Although the pixel circuit PC may include two TFTs and one storage capacitor in FIG. 2, embodiments are not limited thereto. For example, the pixel circuit PC may include three or more TFTs and/or two or more storage capacitors. In an embodiment, the pixel circuit PC may include seven TFTs and one storage capacitor.

Figure 3:
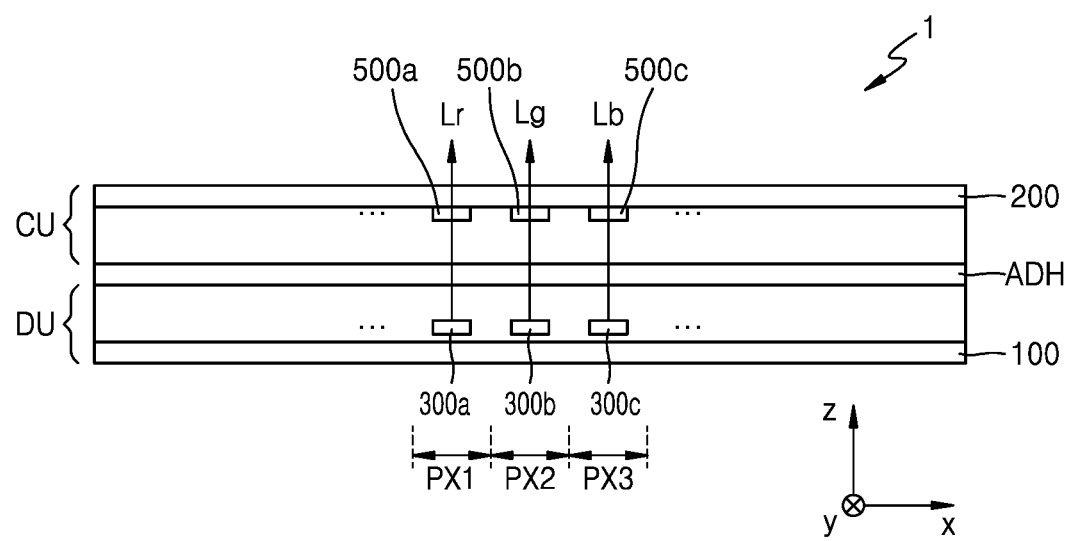
FIG. 3 is a schematic cross-sectional view of a display apparatus according to an embodiment.

FIG. 3 is a schematic cross-sectional view of a display apparatus 1 according to an embodiment.

Referring to FIG. 3, the display apparatus 1 may include a display or a display unit DU, and a color filter or a color filter unit CU disposed to face the display or display unit DU. The display or display unit DU may include a first pixel PX1, a second pixel PX2, and a third pixel PX3 disposed on the substrate 100 (hereinafter, referred to as the lower substrate). The first pixel PX1, the second pixel PX2, and the third pixel PX3 may be pixels that emit light of different colors on the lower substrate 100. For example, the first pixel PX1 may emit red light Lr, the second pixel PX2 may emit green light Lg, and the third pixel PX3 may emit blue light Lb.

The first pixel PX1, the second pixel PX2, and the third pixel PX3 may respectively include a first light-emitting element 300a, a second light-emitting element 300b, and a third light-emitting element 300c each including an organic light-emitting diode OLED. In an embodiment, the first light-emitting element 300a, the second light-emitting element 300b, and the third light-emitting element 300c may emit blue light. In an embodiment, the first light-emitting element 300a, the second light-emitting element 300b, and the third light-emitting element 300c may respectively emit the red light Lr, the green light Lg, and the blue light Lb.

The color filter or color filter unit CU may include filter portions 500a, 500b, and 500c. Light emitted from the first light-emitting element 300a, the second light-emitting element 300b, and the third light-emitting element 300c may pass through the filter portions 500a, 500b, and 500c and then may be emitted as the red light Lr, the green light Lg, and the blue light Lb.

The filter portions 500a, 500b, and 500c may be located or disposed on or directly located or disposed on an upper substrate 200. The filter portions 500a, 500b, and 500c may respectively include a first quantum dot layer 220a and a first filter layer 210a, a second quantum dot layer 220b and a second filter layer 210b, and a transmissive layer 220c and a third filter layer 210c of FIG. 12 which will be described below.

In case that the filter portions 500a, 500b, and 500c are "directly located on the upper substrate 200," it may mean that the first to third filter layers 210a, 210b, and 210c are formed or disposed on or directly formed or disposed on the upper substrate 200 to manufacture the color filter or color filter unit CU. Thereafter, the display or display unit DU and the color filter or color filter unit CU may be bonded to each other, so that the first to third filter layers 210a, 210b, and 210c respectively face the first pixel PX1, the second pixel PX2, and the third pixel PX3.

FIG. 3 illustrates that the display or display unit DU and the color filter or color filter unit CU are bonded to each other through an adhesive layer ADH. The adhesive layer ADH may include, for example, but not limited to, an optical clear adhesive (OCA). In an embodiment, the adhesive layer ADH may be omitted.

Although FIG. 3 illustrates that the filter portions 500a, 500b, and 500c are arranged or disposed on the upper substrate 200, the filter portions 500a, 500b, and 500c may be arranged or disposed on the display or display unit DU.

For example, the filter portions 500a, 500b, and 500c may be disposed on a thin-film encapsulation layer 400 of FIG. 12 which will be described below. The first quantum dot layer 220a, the second quantum dot layer 220b, the transmissive layer 220c, the first filter layer 210a, the second filter layer 210b, and the third filter layer 210c may be disposed on the thin-film encapsulation layer 400. First, the first quantum dot layer 220a, the second quantum dot layer 220b, and the transmissive layer 220c may be disposed on the thin-film encapsulation layer 400, and then the first filter layer 210a, the second filter layer 210b, and the third filter layer 210c may be respectively disposed on the first quantum dot layer 220a, the second quantum dot layer 220b, and the transmissive layer 220c.

The display apparatus 1 may include the lower substrate 100 and the upper substrate 200 as shown in FIG. 3. The number of substrates included in the display apparatus 1 may be 2. As another example, the display apparatus 1 may not include the upper substrate 200 and may include only the lower substrate 100. The filter portions 500a, 500b, and 500c may be disposed on the lower substrate 100. The number of substrates included in the display apparatus 1 may be 1.

Figure 4:
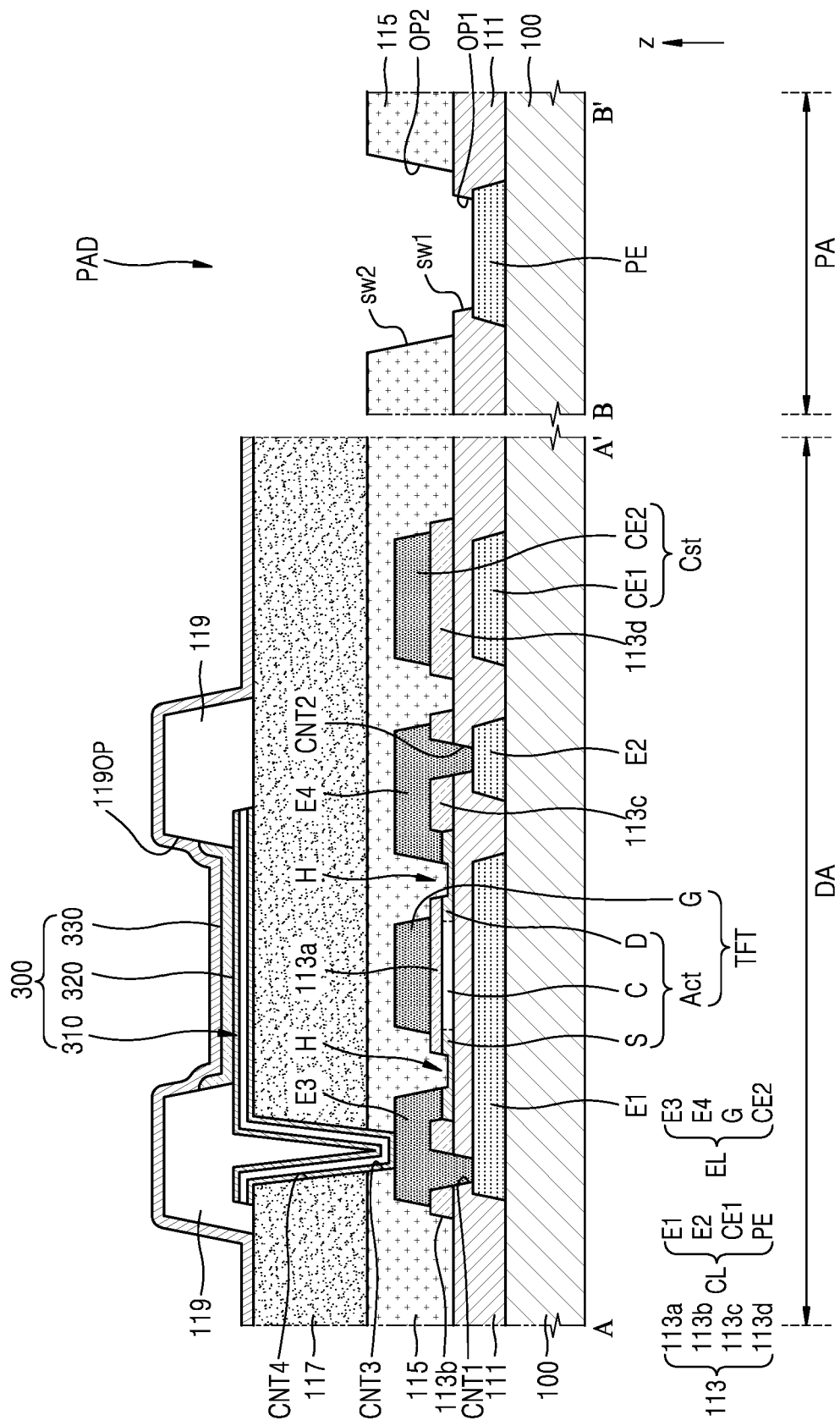
FIG. 4 is a schematic cross-sectional view of a display area and a pad portion of FIG. 1 taken along line A-A' and line B-B', respectively.

FIG. 4 is a schematic cross-sectional view of a display area DA and a pad portion PAD of FIG. 1 taken along line A-A' and line B-B', respectively.

Referring to FIG. 4, the display apparatus 1 (see FIG. 1) may include a thin-film transistor TFT disposed on the substrate 100 corresponding to the display area DA and the pad portion PAD disposed on the substrate 100 corresponding to the peripheral area PA.

The thin-film transistor TFT may include a semiconductor layer Act, and a gate electrode G at least partially overlapping the semiconductor layer Act. The pad portion PAD may include a pad electrode PE.

A first electrode E1 may be disposed under or below the semiconductor layer Act. The first electrode E1 and the pad electrode PE may be disposed on the same layer or on a same layer. For example, the first electrode E1 and the pad electrode PE may be disposed on the substrate 100. The first electrode E1 and the pad electrode PE may be in contact with or direct contact with the substrate 100.

A first insulating layer 111 may be disposed under or below the semiconductor layer Act. The first insulating layer 111 may be disposed between the first electrode E1 and the semiconductor layer Act. The first insulating layer 111 may include a first opening OP1 exposing at least a portion of or a part of an upper surface of the pad electrode PE.

A second insulating layer 115 may be disposed on the thin-film transistor TFT. The second insulating layer 115 may include a second opening OP2 corresponding to or coinciding with the first opening OP1.

In an embodiment, on a plane, an opening area of the second opening OP2 formed in the second insulating layer 115 may be greater than an opening area of the first opening OP1 formed in the first insulating layer 111.

In an embodiment, a second sidewall sw2 of the second insulating layer 115 defining the second opening OP2 may be arranged or disposed outside of a first sidewall sw1 of the first insulating layer 111 defining the first opening OP1. The first sidewall sw1 of the first insulating layer 111 and the second sidewall sw2 of the second insulating layer 115 may be disposed to be misaligned from each other.

Hereinafter, elements included in the display apparatus 1 will be described in detail according to a stacked structure with reference to FIG. 4.

The substrate 100 may include a glass material, a ceramic material, a metal material, or a flexible or bendable material. In case that the substrate 100 is flexible or bendable, the substrate 100 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layer or multilayer structure of the material described above, and in case that the substrate 100 has a multilayer structure, the substrate 100 may further include an inorganic layer. In an embodiment, the substrate 100 may have a structure including an organic material, an inorganic material, and an organic material.

The first insulating layer 111 may reduce or block penetration of a foreign material, moisture, or external air from the bottom of the substrate 100 and may planarize the substrate 100. The first insulating layer 111 may include an inorganic material such as an oxide or a nitride, an organic material, or an organic-inorganic composite, and may have a single-layer or multilayer structure including an inorganic material and an organic material.

A buffer layer and/or a barrier layer may be further included between the substrate 100 and the first insulating layer 111. The buffer layer and/or the barrier layer may prevent or minimize impurities from the substrate 100, for example, from penetrating into the semiconductor layer Act. The buffer layer and/or the barrier layer may include an inorganic material such as oxide or nitride, an organic material, or an organic-inorganic composite, and may have a single-layer or multilayer structure including an inorganic material and an organic material.

The semiconductor layer Act may be disposed on the first insulating layer 111.

In an embodiment, the semiconductor layer Act may include an oxide semiconductor material. The semiconductor layer Act may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the semiconductor layer Act may be an InSnZnO (ITZO) semiconductor layer, an InGaZnO (IGZO) semiconductor layer, an InSnGaO (ITGO) semiconductor layer, or the like within the spirit and the scope of the disclosure. Because an oxide semiconductor has a wide band gap (of about 3.1 eV), high carrier mobility, and low leakage current, a voltage drop is not large even in case that a driving time is long. Accordingly, a luminance change due to a voltage drop is not large even during low-frequency operation.

In an embodiment, the semiconductor layer Act may include amorphous silicon or polysilicon.

The semiconductor layer Act may include a channel region C, and a source region S and a drain region D respectively arranged or disposed on both sides of the channel region C. The semiconductor layer Act may have a single-layer structure.

In an embodiment, the semiconductor layer Act may include a plurality of holes H. For example, as shown in FIG. 4, holes H may be respectively formed in the source region S and the drain region D of the semiconductor layer Act. The holes H may be formed by etching portions of the semiconductor layer Act together in case that the gate electrode G, a third electrode E3, and a fourth electrode E4 are formed. In case that an etchant having a high selectivity is used, the first insulating layer 111 may not be exposed even in case that the semiconductor layer Act is partially etched. As another example, in case that an etchant having a low selectivity is used, the first insulating layer 111 may be exposed by partially etching the semiconductor layer Act.

Even though the first insulating layer 111 is exposed by partially etching the semiconductor layer Act, an area where the first insulating layer 111 is exposed is surrounded by a semiconductor layer Act, which is not shown, in a plan view. Thus, there is no obstacle to the movement of electrons or holes in the semiconductor layer Act. Because the holes H are surrounded by the semiconductor layer Act on a plane, even though the first insulating layer 111 is exposed by the holes H, there is no obstacle to the movement of electrons or holes in the semiconductor layer Act.

A conductive layer CL may be between the substrate 100 and the first insulating layer 111. The conductive layer CL may include a single layer or multiple layers of one or more metals selected from the group consisting of Al, platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), Ti, tungsten (W), and copper (Cu).

The conductive layer CL may include the first electrode E1, a second electrode E2, a lower electrode CE1 of the storage capacitor Cst, and the pad electrode PE. The first electrode E1, the second electrode E2, and the lower electrode CE1 of the storage capacitor Cst may be simultaneously formed by patterning a preliminary conductive layer. The first electrode E1, the second electrode E2, and the lower electrode CE1 of the storage capacitor Cst may be disposed on the display area DA of the substrate 100, and the pad electrode PE may be disposed on the peripheral area PA of the substrate 100.

In an embodiment, as shown in FIG. 4, the first insulating layer 111 arranged or disposed on the pad electrode PE may include the first opening OP1. The upper surface of the pad electrode PE may be at least partially exposed by the first opening OP1.

In an embodiment, the first electrode E1 and the second electrode E2 may each be a source electrode, a drain electrode, a data line, etc. within the spirit and the scope of the disclosure.

In an embodiment, the first electrode E1 may be arranged or disposed to overlap the semiconductor layer Act including an oxide semiconductor material. The first electrode E1 may be arranged or disposed to overlap the channel region C of the semiconductor layer Act. In case that the semiconductor layer Act may include an oxide semiconductor material, the semiconductor layer Act is vulnerable to light, and thus a photocurrent is induced in the semiconductor layer Act by external light incident from the substrate 100 through the first electrode E1, thereby preventing changes in element characteristics of the thin-film transistor TFT including an oxide semiconductor material.

The first electrode E1 may be electrically connected to the semiconductor layer Act. As shown in FIG. 4, the first electrode E1 may be electrically connected to the source region S of the semiconductor layer Act. As another example, the first electrode E1 may be electrically connected to the drain region D of the semiconductor layer Act. The first electrode E1 may be electrically connected to the semiconductor layer Act so that voltage of the first electrode E1 may be kept constant without floating. Therefore, an unexpected result value may be prevented from being derived from a fluid state of the voltage of the first electrode E1 in case that a pixel circuit is driven.

In an embodiment, the pad electrode PE may extend toward the display area DA and may be electrically connected to any one of a voltage supply wiring, a data supply wiring, a data line, and a scan line. Various voltages, data signals, scan signals, for example, transmitted from a printed circuit board or a driver IC chip through the pad electrode PE may be transmitted to the pixel circuit PC (see FIG. 2). For example, the pad electrode PE may serve as a bridge that electrically connects the printed circuit board or the driver IC chip to a display panel.

In an embodiment, the pad electrode PE may be electrically connected to a connection electrode that may be arranged or disposed on the same layer or on a same layer as or a different layer from the pad electrode PE. The pad electrode PE may be exposed to be in electrical contact with the printed circuit board or the driver IC chip, and the connection electrode may extend toward the display area DA to be electrically connected to one of the voltage supply wiring, the data supply wiring, the data line, and the scan line. For example, the pad portion PAD may include a separate connection electrode separated from the pad electrode PE in electrical contact with the printed circuit board or the driver IC chip. The pad electrode PE and the connection electrode may serve as a bridge that electrically connects the printed circuit board or the driver IC chip to the display panel.

A gate insulating layer 113 may be disposed on the semiconductor layer Act as an insulating layer. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like within the spirit and the scope of the disclosure.

As shown in FIG. 4, the gate insulating layer 113 may be patterned to overlap a portion of the semiconductor layer Act. The gate insulating layer 113 may be patterned to at least partially expose the source region S and the drain region D.

The gate insulating layer 113 may include a first portion 113a, a second portion 113b, a third portion 113c, and a fourth portion 113d. The first portion 113a of the gate insulating layer 113 may overlap the channel region C, the second portion 113b of the gate insulating layer 113 may overlap a portion of the source region S, the third portion 113c of the gate insulating layer 113 may overlap a portion of the drain region D, and the fourth portion 113d of the gate insulating layer 113 may overlap an upper electrode CE2 of the storage capacitor Cst to be described below. The first portion 113a of the gate insulating layer 113 may overlap the gate electrode G to be described below. The second portion 113b and the third portion 113c of the gate insulating layer 113 may respectively cover or overlap ends of the semiconductor layer Act.

The source region S and the drain region D may undergo a conductorization process by plasma treatment or the like within the spirit and the scope of the disclosure. A portion of the semiconductor layer Act that overlaps the gate insulating layer 113 is not exposed to plasma treatment and thus may have properties different from those of regions exposed to plasma treatment. By using the gate insulating layer 113 as a self-align mask during plasma treatment on the semiconductor layer Act, a plurality of regions having different properties may be formed or disposed in the semiconductor layer Act. The regions may be divided according to the presence of exposure during plasma treatment.

For example, as shown in FIG. 4, the channel region C which is not plasma-treated is formed or disposed on the semiconductor layer Act at a location overlapping the first portion 113a of the gate insulating layer 113, and the source region S and the drain region D which are plasma-treated may be respectively formed or disposed on both sides of the channel region C.

Because the source region S may partially overlap the second portion 113b of the gate insulating layer 113, a portion of the source region S may not be plasma-treated due to the partial overlap by the second portion 113b of the gate insulating layer 113. As an example, as shown in FIG. 4, even though a portion of the source region S overlaps the second portion 113b of the gate insulating layer 113, a region which is not plasma-treated may not exist. This is because a plasma-treated region may be formed wider than the overlapping region. Although the embodiment has been described based on the source region S, the same applies to the drain region D.

At least a portion of the source region S which is plasma-treated and at least a portion of the drain region D which is plasma-treated may each be conductorized. For example, in case that the semiconductor layer Act is an n-type semiconductor, at least the portion of the source region S and at least the portion of the drain region D that undergoes plasma treatment may become of an n+ type.

Although FIG. 4 illustrates that the gate insulating layer 113 is patterned, as another example, the gate insulating layer 113 may be disposed on the entire surface of the substrate 100 to cover or overlap upper and side surfaces of the semiconductor layer Act.

An electrode layer EL may be disposed on the gate insulating layer 113. The electrode layer EL may include a single layer or multiple layers of one or more metals selected from the group consisting of Al, Pt, Pd, Ag, Mg, Au, Ni, Nd, Ir, Cr, Li, Ca, Mo, Ti, W, and Cu.

The electrode layer EL may include the gate electrode G, the third electrode E3, the fourth electrode E4, and the upper electrode CE2 of the storage capacitor Cst. The gate electrode G, the third electrode E3, the fourth electrode E4, and the upper electrode CE2 of the storage capacitor Cst may be simultaneously formed by patterning a preliminary electrode layer. The gate electrode G, the third electrode E3, the fourth electrode E4, and the upper electrode CE2 of the storage capacitor Cst may be arranged or disposed on the display area DA of the substrate 100.

The gate electrode G may at least partially overlap the semiconductor layer Act. The gate electrode G may overlap the channel region C of the semiconductor layer Act. The gate electrode G may overlap the first portion 113a of the gate insulating layer 113.

The third electrode E3 may be electrically connected to the source region S, and the fourth electrode E4 may be electrically connected to the drain region D. The third electrode E3 may at least partially overlap the second portion 113b of the gate insulating layer 113, and the fourth electrode E4 may at least partially overlap the third portion 113c of the gate insulating layer 113. The third electrode E3 may surround one side or a side of the second portion 113b of the gate insulating layer 113, and the fourth electrode E4 may surround one side or a side of the third portion 113c of the gate insulating layer 113.

The third electrode E3 may be electrically connected to the first electrode E1 through a first contact hole CNT1 formed in the first insulating layer 111 and the second portion 113b of the gate insulating layer 113. Because the third electrode E3 may be electrically connected to the semiconductor layer Act, the semiconductor layer Act and the first electrode E1 may be electrically connected to each other through the third electrode E3. The third electrode E3 may serve as a bridge that electrically connects the semiconductor layer Act to the first electrode E1.

The fourth electrode E4 may be electrically connected to the second electrode E2 through a second contact hole CNT2 defined in the first insulating layer 111 and the third portion 113c of the gate insulating layer 113. Because the fourth electrode E4 may be electrically connected to the semiconductor layer Act, the semiconductor layer Act and the second electrode E2 may be electrically connected to each other through the fourth electrode E4. The fourth electrode E4 may serve as a bridge that electrically connects the semiconductor layer Act to the second electrode E2.

The upper electrode CE2 of the storage capacitor Cst may overlap the lower electrode CE1 with the first insulating layer 111 and the gate insulating layer 113 therebetween and may form a capacitance. The first insulating layer 111 and the gate insulating layer 113 may function as a dielectric layer of the storage capacitor Cst.

In an embodiment, the storage capacitor Cst may include the lower electrode CE1 and the upper electrode CE2, and may not overlap the thin-film transistor TFT and may separately exist as shown in FIG. 4. As an example, the storage capacitor Cst may overlap the thin-film transistor TFT. For example, the gate electrode G of the thin-film transistor TFT may function as the lower electrode CE1 of the storage capacitor Cst.

The second insulating layer 115 may be disposed on the electrode layer EL. The second insulating layer 115 may be disposed to cover or overlap the gate electrode G, the third electrode E3, the fourth electrode E4, and the upper electrode CE2 of the storage capacitor Cst. The gate electrode G, the third electrode E3, the fourth electrode E4, and the upper electrode CE2 of the storage capacitor Cst may be covered with or overlapped by the second insulating layer 115. The second insulating layer 115 may be an inorganic insulating layer made of an inorganic material. Polysiloxane, silicon nitride, silicon oxide, or silicon oxynitride may be used as the inorganic material. Also, the second insulating layer 115 may have a single-layer or multilayer structure including silicon nitride ($SiN_x$) and silicon oxide ($SiO_x$). The second insulating layer 115 may be employed to cover or overlap and protect some or a number of wirings arranged or disposed on the first insulating layer 111.

In an embodiment, the second insulating layer 115 may include the second opening OP2 corresponding to or coinciding with the first opening OP1 of the first insulating layer 111. The second opening OP2 may expose at least a portion of or a part of the upper surface of the pad electrode PE. The pad electrode PE may be electrically connected to a printed circuit board or a driver IC chip through the first opening OP1 and the second opening OP2.

In an embodiment, as shown in FIG. 4, an opening area of the second opening OP2 formed in the second insulating layer 115 may be greater than an opening area of the first opening OP1 formed in the first insulating layer 111. On a plane, an opening area of the second opening OP2 formed in the second insulating layer 115 may be greater than an opening area of the first opening OP1 formed in the first insulating layer 111.

In an embodiment, the second sidewall sw2 of the second insulating layer 115 defining the second opening OP2 may be disposed outside the first sidewall sw1 of the first insulating layer 111 defining the first opening OP1. The first sidewall sw1 of the first insulating layer 111 and the second sidewall sw2 of the second insulating layer 115 may be disposed to be misaligned from each other.

Figure 7A:
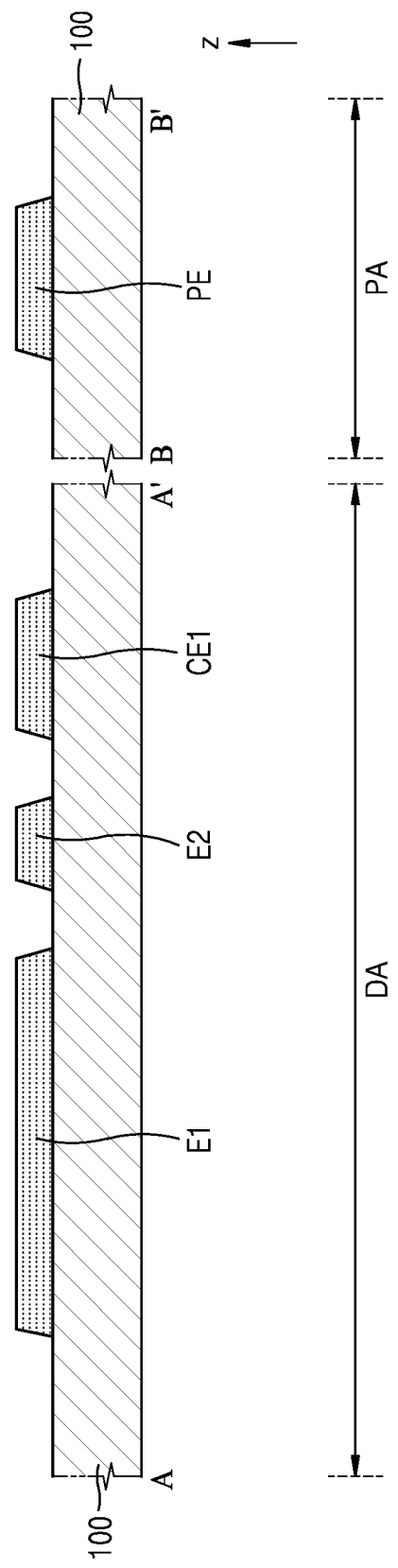
FIGS. 7A to 7K are schematic cross-sectional views sequentially illustrating a method of manufacturing a display apparatus, according to an embodiment, based on FIG. 4.
Figure 7B:
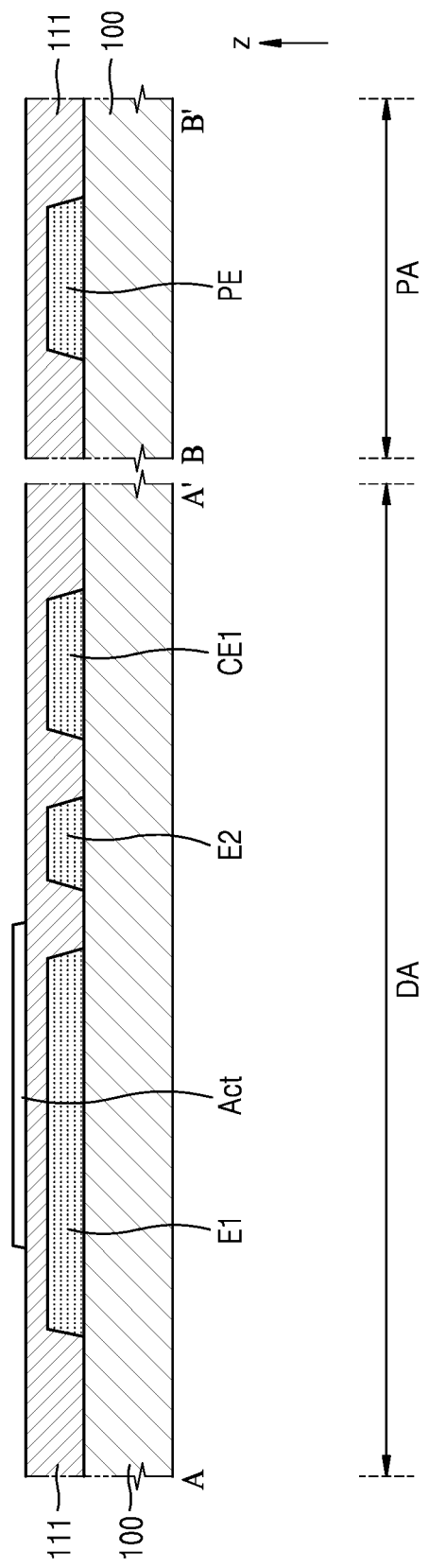
Figure 7C:
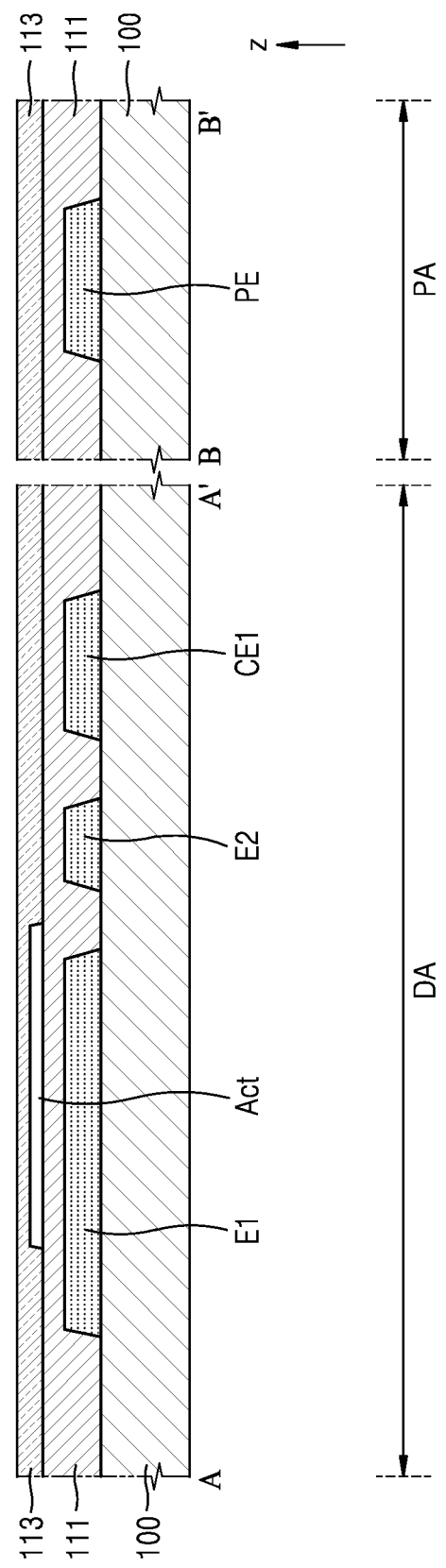
Figure 7D:
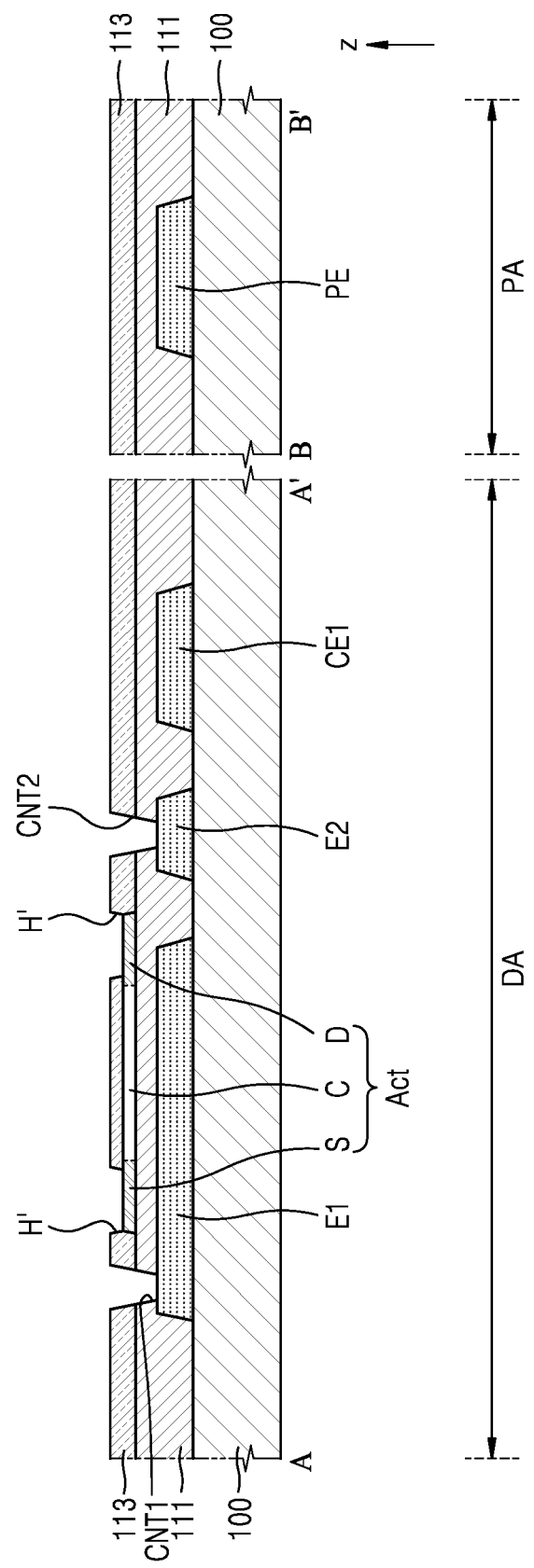
Figure 7E:
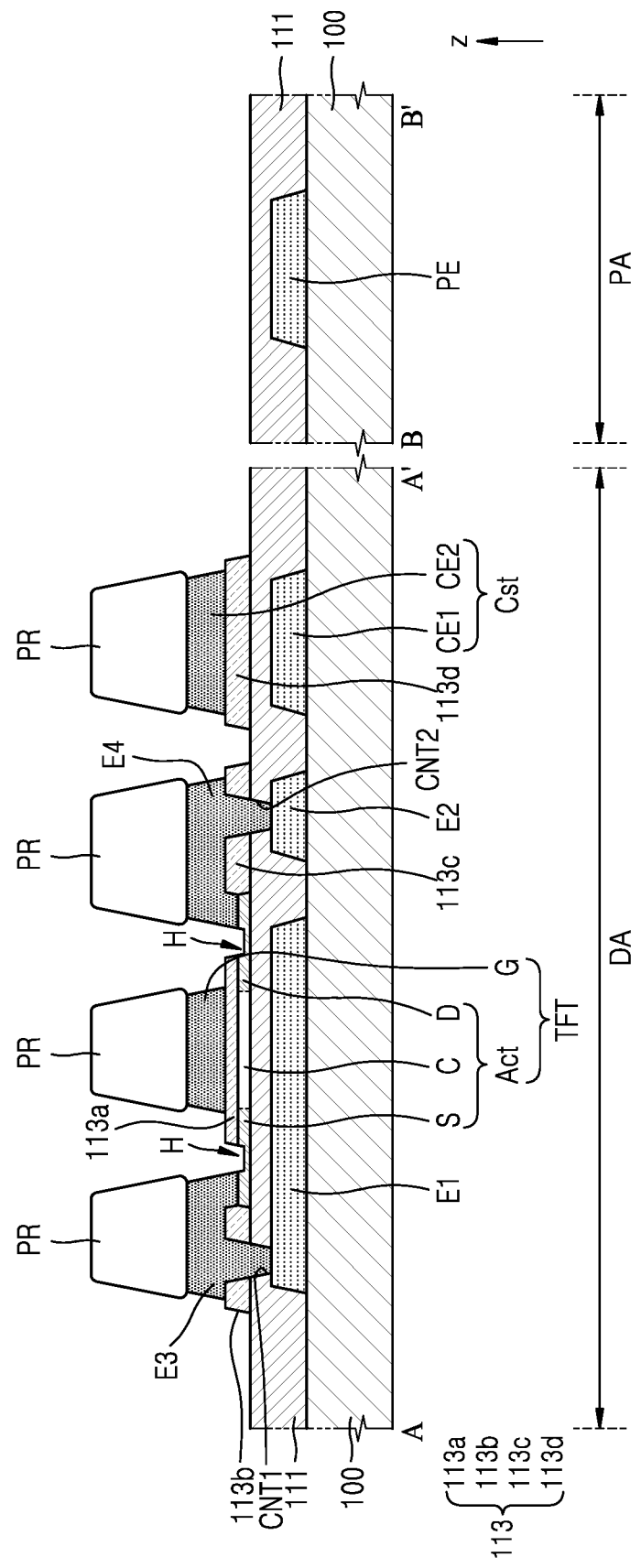
Figure 7F:
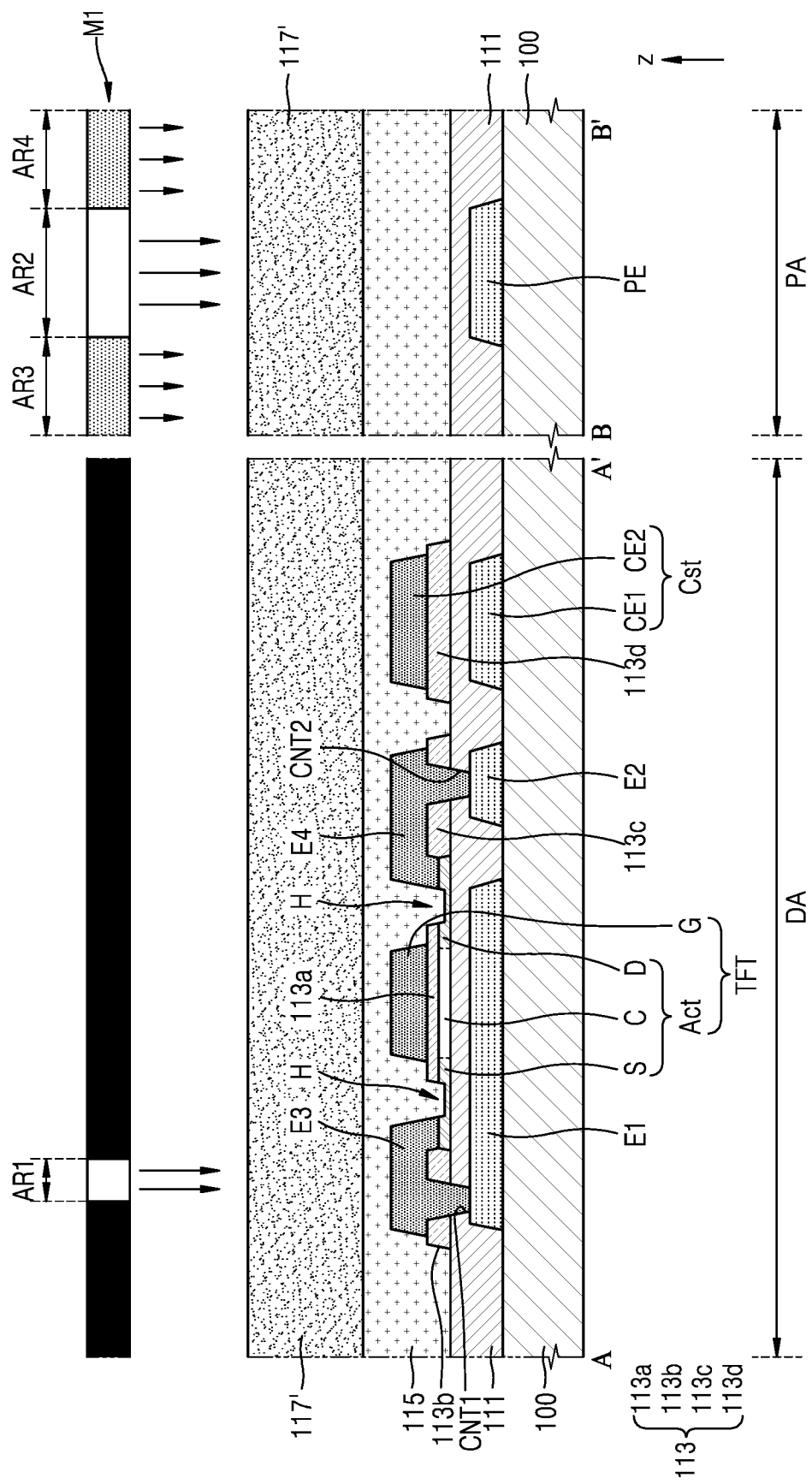
Figure 7G:
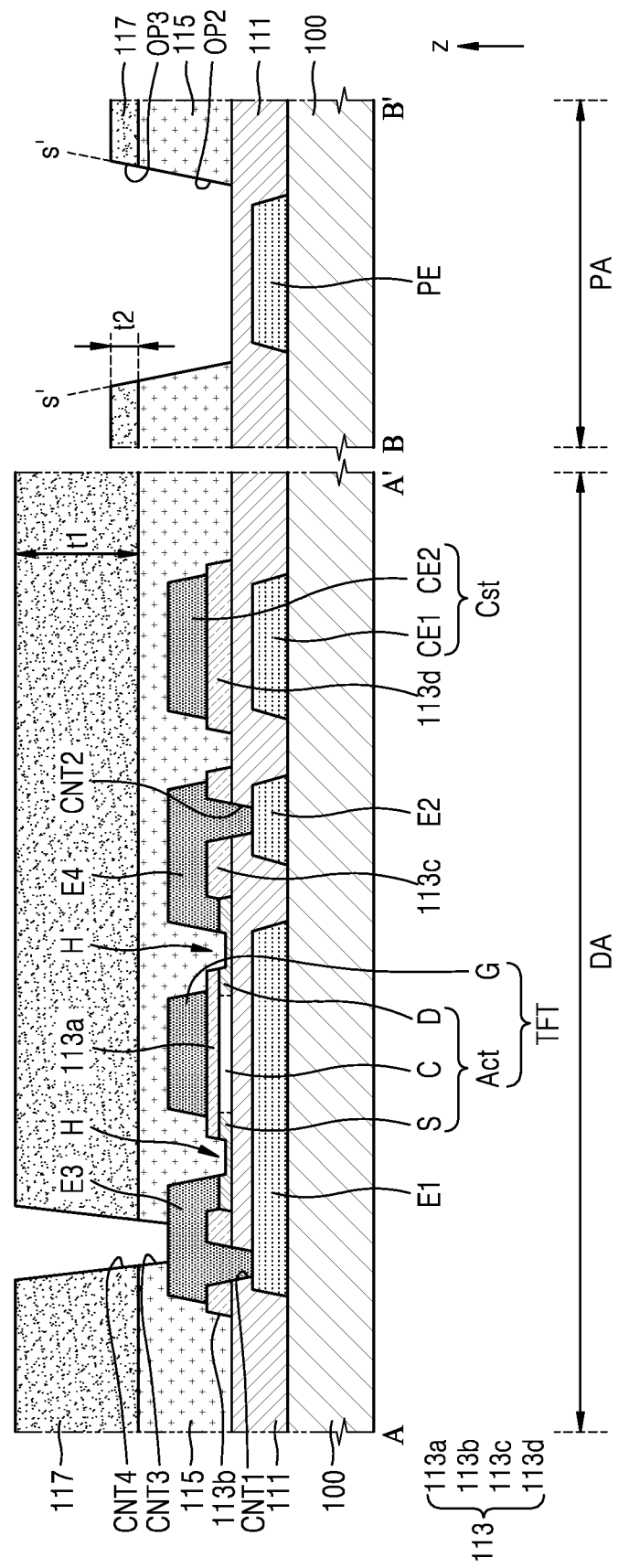
Figure 7H:
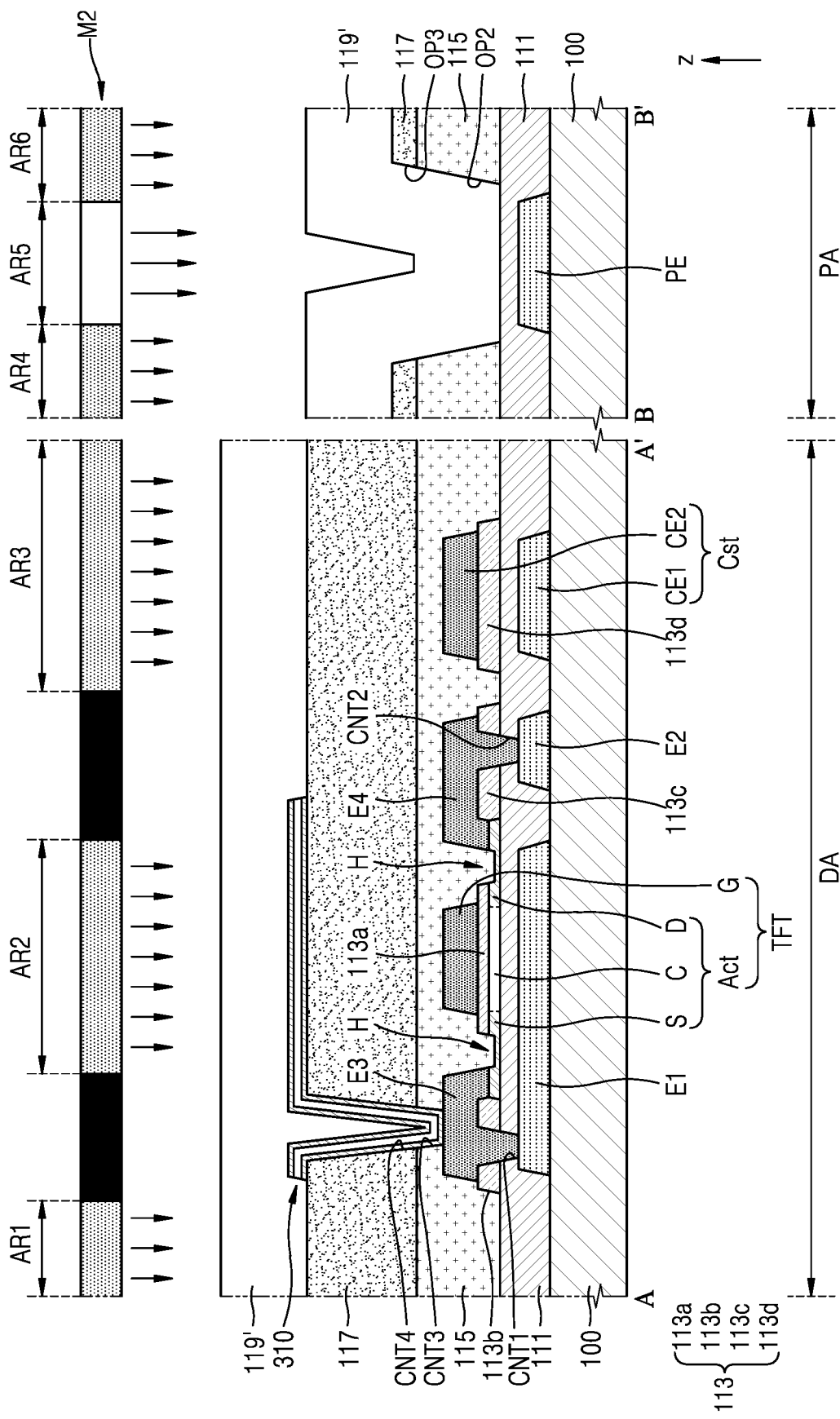
Figure 7I:
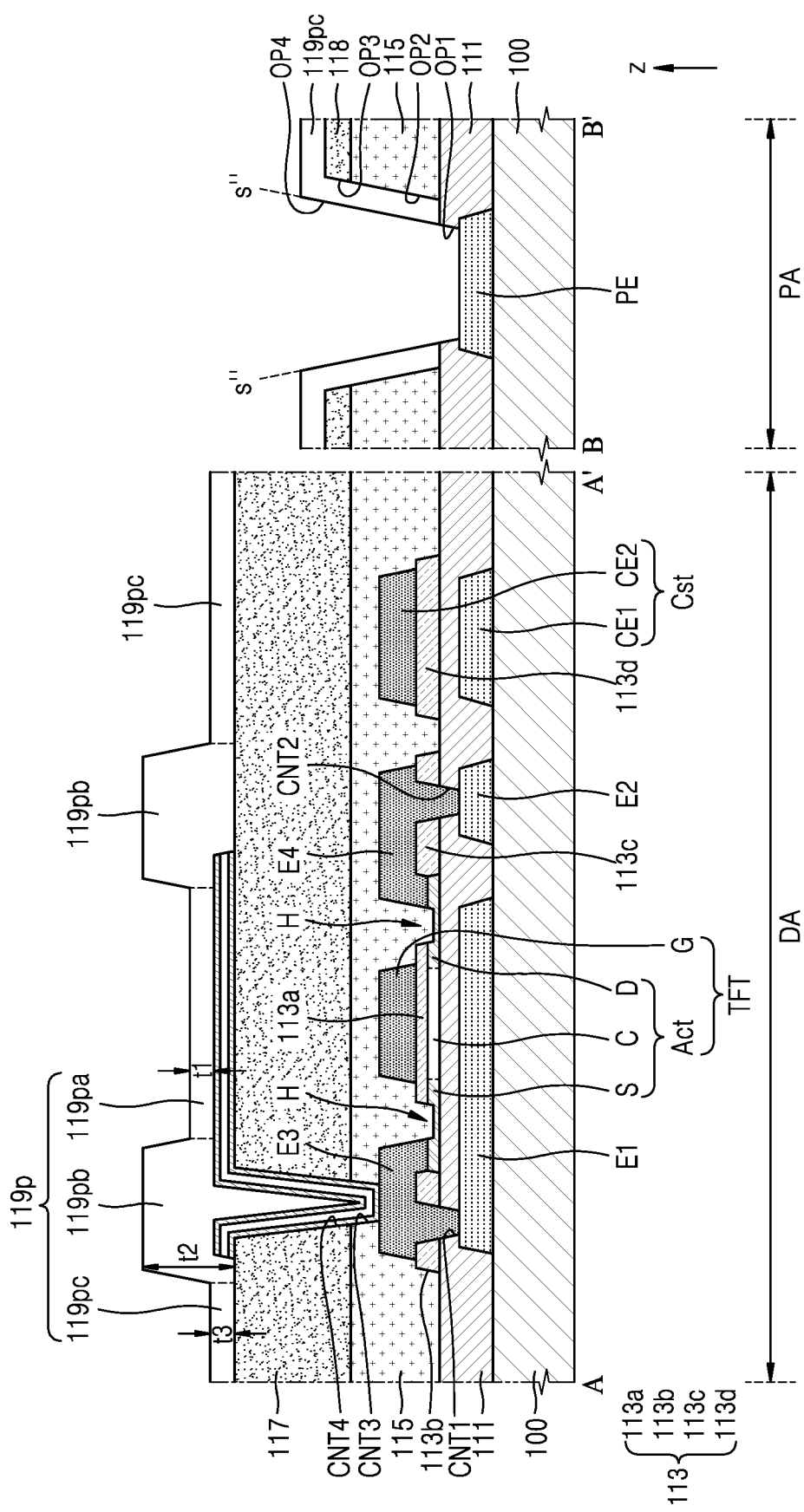

As shown in FIGS. 7G and 7I to be described below, the second opening OP2 of the second insulating layer 115 may be formed by using a third insulating layer 117 as an etching mask, and the first opening OP1 of the first insulating layer 111 may be formed by using a preliminary pixel-defining layer 119p as an etching mask. For example, the first opening OP1 of the first insulating layer 111 and the second opening OP2 of the second insulating layer 115 may be formed by using different etching masks. Therefore, the first sidewall sw1 of the first insulating layer 111 defining the first opening OP1 and the second sidewall sw2 of the second insulating layer 115 defining the second opening OP2 may be misaligned from each other. Steps may be formed at a boundary between the first insulating layer 111 and the second insulating layer 115.

The third insulating layer 117 may be disposed on the second insulating layer 115. The third insulating layer 117 may include a single layer or multiple layers including an organic material and may provide a flat upper surface. The third insulating layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof.

The third insulating layer 117 may be disposed to expose at least a portion of an upper surface of the second insulating layer 115 on the peripheral area PA. For example, the third insulating layer 117 may not be disposed in the peripheral area PA and may not overlap the pad portion PAD.

As a comparative example, a planarization layer may remain on an outer portion of a display panel. The planarization layer remaining on the outer portion of the display panel may act as an external moisture penetration path, thereby causing a reliability problem such as deterioration of a light-emitting element.

A light-emitting element 300 may be disposed on the third insulating layer 117. The light-emitting element 300 may include a pixel electrode 310, an intermediate layer 320 including an organic emission layer, and an opposite electrode 330. The light-emitting element 300 may be electrically connected to the thin-film transistor TFT through a third contact hole CNT3 formed in the second insulating layer 115 and a fourth contact hole CNT4 formed in the third insulating layer 117.

The pixel electrode 310 may be a (semi-)transmissive electrode or a reflective electrode. In an embodiment, the pixel electrode 310 may include a reflective layer formed of Ag, Mg, Al, Pt, Pd, Au, Ni, Nd, Ir, Cr, or a compound thereof, and a transparent or semi-transparent electrode layer formed or disposed on the reflective layer. The transparent or semi-transparent electrode layer may include at least one selected from the group consisting of indium tin oxide (ITO), indium zinc oxide (IZO), ZnO, indium oxide ($In_2O_3$), and indium gallium oxide (IGO), and aluminum zinc oxide (AZO). In an embodiment, as shown in FIG. 4, the pixel electrode 310 may include three layers. For example, the three layers of the pixel electrode 310 may be formed of ITO/Ag/ITO. As another example, the pixel electrode 310 may include a single layer or multiple layers.

A pixel-defining layer 119, which is an organic material layer, may be disposed on the third insulating layer 117. The pixel-defining layer 119 may cover or overlap an edge of the pixel electrode 310 and may have an opening 1190P through which a portion of or part of the pixel electrode 310 is exposed. The pixel-defining layer 119 may increase a distance between the edge of the pixel electrode 310 and the opposite electrode 330 over the pixel electrode 310, to prevent an arc or the like from occurring on the edge of the pixel electrode 310.

In an embodiment, the pixel-defining layer 119 may at least partially expose an upper surface of the third insulating layer 117. The pixel-defining layer 119 may at least partially overlap the third insulating layer 117. As a result, as shown in FIG. 4, the upper surface of the third insulating layer 117 at least partially exposed by the pixel-defining layer 119 may be in contact with or direct contact with the opposite electrode 330 to be described below.

In an embodiment, on a plane, an edge of the pixel-defining layer 119 may correspond to the edge of the pixel electrode 310. The pixel-defining layer 119 may be disposed to cover or overlap the edge of the pixel electrode 310 and may be disposed along a substantially planar shape of the edge of the pixel electrode 310. A substantially planar shape of the pixel-defining layer 119 may be the same as or similar to the substantially planar shape of the pixel electrode 310. The upper surface of the third insulating layer 117 may be at least partially exposed by the pixel-defining layer 119 disposed along the substantially planar shape of the edge of the pixel electrode 310.

An insulating layer including an organic material may be partially removed by a thickness of the pixel-defining layer 119. Because the pixel-defining layer 119 adjacent to the light-emitting element 300 are partially removed, a volume of an organic material in the display apparatus 1 may be reduced and outgassing of the organic material may be minimized. Accordingly, even in case that the display apparatus 1 is exposed to sunlight for a long time, decomposition of the organic material due to the sunlight may be prevented or minimized, thereby preventing defects such as pixel shrinkage due to outgassing. The reliability of the display apparatus 1 may be improved.

The pixel-defining layer 119 may include at least one organic insulating material selected from the group consisting of polyimide, polyamide, an acrylic resin, benzocyclobutene, and a phenolic resin by using spin coating or the like within the spirit and the scope of the disclosure.

The intermediate layer 320 may be disposed in the opening 1190P defined by the pixel-defining layer 119 and may include an organic emission layer. The organic emission layer may include an organic material including a fluorescent or phosphorescent material emitting red light, green light, blue light, or white light. The organic emission layer may include a low molecular weight organic material or a polymer organic material, and functional layers such as a hole transport layer (HTL), a hole injection layer (HIL), an electron transport layer (ETL), and an electron injection layer (EIL) may be selectively arranged or disposed under or below and over the organic emission layer.

The opposite electrode 330 may be a transmissive electrode or a reflective electrode. In an embodiment, the opposite electrode 330 may be a transparent or semi-transparent electrode and may include a metal thin film having a low work function including Li, Ca, LiF/Ca, LiF/Al, Al, Ag, Mg, or a compound thereof. Also, a transparent conductive oxide (TCO) layer including ITO, IZO, ZnO, or $In_2O_3$ may be further arranged or disposed on the metal thin film. The opposite electrode 330 may be disposed over the display area DA and may be disposed on the intermediate layer 320 and the pixel-defining layer 119. The opposite electrode 330 may be integrated into one body with a plurality of light-emitting elements 300 to correspond to a plurality of pixel electrodes 310.

Because an organic light-emitting element may be easily damaged by external moisture or oxygen, the thin-film encapsulation layer 400 may cover or overlap and protect the organic light-emitting element as described below with reference to FIG. 12. The thin-film encapsulation layer 400 may include a first inorganic encapsulation layer 410, an organic encapsulation layer 420, and a second inorganic encapsulation layer 430.

As described above, the insulating layer including the organic material may be partially removed by the thickness of the pixel-defining layer 119. The organic encapsulation layer 420 may be further arranged or disposed by an amount by which the insulating layer is removed. Because a thickness of the organic encapsulation layer 420 may be increased by the amount by which the insulating layer is removed, it is difficult for a foreign material introduced from the outside to reach the opposite electrode 330. In case that the foreign material introduced from the outside reaches the opposite electrode 330, deterioration of the light-emitting element 300 may occur. However, because it is difficult for the foreign material to reach the opposite electrode 330 due to the organic encapsulation layer 420 having the increased thickness, deterioration of the light-emitting element 300 may be prevented. For example, a problem that the thin-film encapsulation layer 400 is damaged by the foreign material introduced from the outside and the light-emitting element 300 deteriorates due to damage to the thin-film encapsulation layer 400 may be prevented.

According to an embodiment, the display apparatus 1 may include the pad electrode PE disposed in the peripheral area PA. The pad electrode PE may be a portion of or a part of the conductive layer CL arranged or disposed under or below the semiconductor layer Act.

As a comparative example, a pad electrode disposed in a peripheral area and a gate electrode may include the same material or similar material. The gate electrode may include a Cu layer, and the pad electrode may also include a Cu layer. The pad electrode may be partially exposed by an insulating layer. An ITO layer may be formed or disposed on the Cu layer to prevent the Cu layer from being exposed by the pad electrode. Accordingly, the gate electrode and the pad electrode may have a multilayer structure of Ti/Cu/ITO.

An etchant capable of etching the ITO layer may be used to pattern the gate electrode. The etchant may also etch IGZO similar to ITO. Accordingly, in case that the gate electrode is patterned, a semiconductor layer arranged or disposed under or below the gate electrode and including IGZO may be partially etched. The gate electrode may not be normally patterned, and a portion of the gate electrode may be eroded. As a result, a thin-film transistor including the gate electrode and the semiconductor layer may not perform a normal operation.

However, in case that the pad electrode PE is a portion of or a part of the conductive layer CL disposed under or below the semiconductor layer Act as in the embodiment, other metal layers are not arranged or disposed under or below the pad electrode PE, thereby preventing a portion of the other metal layers from being eroded by the etchant in case that the pad electrode PE is formed by etching a preliminary conductive layer.

Also, the pad electrode PE is disposed closest to the substrate 100 than the other metal layers and thus may be protected from a foreign material introduced from the outside. Because the pad electrode PE is disposed on the lowermost layer among several metal layers, defects due to the foreign material introduced from the outside may be prevented.

Figure 5:
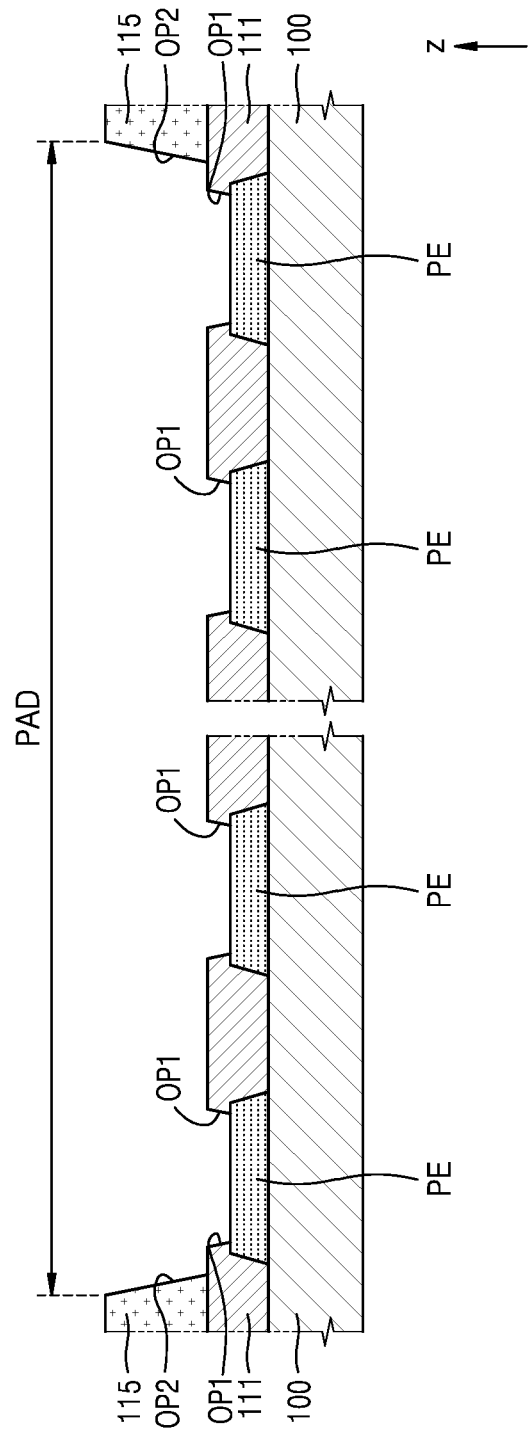
FIG. 5 is a schematic cross-sectional view of a pad portion of FIG. 1.

FIG. 5 is a schematic cross-sectional view of a pad portion PAD of FIG. 1. In FIG. 5, the same elements as those in FIG. 4 are denoted by the same reference numerals, and thus a repeated description thereof will be omitted. FIG. 4 illustrates one pad electrode, whereas FIG. 5 illustrates a plurality of pad electrodes adjacent to each other.

Referring to FIG. 5, a plurality of pad electrodes PE may be disposed in the pad portion PAD. The pad electrodes PE may be disposed adjacent to each other. Although FIG. 5 illustrates four pad electrodes PE, a plurality of pad electrodes PE, which are not shown, may be disposed between perforated lines.

An edge of each of the pad electrodes PE may be surrounded by the first insulating layer 111. The first insulating layer 111 may include a plurality of first openings OP1 at least partially exposing the pad electrodes PE.

The second insulating layer 115 may include a second opening OP2 at least partially exposing the pad electrodes PE. The second opening OP2 may overlap the first openings OP1.

The second insulating layer 115 may be disposed outside the pad portion PAD, and the pad portion PAD may be defined by the second opening OP2. As a result, because the second insulating layer 115 is absent in the pad portion PAD or is minimized due to the second opening OP2, a total thickness of insulating layers present in the pad portion PAD may be reduced. The reduced total thickness of the insulating layers present in the pad portion PAD may facilitate electrical contact between the pad electrodes PE and a printed circuit board or a driver IC chip.

As described above in FIG. 4, an opening size of the second opening OP2 formed in the second insulating layer 115 may be greater than an opening size of each of the first openings OP1 formed in the first insulating layer 111. On a plane, an opening area of the second opening OP2 formed in the second insulating layer 115 may be greater than an opening area of each of the first opening OP1 formed in the first insulating layer 111.

Figure 6:
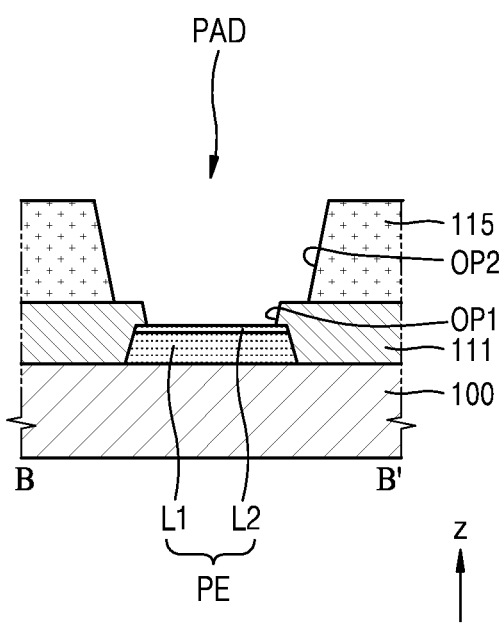
FIG. 6 is a schematic cross-sectional view of a pad portion of FIG. 1 taken along line B-B'.

FIG. 6 is a schematic cross-sectional view of a pad portion PAD of FIG. 1 taken along line B-B'. In FIG. 6, the same elements as those in FIG. 4 are denoted by the same reference numerals, and thus a repeated description thereof will be omitted.

Referring to FIG. 6, the pad electrode PE may include a first layer L1 and a second layer L2.

The first layer L1 of the pad electrode PE may include a single layer or multiple layers of one or more metals selected from the group consisting of Al, Pt, Pd, Ag, Mg, Au, Ni, Nd, Ir, Cr, Li, Ca, Mo, Ti, W, and Cu. For example, the first layer L1 of the pad electrode PE may have a multilayer structure of Ti/Al.

The second layer L2 of the pad electrode PE may be disposed on the first layer L1. The second layer L2 of the pad electrode PE may be at least partially exposed by the first opening OP1 of the first insulating layer 111. The second layer L2 of the pad electrode PE may protect the first layer Li.

The second layer L2 of the pad electrode PE may include at least one selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO).

Although FIG. 6 illustrates that the pad electrode PE may include two layers, the pad electrode PE may include a single layer or multiple layers. For example, the pad electrode PE may include the first layer L1, the second layer L2, and a third layer.

FIGS. 7A to 7K are schematic cross-sectional views sequentially illustrating a method of manufacturing a display apparatus, according to an embodiment, based on FIG. 4.

Referring to FIG. 7A, first, the first electrode E1, the second electrode E2, the lower electrode CE1 of the storage capacitor Cst, and the pad electrode PE are formed or disposed on the substrate 100.

The first electrode E1, the second electrode E2, the lower electrode CE1 of the storage capacitor Cst, and the pad electrode PE may be formed by patterning a preliminary conductive layer (not shown). The preliminary conductive layer may include a conductive material including Mo, Al, Cu, or Ti, and may have a single-layer or multilayer structure including the above material.

In an embodiment, the first electrode E1, the second electrode E2, the lower electrode CE1 of the storage capacitor Cst, and the pad electrode PE may have a multilayer structure. For example, the first electrode E1, the second electrode E2, the lower electrode CE1 of the storage capacitor Cst, and the pad electrode PE may have a multilayer structure of Ti/Cu/ITO. An etching process may be performed two or more times by using different etchants to prevent a tip of the ITO at the top. As an example, an etching process may be performed only once by using an etchant etching all of the Ti, Cu, and ITO.

Referring to FIG. 7B, the first insulating layer 111 and the semiconductor layer Act may be sequentially formed or disposed on the first electrode E1, the second electrode E2, the lower electrode CE1 of the storage capacitor Cst, and the pad electrode PE.

The first insulating layer 111 may include silicon oxide (SiO$_x$) or silicon nitride (SiN$_x$), and may be formed by using a deposition method such as chemical vapor deposition (CVD) or sputtering.

The semiconductor layer Act may be disposed on the first insulating layer 111. The semiconductor layer Act may be formed by patterning a preliminary semiconductor layer (not shown). The preliminary semiconductor layer may include amorphous silicon, polysilicon, or an oxide semiconductor material. The preliminary semiconductor layer may be deposited by using CVD.

Referring to FIG. 7C, the gate insulating layer 113 is formed or disposed on the semiconductor layer Act. The gate insulating layer 113 may include silicon oxide (SiO$_x$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$) and may be formed by using a deposition method such as CVD, sputtering, or the like, and embodiments are not limited thereto.

Referring to FIG. 7D, the first contact hole CNT1, the second contact hole CNT2, and a plurality of holes H' may be formed in the first insulating layer 111 and the gate insulating layer 113.

The first electrode E1 may be at least partially exposed by the first contact hole CNT1, the second electrode E2 may be at least partially exposed by the second contact hole CNT2, and the semiconductor layer Act may be at least partially exposed by the holes H'. Portions of the semiconductor layer Act exposed by the holes H' may be conductorized by using plasma treatment or the like within the spirit and the scope of the disclosure.

The first contact hole CNT1, the second contact hole CNT2, and the holes H' may correspond to portions which are not protected by a photoresist pattern, and may be formed by partially etching the first insulating layer 111 and the gate insulating layer 113.

Referring to FIG. 7E, the gate electrode G, the third electrode E3, the fourth electrode E4, and the upper electrode CE2 of the storage capacitor Cst may be formed or disposed on the gate insulating layer 113.

The gate electrode G, the third electrode E3, the fourth electrode E4, and the upper electrode CE2 of the storage capacitor Cst may be simultaneously formed by patterning a preliminary electrode layer (not shown). The preliminary electrode layer may have a single-layer or multilayer structure including at least one metal selected from among Al, Pt, Pd, Ag, Mg, Au, Ni, Nd, Ir, Cr, Li, Ca, Mo, Ti, W, and Cu, and may be formed by using a deposition method such as, but not limited to, CVD, plasma-enhanced CVD (PECVD), low-pressure CVD (LPCVD), physical vapor deposition (PVD), sputtering, or atomic layer deposition (ALD).

In detail, photoresist patterns PR may be disposed to respectively correspond to portions of the preliminary electrode layer where the gate electrode G, the third electrode E3, the fourth electrode E4, and the upper electrode CE2 of the storage capacitor Cst are to be formed. As shown in FIG. 7E, the gate electrode G, the third electrode E3, the fourth electrode E4, and the upper electrode CE2 of the storage capacitor Cst may be formed by etching portions of the preliminary electrode layer in which the photoresist patterns PR are not present. Portions of the semiconductor layer Act may also be etched to form the holes H. Depending on the type of etchant, the first insulating layer 111 may or may not be exposed by the holes H. As another example, the semiconductor layer Act may not be etched.

Portions of the gate insulating layer 113 may be etched by changing only the etchant without removing the photoresist patterns PR. The first portion 113a, the second portion 113b, the third portion 113c, and the fourth portion 113d may be formed by etching portions of the gate insulating layer 113.

In case that the portions of the gate insulating layer 113 are etched, plasma treatment is performed, and a portion of the semiconductor layer Act undergoes a conductorization process by plasma treatment. Also, in case that the portions of the gate insulating layer 113 are etched, the photoresist patterns PR may be removed together. As an example, the photoresist patterns PR may be removed separately from the gate insulating layer 113.

Because the gate electrode G and the first portion 113a of the gate insulating layer 113 are formed by using the same photoresist pattern PR, a substantially planar shape of the gate electrode G may substantially correspond to a substantially planar shape of the first portion 113a of the gate insulating layer 113. Although it has been described based on the gate electrode G and the first portion 113a of the gate insulating layer 113, the same applies to the third electrode E3 and the second portion 113b of the gate insulating layer 113, the fourth electrode E4 and the third portion 113c of the gate insulating layer 113, and the upper electrode CE2 of the storage capacitor Cst and the fourth portion 113d of the gate insulating layer 113.

Referring to FIG. 7F, the second insulating layer 115 is formed or disposed on the gate electrode G, the third electrode E3, the fourth electrode E4, and the upper electrode CE2 of the storage capacitor Cst. The second insulating layer 115 may have a single-layer or multilayer structure including an organic material or an inorganic material. After the second insulating layer 115 is formed, chemical mechanical polishing may be performed to provide a flat upper surface.

An insulating material layer 117' is formed or disposed on the second insulating layer 115. The insulating material layer 117' may include a positive photoresist and may be formed by applying a positive photoresist solution (not shown) to the second insulating layer 115 by using any of various methods such as spin coating, spraying, or dipping.

A first mask M1 may be arranged or disposed on the insulating material layer 117'. The first mask M1 may adjust the amount of light exposure applied to the insulating material layer 117' in each area. For example, the amount of light exposure applied to the insulating material layer 117' in a third area AR3 of the first mask M1 may be adjusted to be less than that in a first area AR1 and a second area AR2 of the first mask M1. Also, the amount of light exposure applied to the insulating material layer 117' in a fourth area AR4 of the first mask M1 may be adjusted to be less than that in the first area AR1 and the second area AR2 of the first mask M1. In an embodiment, the remaining areas of the first mask M1 except for the first area AR1, the second area AR2, the third area AR3, and the fourth area AR4 may be shielded so that the insulating material layer 117' is not exposed. For example, the first mask M1 may be a half-tone mask or a slit mask.

The insulating material layer 117' may be exposed at different amounts of light exposure according to areas through the first mask M1, and a portion of the insulating material layer 117' may be removed by using a developing process. Because the amount of the insulating material layer 117' that is removed varies according to the amount of light exposure, the third insulating layer 117 having different thicknesses according to areas may be formed at one time. For example, as shown in FIG. 7G, a thickness t1 of the third insulating layer 117 corresponding to the display area DA may be greater than a thickness t2 of the third insulating layer 117 corresponding to the peripheral area PA. A degree of adhesion of the second insulating layer 115 may be increased through a curing and drying process of the third insulating layer 117. The curing and drying process may include a heat treatment process.

The insulating material layer 117' may be exposed in each area through the first mask M1, and the third insulating layer 117 may be formed by removing a portion of the insulating material layer 117' through a developing process. The third insulating layer 117 may have a single-layer or multilayer structure including an organic material or an inorganic material. After the third insulating layer 117 is formed, chemical mechanical polishing may be performed to provide a flat upper surface.

Although it has been described in FIG. 7F that the insulating material layer 117' may include the positive photoresist, the insulating material layer 117' may include a negative photoresist. Unlike in a case where the insulating material layer 117' may include the positive photoresist, a portion of the insulating material layer 117' which is exposed to light remains after the developing process.

Referring to FIG. 7G, the third insulating layer 117 may include the fourth contact hole CNT4 to correspond to a portion exposed by the first area AR1 of the first mask M1. The third insulating layer 117 may include a third opening OP3 to correspond to a portion exposed by the second area AR2 of the first mask M1.

The third contact hole CNT3 exposing a portion of the third electrode E3 is formed by using the third insulating layer 117 as an etching mask, and the second opening OP2 corresponding to or coinciding with the third opening OP3 is formed. Because the second opening OP2 of the second insulating layer 115 is formed by using the third insulating layer 117 as an etching mask, a substantially planar shape of the second opening OP2 may substantially correspond to a substantially planar shape of the third opening OP3. A sidewall of the second insulating layer 115 may correspond to a sidewall of the third insulating layer 117. A side surface of the second insulating layer 115 exposed by the second opening OP2 and a side surface of the third insulating layer 117 exposed by the third opening OP3 may be located or disposed on the same etched surface s'.

Although FIG. 7G illustrates that only the second insulating layer 115 is etched, depending on the time of an etching process, only a portion of the second insulating layer 115 may be etched, or the first insulating layer 111 may also be partially etched.

Referring to FIG. 7H, the pixel electrode 310 is formed or disposed on the third insulating layer 117. The pixel electrode 310 may be formed by depositing a pixel electrode material layer on the entire upper surface of the third insulating layer 117 and performing a mask process or an etching process thereon.

A pixel-defining material layer 119' is formed or disposed on the entire upper surface of the third insulating layer 117. The pixel-defining material layer 119' may include a positive photoresist and may be formed by applying a positive photoresist solution (not shown) to the third insulating layer 117 by using any of various methods such as spin coating, spraying, or dipping.

A second mask M2 may be located or disposed over the pixel-defining material layer 119'. The second mask M2 may adjust the amount of light exposure applied to the pixel-defining material layer 119' in each area. For example, the amount of light exposure applied to the pixel-defining material layer 119' in a first area AR1, a second area AR2, a third area AR3, a fourth area AR4, and a sixth area AR6 of the second mask M2 may be adjusted to be less than that in a fifth area AR5 of the second mask M2. In an embodiment, the remaining areas of the second mask M2 except for the first area AR1, the second area AR2, the third area AR3, the fourth area AR4, the fifth area AR5, and the sixth area AR6 may be shielded so that the pixel-defining material layer 119' is not exposed. For example, the second mask M2 may be a half-tone mask or a slit mask.

The pixel-defining material layer 119' may be exposed at different amounts of light exposure according to areas through the second mask M2, and a portion of the pixel-defining material layer 119' may be removed by using a developing process. Because the amount of the pixel-defining material layer 119' that is removed varies according to the amount of light exposure, the preliminary pixel-defining layer 119p having different thicknesses according to areas may be formed at one time.

For example, as shown in FIG. 7I, the preliminary pixel-defining layer 119p may include a first preliminary pixel-defining layer 119pa, a second preliminary pixel-defining layer 119pb surrounding at least a portion of or part of the first preliminary pixel-defining layer 119pa, and a third preliminary pixel-defining layer 119pc surrounding at least a portion of or part of the second preliminary pixel-defining layer 119pb. The first preliminary pixel-defining layer 119pa corresponds to a portion of or part of the pixel-defining material layer 119' that is exposed at an adjusted amount of light exposure and is partially removed due to the second area AR2 of the second mask M2. The second preliminary pixel-defining layer 119*pb* corresponds to a portion of or part of the pixel-defining material layer 119' that is not exposed by the second mask M2 and is not removed. The third preliminary pixel-defining layer 119*pc* corresponds to a portion of or part of the pixel-defining material layer 119' that is exposed at an adjusted amount of light exposure and is partially removed due to the first area AR1, the third area AR3, the fourth area AR4, and the sixth area AR6 of the second mask M2.

In an embodiment, on a plane, a boundary between the second preliminary pixel-defining layer 119*pb* and the third preliminary pixel-defining layer 119*pc* may correspond to an edge of the pixel electrode 310. The second preliminary pixel-defining layer 119*pb* may be disposed to cover or overlap the edge of the pixel electrode 310 and may be disposed along a substantially planar shape of the edge of the pixel electrode 310. A substantially planar shape of the second preliminary pixel-defining layer 119*pb* may be the same as or similar to the substantially planar shape of the pixel electrode 310.

In an embodiment, a thickness t1 of the first preliminary pixel-defining layer 119*pa* may be less than a thickness t2 of the second preliminary pixel-defining layer 119*pb*. A thickness t3 of the third preliminary pixel-defining layer 119*pc* may be less than the thickness t2 of the second preliminary pixel-defining layer 119*pb*. The thickness t1 of the first preliminary pixel-defining layer 119*pa* may be equal to the thickness t3 of the third preliminary pixel-defining layer 119*pc*.

Although it has been described in FIG. 7H that the pixel-defining material layer 119' may include the positive photoresist, the pixel-defining material layer 119' may include a negative photoresist. Unlike in a case where the pixel-defining material layer 119' may include the positive photoresist, a thickness of the pixel-defining material layer 119' remaining after a developing process increases as the amount of light exposure of the pixel-defining material layer 119' increases.

Referring to FIG. 7I, the preliminary pixel-defining layer 119*p* may include a fourth opening OP4 to correspond to a portion exposed by the fifth area AR5 of the second mask M2.

The first opening OP1 exposing at least a portion of or a part of the pad electrode PE is formed by using the preliminary pixel-defining layer 119*p* as an etching mask. Because the first opening OP1 of the first insulating layer 111 is formed by using the preliminary pixel-defining layer 119*p* as an etching mask, a substantially planar shape of the first opening OP1 may substantially correspond to a substantially planar shape of the fourth opening OP4. A sidewall of the first insulating layer 111 may correspond to a sidewall of the preliminary pixel-defining layer 119*p*. A side surface of the first insulating layer 111 exposed by the first opening OP1 and a side surface of the preliminary pixel-defining layer 119*p* exposed by the fourth opening OP4 may be located or disposed on the same etched surface s".

As a comparative example, in case that a buffer layer and an inorganic insulating layer for exposing a portion of or part of a pad electrode are partially etched, a planarization layer on which a pixel electrode is arranged or disposed may be used as a mask. In case that a foreign material exists on a surface of the planarization layer, a stepped portion may be formed between a portion on which the foreign material exists and a portion on which the foreign material does not exist during the etching process. In case that a light-emitting element is arranged or disposed on the surface of the planarization layer having the stepped portion, a short may occur between the pixel electrode and an opposite electrode, thereby resulting in dark spots on a display panel. Also, because the surface of the planarization layer is not protected during the etching process, a surface roughness of the planarization layer may be increased. In case that the pixel electrode is arranged or disposed on the surface of the planarization layer having the increased surface roughness, a reflectance of external light may be reduced, and luminous efficiency may be reduced.

However, as in the embodiment, an etching process for partially exposing the pad electrode PE may be performed by using the preliminary pixel-defining layer 119*p* formed or disposed on the pixel electrode 310. A surface of the third insulating layer 117 on which the pixel electrode 310 is disposed may be protected by the preliminary pixel-defining layer 119*p*. Accordingly, a stepped portion due to a foreign material is not formed or disposed on the surface of the third insulating layer 117, and a surface roughness of the third insulating layer 117 is not increased. For example, dark spots are not formed or disposed on the display panel, a reflectance of external light is not reduced, and thus luminous efficiency is not reduced.

Figure 7J:
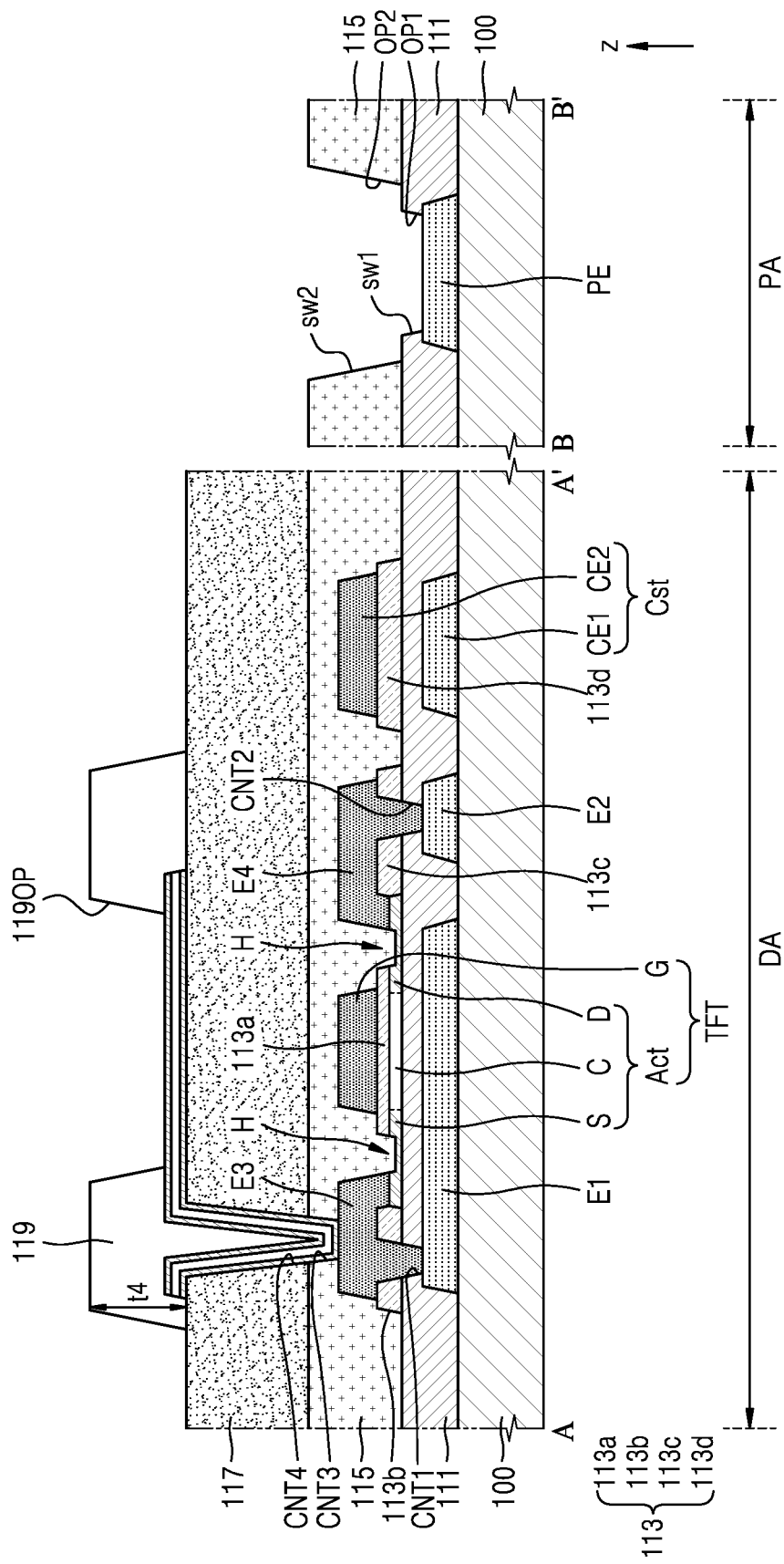

Referring to FIG. 7J, in order to expose a portion of or part of the pixel electrode 310, an etching process of removing the second preliminary pixel-defining layer 119*pb* is performed. The third preliminary pixel-defining layer 119*pc* and a portion of the third insulating layer 117 corresponding to the peripheral area PA may be etched and removed together. The pixel-defining layer 119 may be formed by removing the second preliminary pixel-defining layer 119*pb* and the third preliminary pixel-defining layer 119*pc*. For example, the etching process may be a dry etching process.

The pixel-defining layer 119 may include the opening 1190P to correspond to the removed second preliminary pixel-defining layer 119*pb*. Because the pixel-defining layer 119 is formed by partially etching the preliminary pixel-defining layer 119*p*, a thickness t4 of the pixel-defining layer 119 may be less than a thickness t1 of the preliminary pixel-defining layer 119*p*.

In an embodiment, the second sidewall sw2 of the second insulating layer 115 defining the second opening OP2 may be disposed outside the first sidewall sw1 of the first insulating layer 111 defining the first opening OP1. The first sidewall sw1 of the first insulating layer 111 and the second sidewall sw2 of the second insulating layer 115 may be disposed to be misaligned from each other.

As described above with reference to FIGS. 7G and 7I, the second opening OP2 of the second insulating layer 115 may be formed by using the third insulating layer 117 as an etching mask, and the first opening OP1 of the first insulating layer 111 may be formed by using the preliminary pixel-defining layer 119*p* as an etching mask. For example, the first opening OP1 of the first insulating layer 111 and the second opening OP2 of the second insulating layer 115 may be formed by using different etching masks. Therefore, the first sidewall sw1 of the first insulating layer 111 defining the first opening OP1 and the second sidewall sw2 of the second insulating layer 115 defining the second opening OP2 may be misaligned from each other. Steps may be formed at a boundary between the first insulating layer 111 and the second insulating layer 115.

Figure 7K:
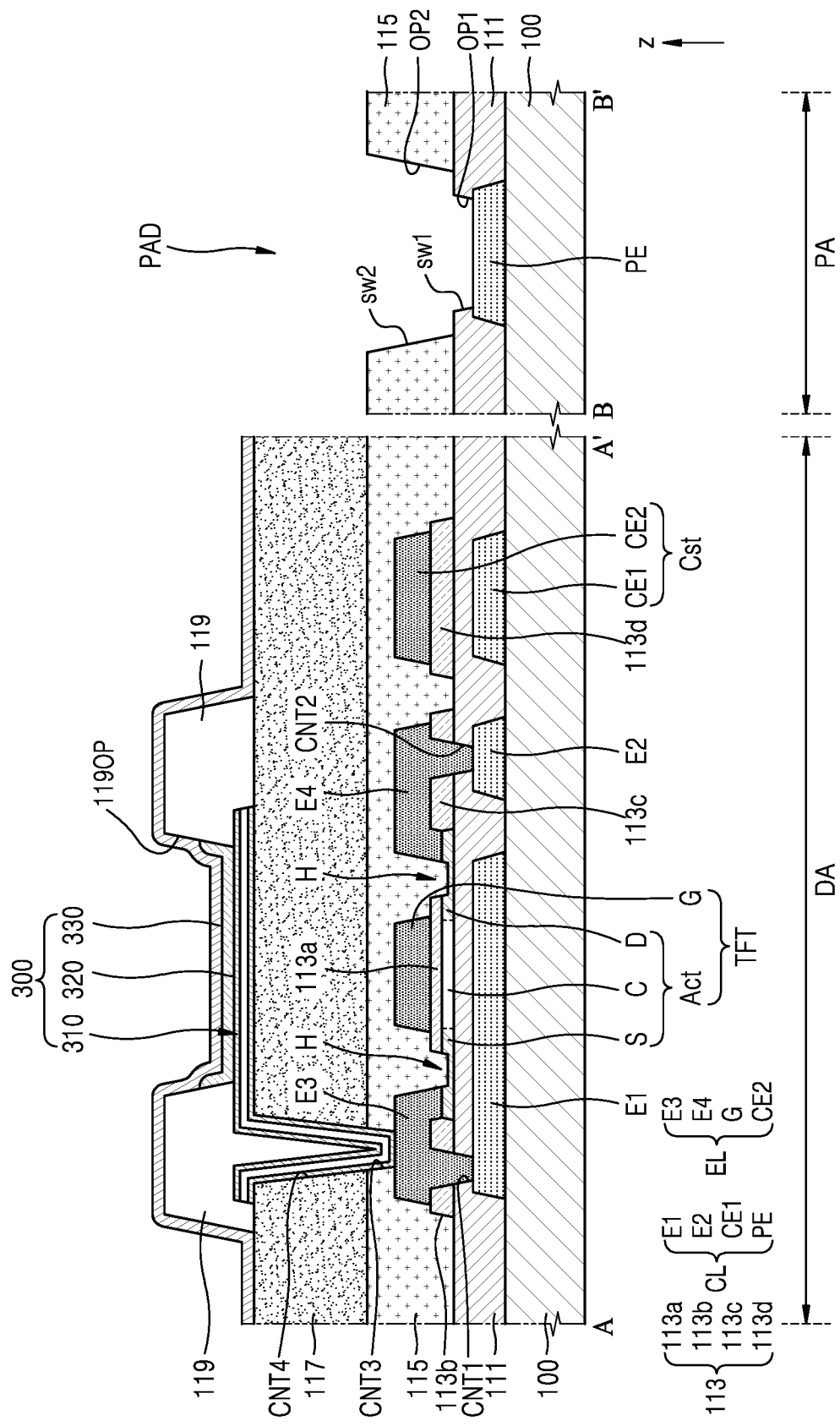

Referring to FIG. 7K, the intermediate layer 320 is formed or disposed on the pixel electrode 310, for example, in an opening of the pixel-defining layer 119. The intermediate layer 320 may include a low molecular weight material or a polymer material. The intermediate layer 320 may be formed by using vacuum deposition, screen printing, inkjet printing, or laser-induced thermal imaging (LITI).

The intermediate layer 320 of the light-emitting element 300 may include an organic emission layer. The organic emission layer may include an organic material including a fluorescent or phosphorescent material emitting red light, green light, blue light, or white light. The organic emission layer may be formed of a low molecular weight organic material or a high molecular weight organic material, and functional layers such as an HTL, an HIL, an ETL, and an EIL may be selectively disposed under or below and over the organic emission layer. The intermediate layer 320 may correspond to each of a plurality of pixel electrodes 310. However, embodiments are not limited thereto. Various modifications may be made. For example, the intermediate layer 320 may include an integrated layer over the pixel electrodes 310.

The opposite electrode 330 is formed to correspond to a plurality of light-emitting elements 300. The opposite electrode 330 may be formed or disposed to cover or overlap the display area DA of the substrate 100 through an open mask. The opposite electrode 330 may be formed by using a deposition method such as CVD, PECVD, LPCVD, PVD, sputtering, or ALD.

Figure 8:
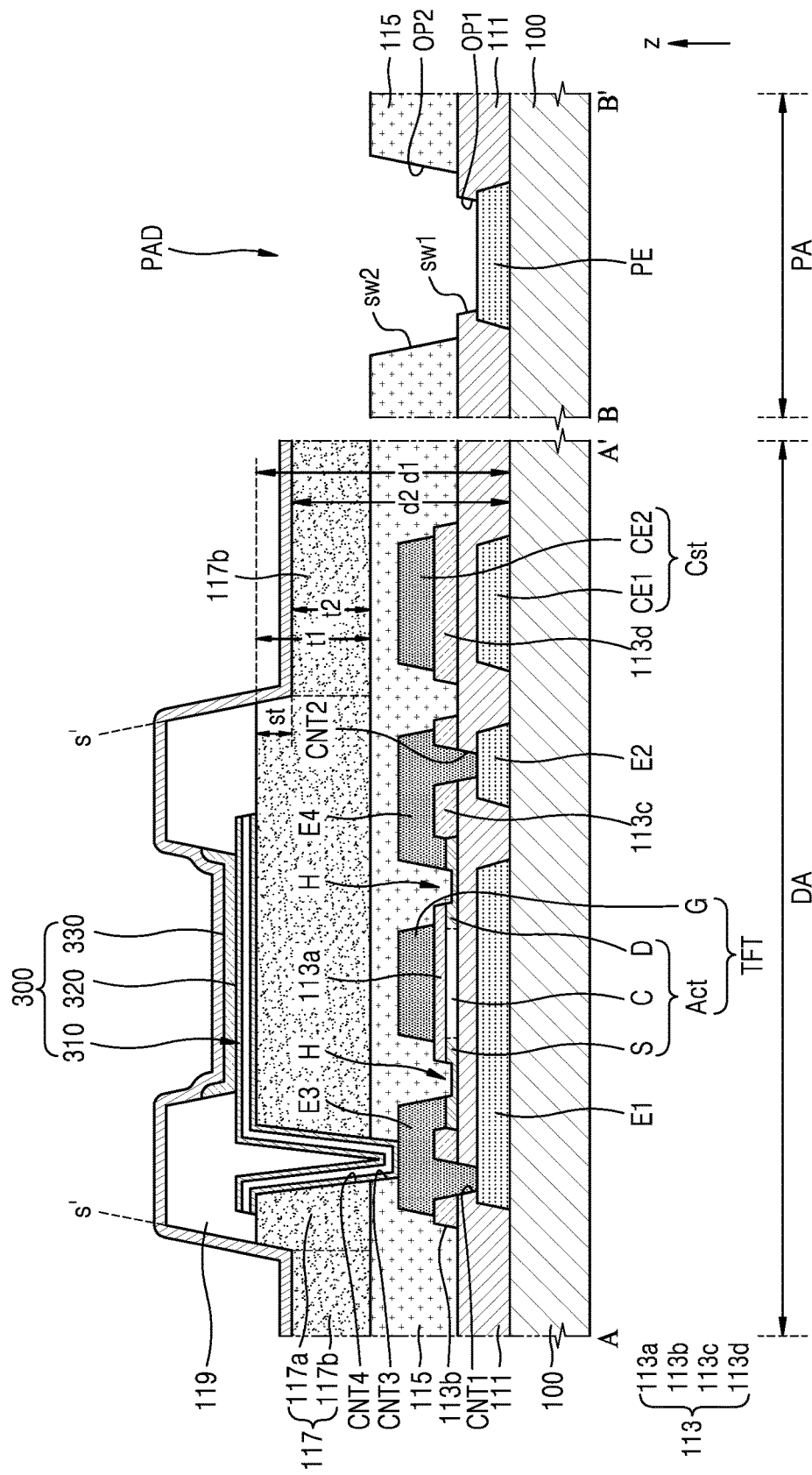
FIG. 8 is a schematic cross-sectional view of a display area and a pad portion of FIG. 1 taken along line A-A' and line B-B', respectively.

FIG. 8 is a schematic cross-sectional view of a display area DA and a pad portion PAD of FIG. 1 taken along line A-A' and line B-B', respectively. In FIG. 8, the same elements as those in FIG. 4 are denoted by the same reference numerals, and thus a repeated description thereof will be omitted. Also, FIG. 8 corresponds to a partial modification of FIG. 4 and thus will be described by focusing on differences from FIG. 4.

Referring to FIG. 8, the third insulating layer 117 may include a first portion 117*a*, and a second portion 117*b* extending from the first portion 117*a*.

In an embodiment, the first portion 117*a* may have a first thickness t1, and the second portion 117*b* may have a second thickness t2. The first thickness t1 of the first portion 117*a* and the second thickness t2 of the second portion 117*b* may be different from each other. For example, as shown in FIG. 8, the first thickness t1 of the first portion 117*a* may be greater than the second thickness t2 of the second portion 117*b*.

In an embodiment, a step st between the first portion 117*a* and the second portion 117*b* may be provided or disposed on the upper surface of the third insulating layer 117. A vertical distance d1 between an upper surface of the substrate 100 and an upper surface of the first portion 117*a* may be different from a vertical distance d2 between the upper surface of the substrate 100 and an upper surface of the second portion 117*b*. For example, as shown in FIG. 8, the vertical distance d1 between the upper surface of the substrate 100 and the upper surface of the first portion 117*a* may be greater than the vertical distance d2 between the upper surface of the substrate 100 and the upper surface of the second portion 117*b*.

In an embodiment, the pixel electrode 310 may be disposed on the first portion 117*a* of the third insulating layer 117. The pixel electrode 310 may be surrounded by the step st between the first portion 117*a* and the second portion 117*b*.

Figure 9A:
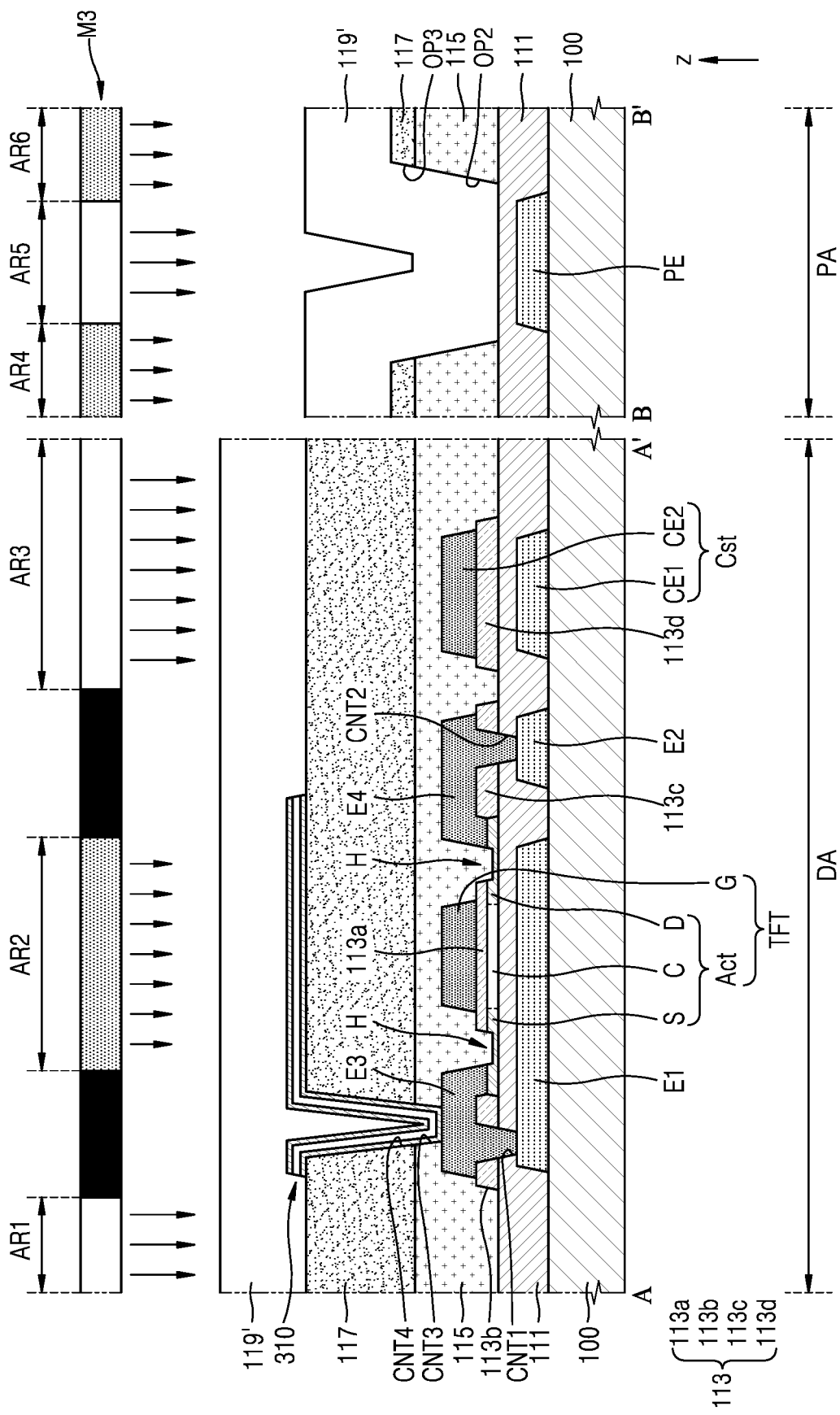
FIGS. 9A to 9D are schematic cross-sectional views sequentially illustrating a method of manufacturing a display apparatus, according to an embodiment, based on FIG. 8.
Figure 9B:
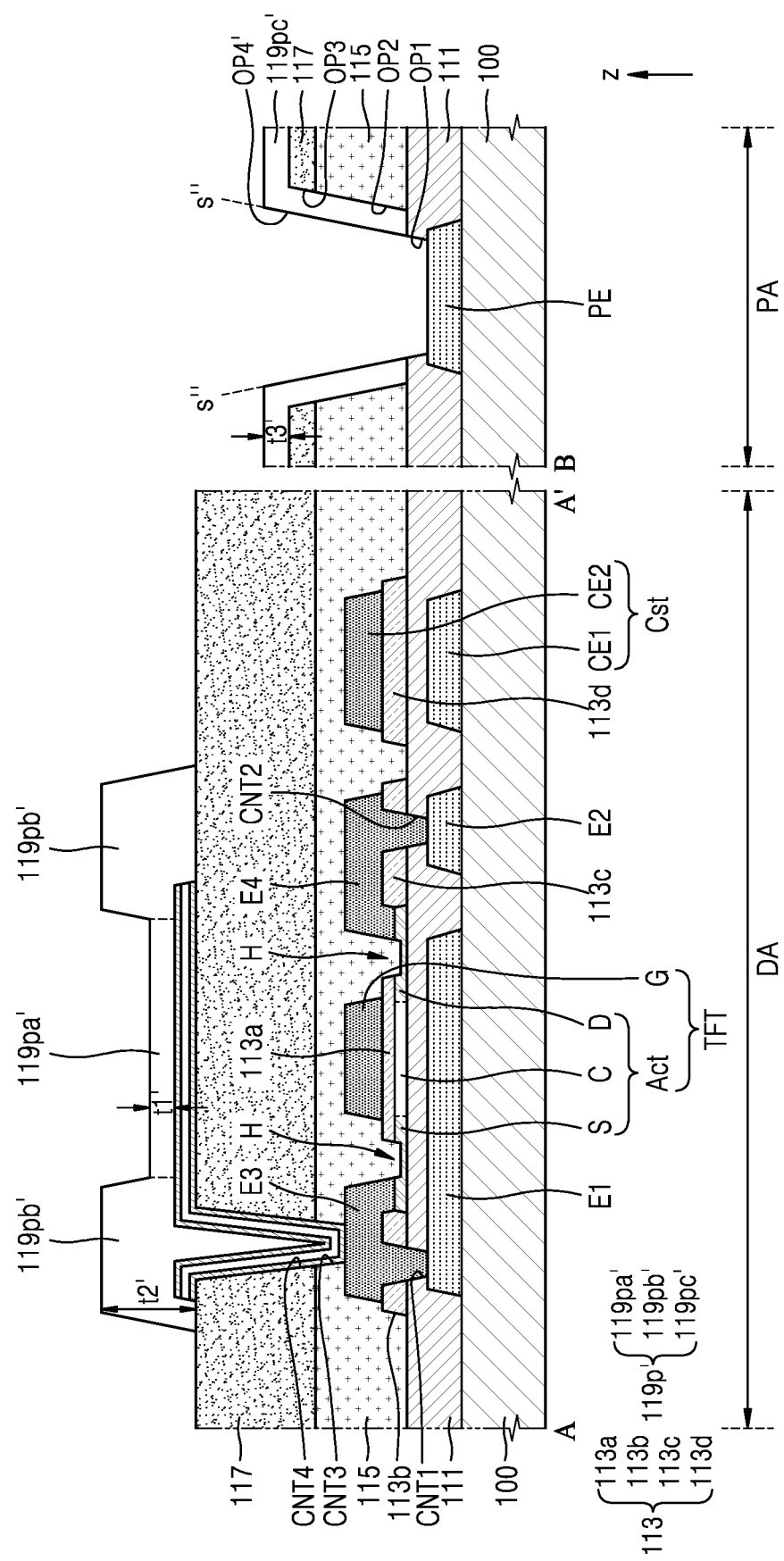
Figure 9C:
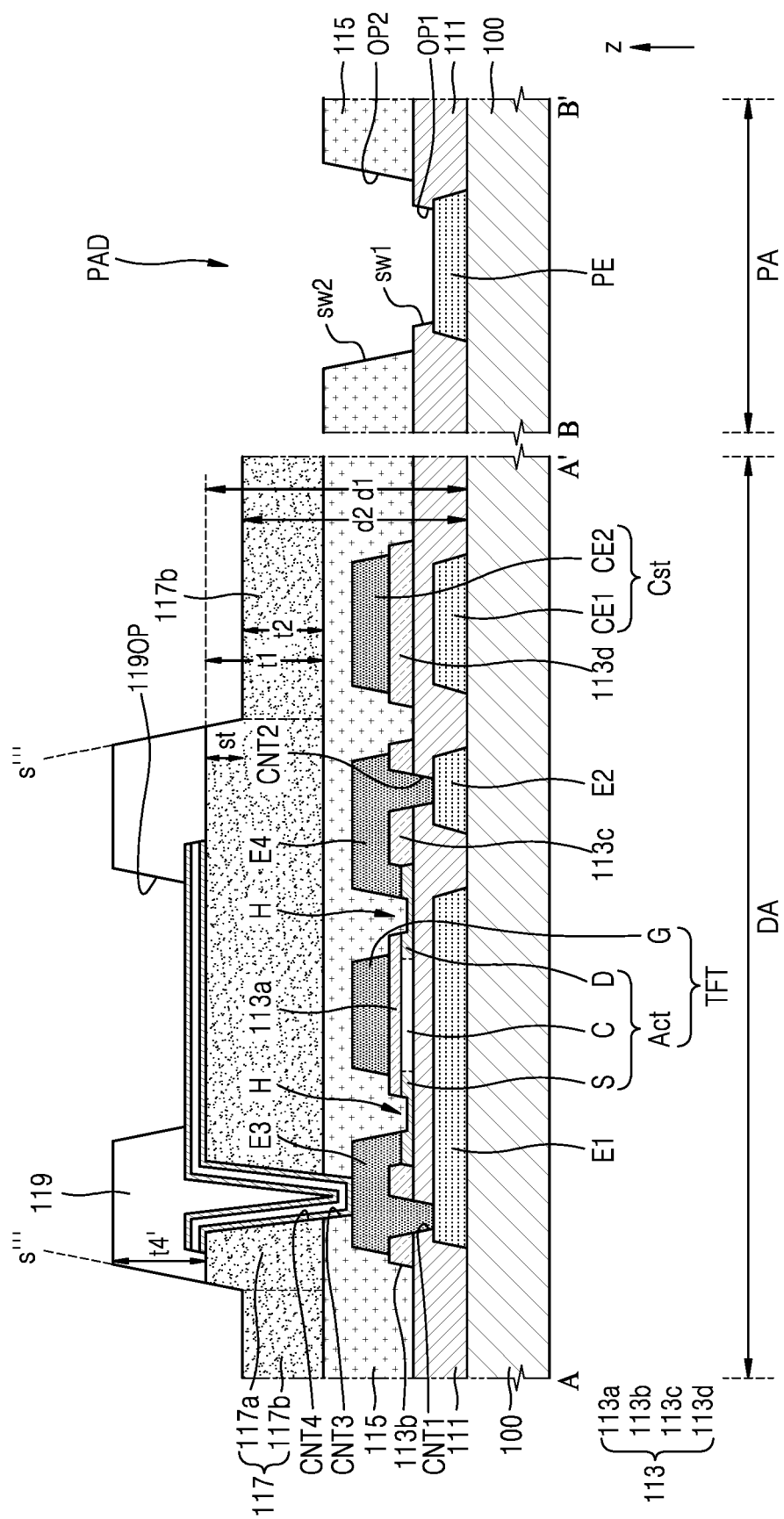

As shown in FIGS. 9B and 9C to be described below, a preliminary pixel-defining layer 119*p*' may be disposed on the third insulating layer 117 to expose at least a portion of the third insulating layer 117. On a plane, an edge of the preliminary pixel-defining layer 119*p*' may correspond to the edge of the pixel electrode 310. The preliminary pixel-defining layer 119*p*' may be disposed to cover or overlap the edge of the pixel electrode 310 and may be disposed along a substantially planar shape of the edge of the pixel electrode 310. The upper surface of the third insulating layer 117 may be at least partially exposed by the preliminary pixel-defining layer 119*p*' disposed along the substantially planar shape of the edge of the pixel electrode 310. Because the first portion 117*a* of the third insulating layer 117 is formed by using the preliminary pixel-defining layer 119*p*' as an etching mask, both a substantially planar shape of the pixel electrode 310 and a planar shape of the first portion 117*a* may substantially correspond to a substantially planar shape of the preliminary pixel-defining layer 119*p*'. Also, an outer surface of the pixel-defining layer 119 and a side surface of the first portion 117*a* may be located or disposed on the same etched surface s'.

An insulating layer including an organic material may be partially removed by a thickness of the pixel-defining layer 119 and the step st of the third insulating layer 117. Because the pixel-defining layer 119 and the third insulating layer 117 adjacent to the light-emitting element 300 are partially removed, a volume of an organic material in the display apparatus 1 may be reduced and outgassing of the organic material may be minimized. Accordingly, even in case that the display apparatus 1 is exposed to sunlight for a long time, decomposition of the organic material due to the sunlight may be prevented or minimized, thereby preventing defects such as pixel shrinkage due to outgassing. The reliability of the display apparatus 1 may be improved.

FIGS. 9A to 9D are schematic cross-sectional views sequentially illustrating a method of manufacturing a display apparatus, according to an embodiment, based on FIG. 8. In FIGS. 9A through 9D, the same elements as those in FIGS. 7A through 7K are denoted by the same reference numerals, and thus a repeated description thereof will be omitted. Also, FIGS. 9A to 9D correspond to partial modifications of FIGS. 7A to 7K and thus will be described by focusing on differences from FIGS. 7A to 7K.

Referring to FIG. 9A, the pixel electrode 310 is formed or disposed on the third insulating layer 117. The pixel electrode 310 may be formed by depositing a pixel electrode material layer on the entire upper surface of the third insulating layer 117 and performing a mask process or an etching process thereon. The process before the pixel electrode 310 is formed or disposed on the third insulating layer 117 may be the same as in FIGS. 7A to 7G.

The pixel-defining material layer 119' is formed or disposed on the entire upper surface of the third insulating layer 117. The pixel-defining material layer 119' may include a positive photoresist and may be formed by applying a positive photoresist solution (not shown) to the third insulating layer 117 by using any of various methods such as spin coating, spraying, or dipping.

A third mask M3 may be located or disposed over the pixel-defining material layer 119'. The third mask M3 may adjust the amount of light exposure of the pixel-defining material layer 119' in each area. For example, the amount of light exposure applied to the pixel-defining material layer 119' in a second area AR2, a fourth area AR4, and a sixth area AR6 of the third mask M3 may be adjusted to be less that in a first area AR1, a third area AR3, and a fifth area AR5 of the third mask M3. In an embodiment, the remaining areas of the third mask M3 except for the first area AR1, the second area AR2, the third area AR3, the fourth area AR4, the fifth area AR5, and the sixth area AR6 may be shielded so that the pixel-defining material layer 119' is not exposed. For example, the third mask M3 may be a half-tone mask or a slit mask.

The pixel-defining material layer 119' may be exposed at different amounts of light exposure according to areas through the third mask M3, and a portion of or part of the pixel-defining material layer 119' may be removed through a developing process. Because the amount of the pixel-defining material layer 119' that is removed varies according to the amount of light exposure, the preliminary pixel-defining layer 119p' having different thicknesses according to areas may be formed at one time.

For example, as shown in FIG. 9B, the preliminary pixel-defining layer 119p' may include a first preliminary pixel-defining layer 119pa', a second preliminary pixel-defining layer 119pb' surrounded by the first preliminary pixel-defining layer 119pa', and a third preliminary pixel-defining layer 119pc' corresponding to the peripheral area PA. The first preliminary pixel-defining layer 119pa' corresponds to a portion of or part of the pixel-defining material layer 119' that is exposed at an adjusted amount of light exposure and is partially removed due to the second area AR2 of the third mask M3. The second preliminary pixel-defining layer 119pb' corresponds to a portion of or part of the pixel-defining material layer 119' that is not exposed by the second mask M2 and is not removed. The third preliminary pixel-defining layer 119pc' corresponds to a portion of or part of the pixel-defining material layer 119' that is exposed at an adjusted amount of light exposure and is partially removed due to the fourth area AR4 and the sixth area AR6 of the third mask M3.

In an embodiment, on a plane, an edge of the second preliminary pixel-defining layer 119pb' may correspond to the edge of the pixel electrode 310. The second preliminary pixel-defining layer 119pb' may be disposed to cover or overlap the edge of the pixel electrode 310 and may be disposed along a substantially planar shape of the edge of the pixel electrode 310.

In an embodiment, a thickness t1' of the first preliminary pixel-defining layer 119pa' may be less than a thickness t2' of the second preliminary pixel-defining layer 119pb'. A thickness t3' of the third preliminary pixel-defining layer 119pc' may be less than the thickness t2' of the second preliminary pixel-defining layer 119pb'. The thickness t1' of the first preliminary pixel-defining layer 119pa' may be equal to the thickness t3' of the third preliminary pixel-defining layer 119pc'.

Although it has been described in FIG. 9A that the pixel-defining material layer 119' may include the positive photoresist, the pixel-defining material layer 119' may include a negative photoresist. Unlike in a case where the pixel-defining material layer 119' may include the positive photoresist, a thickness of the pixel-defining material layer 119' remaining after a developing process increases as the amount of light exposure of the pixel-defining material layer 119' increases.

Referring to FIG. 9B, the preliminary pixel-defining layer 119p' may include a fourth opening OP4' to correspond to a portion exposed by the fifth area AR5 of the third mask M3.

The first opening OP1 exposing at least a portion of or a part of the pad electrode PE is formed by using the preliminary pixel-defining layer 119p' as an etching mask. Because the first opening OP1 of the first insulating layer 111 is formed by using the preliminary pixel-defining layer 119p' as an etching mask, the substantially planar shape of the first opening OP1 may substantially correspond to a substantially planar shape of the fourth opening OP4'. The sidewall of the first insulating layer 111 may correspond to a sidewall of the preliminary pixel-defining layer 119p'. The side surface of the first insulating layer 111 exposed by the first opening OP1 and a side surface of the preliminary pixel-defining layer 119p' exposed by the fourth opening OP4' may be located or disposed on the same etched surface s".

In case that an etching process for partially exposing the pad electrode PE is performed by using the preliminary pixel-defining layer 119p' formed or disposed on the pixel electrode 310, the surface of the third insulating layer 117 on which the pixel electrode 310 is disposed may be protected by the preliminary pixel-defining layer 119p'. Accordingly, a stepped portion due to a foreign material is not formed or disposed on the surface of the third insulating layer 117, and a surface roughness of the third insulating layer 117 is not increased. For example, dark spots are not formed or disposed on the display panel, a reflectance of external light is not reduced, and thus luminous efficiency is not reduced.

Referring to FIG. 9C, in order to expose a portion of or part of the pixel electrode 310, an etching process of removing the second preliminary pixel-defining layer 119pb' is performed. The third preliminary pixel-defining layer 119pc', a portion of the third insulating layer 117 corresponding to the peripheral area PA, and a portion of the third insulating layer 117 not overlapping the preliminary pixel-defining layer 119p' may be etched and removed together. The pixel-defining layer 119 may be formed by removing the second preliminary pixel-defining layer 119pb' and the third preliminary pixel-defining layer 119pc'. For example, the etching process may be a dry etching process.

The pixel-defining layer 119 may include the opening 1190P to correspond to the removed second preliminary pixel-defining layer 119pb'. Because the pixel-defining layer 119 is formed by partially etching the preliminary pixel-defining layer 119p', a thickness t4' of the pixel-defining layer 119 may be less than the thickness t1' of the preliminary pixel-defining layer 119p'.

In an embodiment, the second sidewall sw2 of the second insulating layer 115 defining the second opening OP2 may be disposed outside the first sidewall sw1 of the first insulating layer 111 defining the first opening OP1. The first sidewall sw1 of the first insulating layer 111 and the second sidewall sw2 of the second insulating layer 115 may be disposed to be misaligned from each other.

As described above with reference to FIGS. 7G and 9B, the second opening OP2 of the second insulating layer 115 may be formed by using the third insulating layer 117 as an etching mask, and the first opening OP1 of the first insulating layer 111 may be formed by using the preliminary pixel-defining layer 119p' as an etching mask. For example, the first opening OP1 of the first insulating layer 111 and the second opening OP2 of the second insulating layer 115 may be formed by using different etching masks. Therefore, the first sidewall sw1 of the first insulating layer 111 defining the first opening OP1 and the second sidewall sw2 of the second insulating layer 115 defining the second opening OP2 may be misaligned from each other. Steps may be formed at a boundary between the first insulating layer 111 and the second insulating layer 115.

In case that an etching process of removing the second preliminary pixel-defining layer 119pb' is performed, a portion of the third insulating layer 117 may be etched together. As a result, the third insulating layer 117 may include the first portion 117a having the first thickness t1 and the second portion 117b having the second thickness t2 which is less than the first thickness t1. The step st between the first portion 117a and the second portion 117b may be provided or disposed on the upper surface of the third insulating layer 117. The vertical distance d1 between the upper surface of the substrate 100 and the upper surface of the first portion 117a may be different from the vertical distance d2 between the upper surface of the substrate 100 and the upper surface of the second portion 117b. For example, as shown in FIG. 9C, the vertical distance d1 between the upper surface of the substrate 100 and the upper surface of the first portion 117a may be greater than the vertical distance d2 between the upper surface of the substrate 100 and the upper surface of the second portion 117b.

The first portion 117a of the third insulating layer 117 may correspond to a portion protected by the preliminary pixel-defining layer 119p' during the etching process, and the second portion 117b of the third insulating layer 117 may correspond to a portion not protected by the preliminary pixel-defining layer 119p' during the etching process. Accordingly, it may be understood that the first portion 117a of the third insulating layer 117 is formed by using the preliminary pixel-defining layer 119p' as an etching mask. A substantially planar shape of the first portion 117a of the third insulating layer 117 may substantially correspond to a substantially planar shape of the preliminary pixel-defining layer 119p'. In other words, the substantially planar shape of the first portion 117a of the third insulating layer 117 may substantially correspond to the substantially planar shape of the pixel-defining layer 119. The edge of the pixel-defining layer 119 and a sidewall of the first portion 117a may correspond to each other. The pixel-defining layer 119 and the third insulating layer 117 may have the same etched surface s'''.

As in the embodiment, an etching process for partially exposing the pad electrode PE may be performed by using the preliminary pixel-defining layer 119p' formed or disposed on the pixel electrode 310. The surface of the third insulating layer 117 on which the pixel electrode 310 is disposed may be protected by the preliminary pixel-defining layer 119p'. Accordingly, a stepped portion due to a foreign material is not formed or disposed on the surface of the third insulating layer 117, and a surface roughness of the third insulating layer 117 is not increased. For example, dark spots are not formed or disposed on the display panel, a reflectance of external light is not reduced, and thus luminous efficiency is not reduced. Also, because there is no third insulating layer 117 remaining in the peripheral area PA by the etching process, a moisture penetration path from the outside may be blocked, thereby reducing the risk of causing reliability problems such as deterioration of a light-emitting element.

Figure 9D:
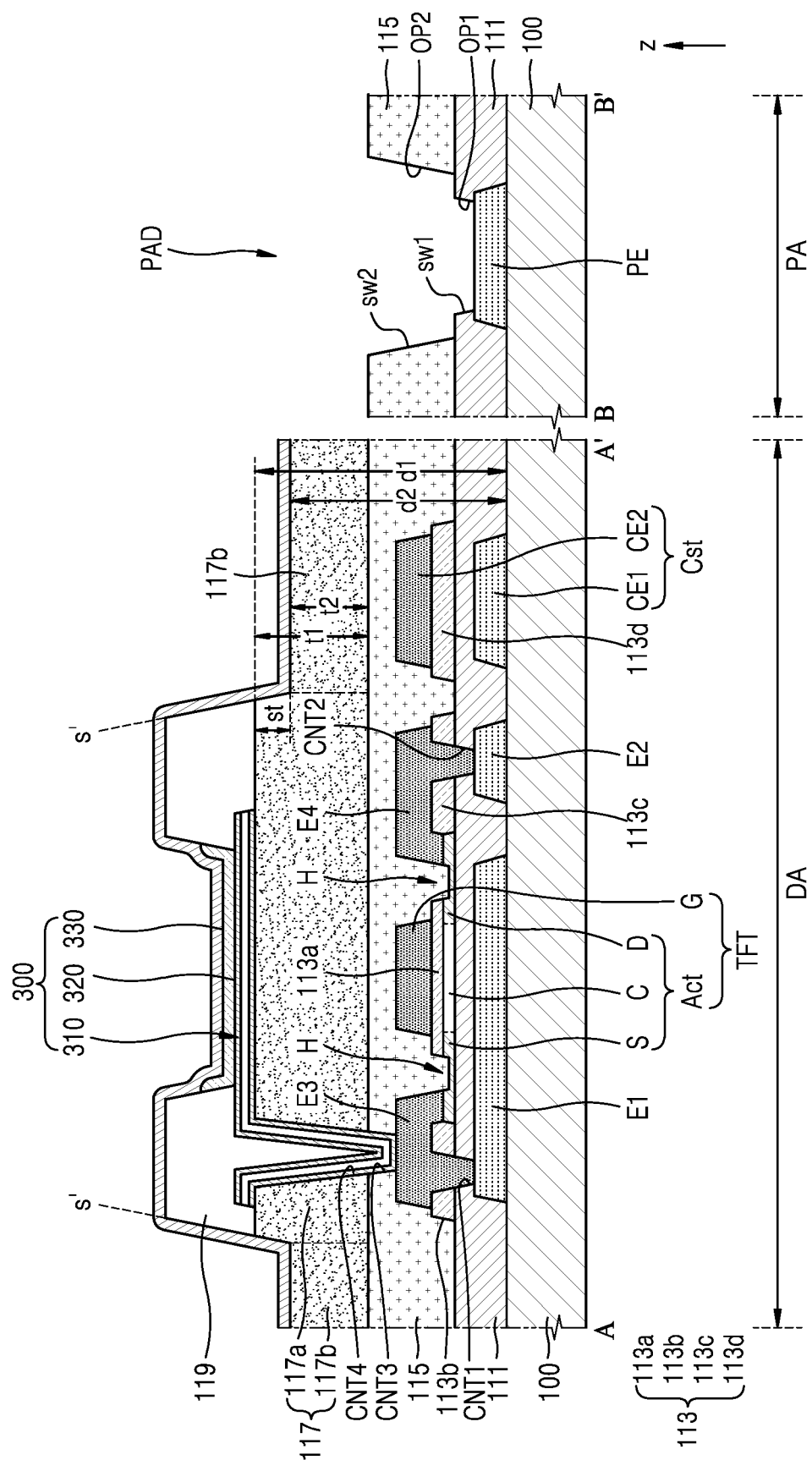

Referring to FIG. 9D, the intermediate layer 320 is formed or disposed on the pixel electrode 310, for example, in an opening of the pixel-defining layer 119. The intermediate layer 320 may include a low molecular weight material or a polymer material. The intermediate layer 320 may be formed by using vacuum deposition, screen printing, inkjet printing, or LITI.

The opposite electrode 330 is formed or disposed to correspond to a plurality of light-emitting elements 300. The opposite electrode 330 may be formed or disposed to cover or overlap the display area DA of the substrate 100 through an open mask. The opposite electrode 330 may be formed by using a deposition method such as CVD, PECVD, LPCVD, PVD, sputtering, or ALD.

Figure 10:
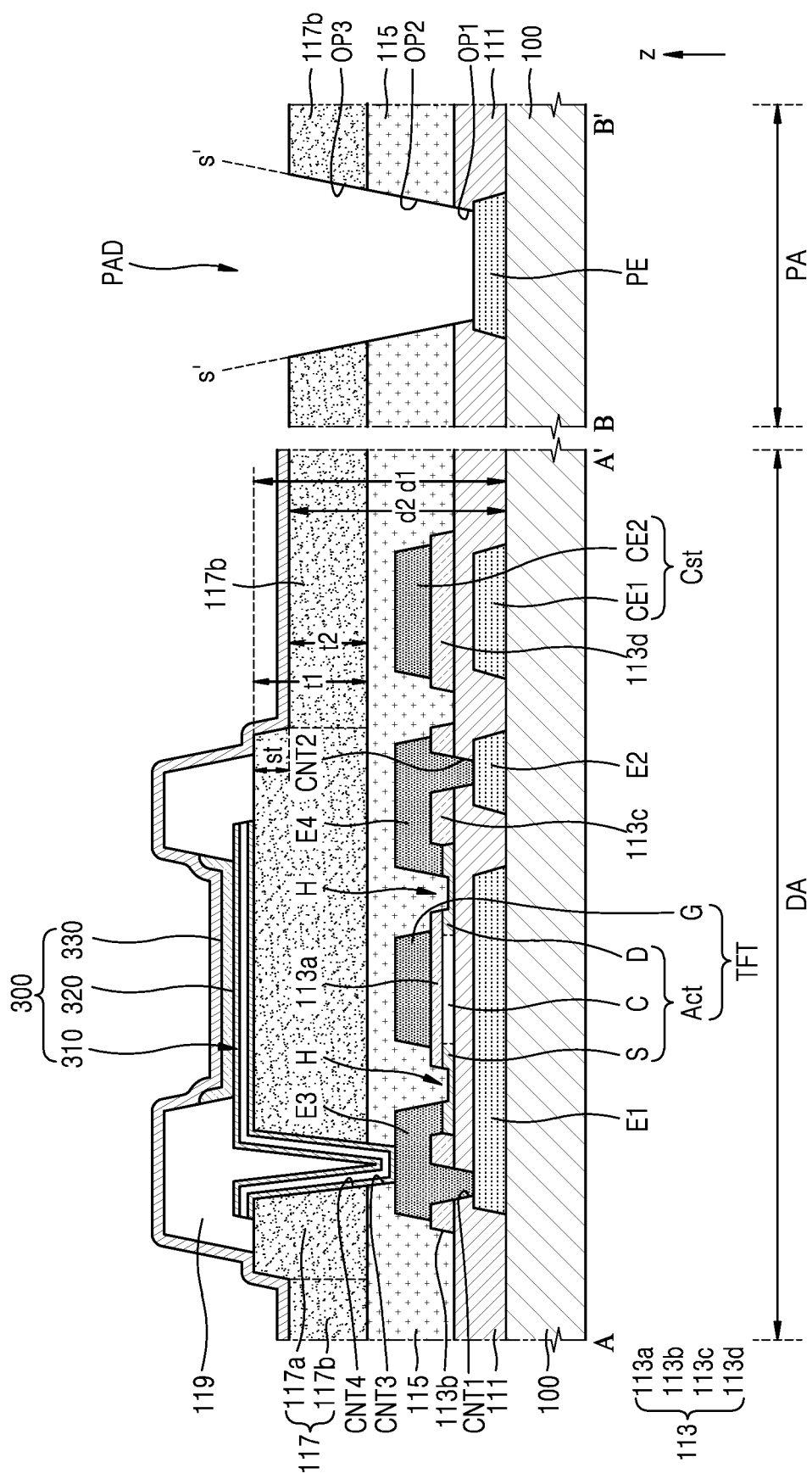
FIG. 10 is a schematic cross-sectional view of a display area and a pad portion of FIG. 1 taken along line A-A' and line B-B', respectively.

FIG. 10 is a schematic cross-sectional view of a display area DA and a pad portion PAD of FIG. 1 taken along line A-A' and line B-B', respectively. In FIG. 10, the same elements as those in FIG. 4 are denoted by the same reference numerals, and thus a repeated description thereof will be omitted. Also, FIG. 10 corresponds to a partial modification of FIG. 4 and thus will be described by focusing on differences from FIG. 4.

Referring to FIG. 10, the third insulating layer 117 may include the first portion 117a, and the second portion 117b extending from the first portion 117a.

In an embodiment, the first portion 117a may have the first thickness t1, and the second portion 117b may have the second thickness t2. The first thickness t1 of the first portion 117a and the second thickness t2 of the second portion 117b may be different from each other. For example, as shown in FIG. 10, the first thickness t1 of the first portion 117a may be greater than the second thickness t2 of the second portion 117b.

In an embodiment, the step st between the first portion 117a and the second portion 117b may be provided or disposed on the upper surface of the third insulating layer 117. The vertical distance d1 between the upper surface of the substrate 100 and the upper surface of the first portion 117a may be different from the vertical distance d2 between the upper surface of the substrate 100 and the upper surface of the second portion 117b. For example, as shown in FIG. 10, the vertical distance d1 between the upper surface of the substrate 100 and the upper surface of the first portion 117a may be greater than the vertical distance d2 between the upper surface of the substrate 100 and the upper surface of the second portion 117b.

Figure 11A:
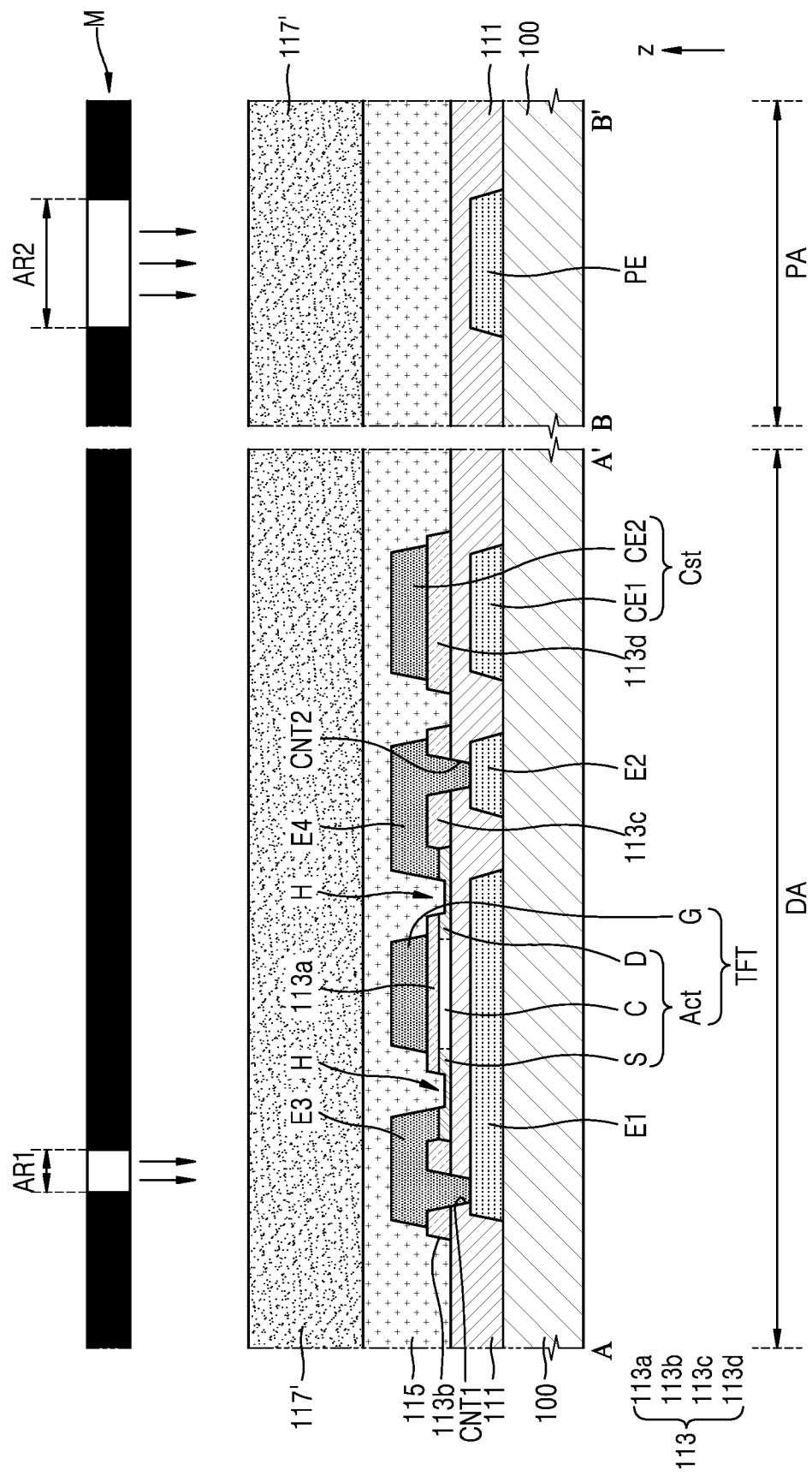
FIGS. 11A to 11G are schematic cross-sectional views sequentially illustrating a method of manufacturing a display apparatus, according to an embodiment, based on FIG. 10.
Figure 11B:
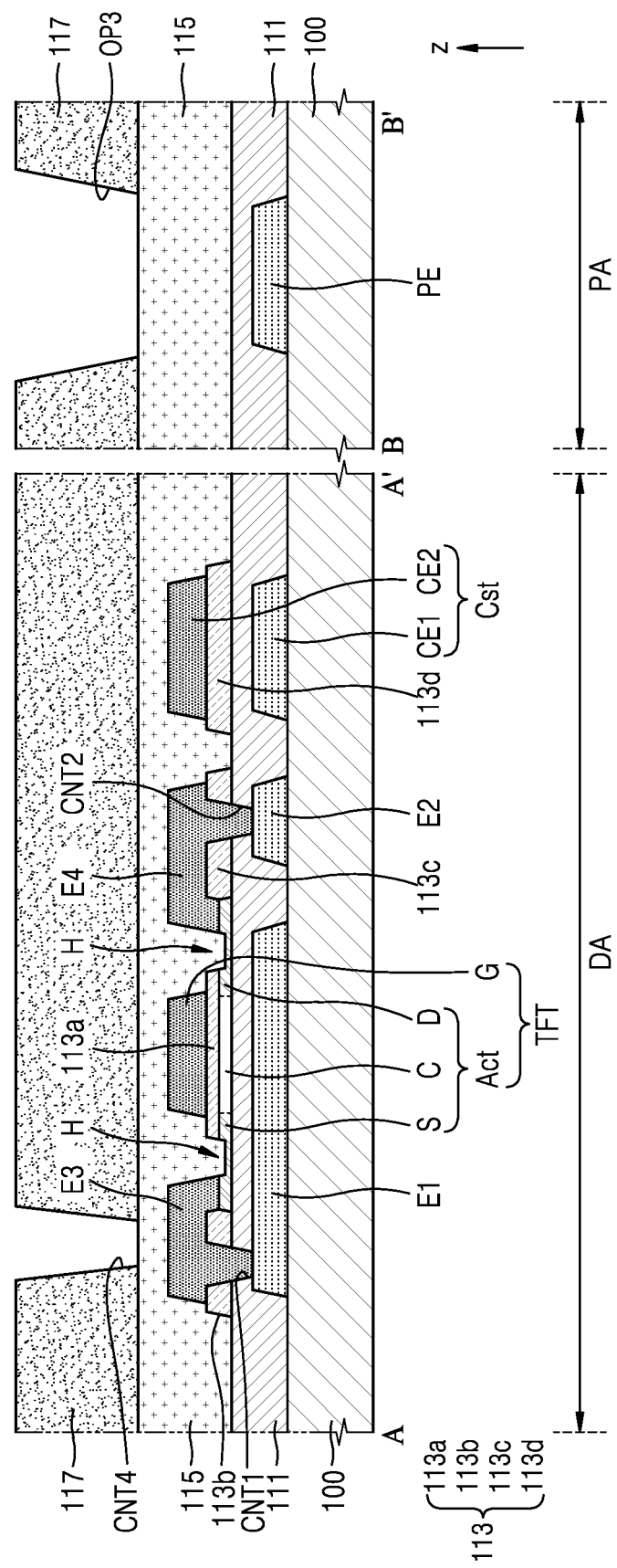

In an embodiment, the pixel electrode 310 may be disposed on the first portion 117a of the third insulating layer 117. The pixel electrode 310 may be surrounded by the step st between the first portion 117a and the second portion 117b. The pixel electrode 310 may be formed by using a photoresist pattern PR as an etching mask as shown in FIG. 11D to be described below, and the first portion 117a of the third insulating layer 117 is also formed by using a photoresist pattern PR as an etching mask as shown in FIG. 11F to be described below. Thus, both the substantially planar shape of the pixel electrode 310 and the substantially planar shape of the first portion 117a may substantially correspond to a substantially planar shape of the photoresist pattern PR. Also, the edge of the pixel electrode 310 and the sidewall of the first portion 117a may correspond to each other.

In an embodiment, the third opening OP3 exposing at least a portion of or a part of the pad electrode PE may be disposed in the second portion 117b of the third insulating layer 117. The first insulating layer 111 and the second insulating layer 115 may have the same etched surface s', and the second insulating layer 115 and the third insulating layer 117 may have the same etched surface s'. The side surface of the first insulating layer 111 exposed by the first opening OP1 and the side surface of the second insulating layer 115 exposed by the second opening OP2 may be located or disposed on the same etched surface s'. The side surface of the second insulating layer 115 exposed by the second opening OP2 and the side surface of the third insulating layer 117 exposed by the third opening OP3 may be located or disposed on the same etched surface s'.

Figure 11C:
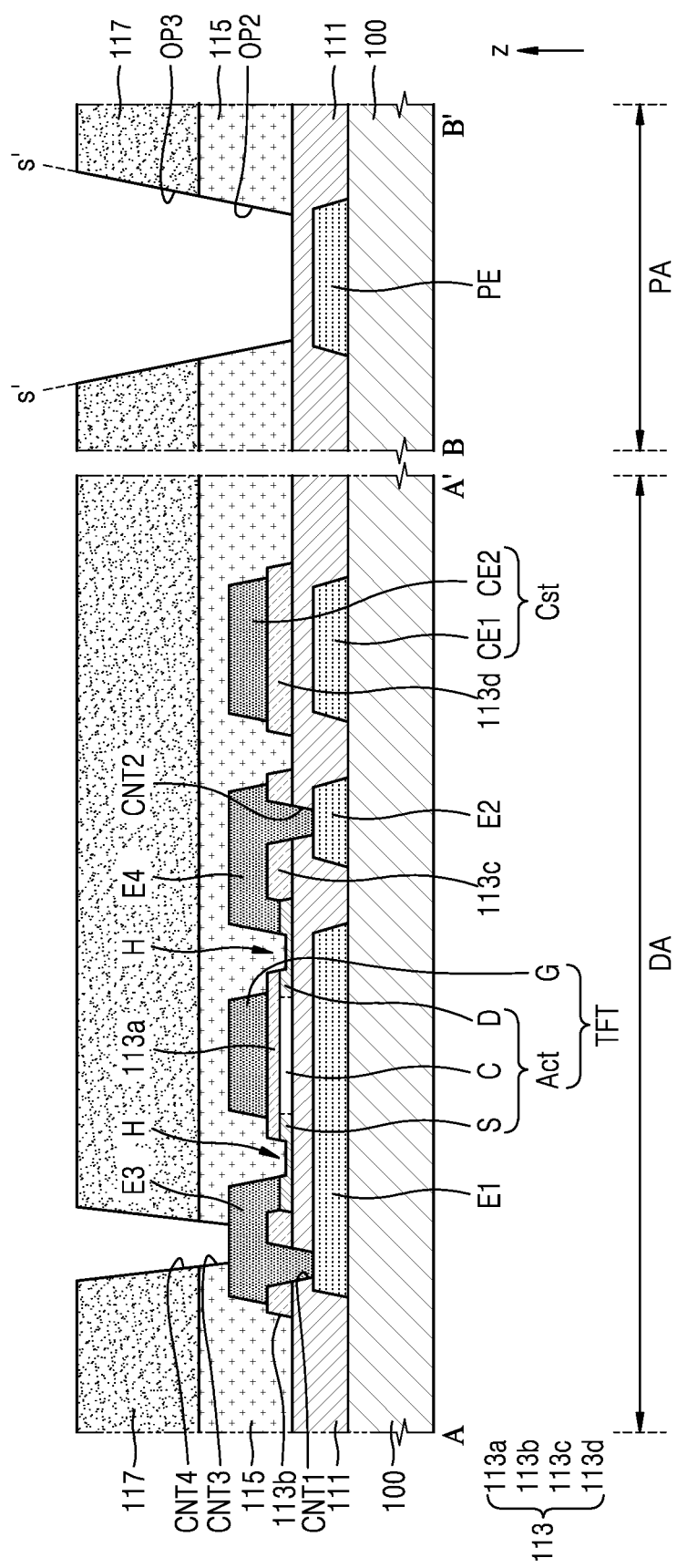
Figure 11D:
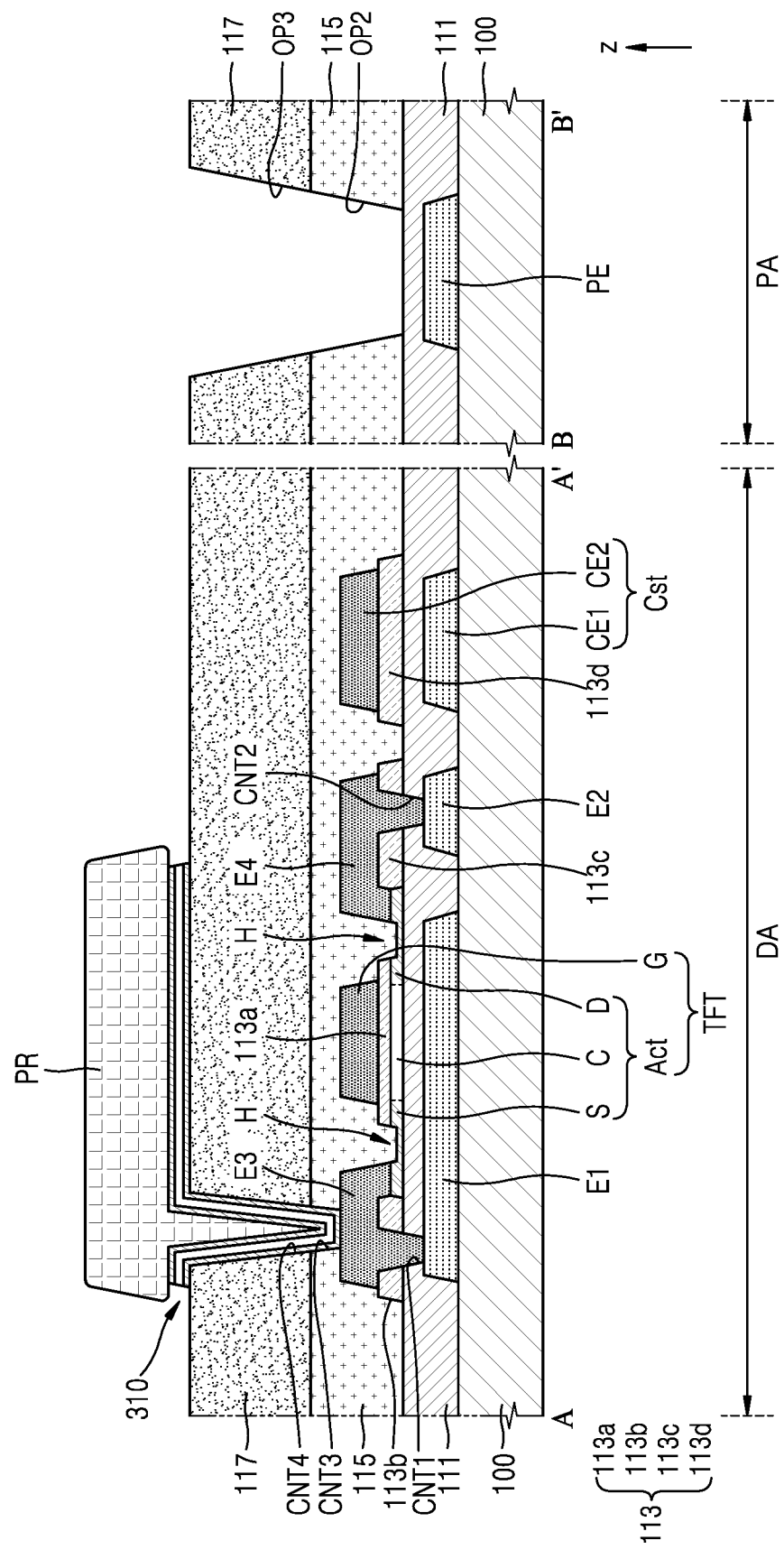

As shown in FIG. 11C to be described below, because the second opening OP2 of the second insulating layer 115 is formed by using the third insulating layer 117 as an etching mask, the substantially planar shape of the second opening OP2 may substantially correspond to the substantially planar shape of the third opening OP3. Also, the sidewall of the second insulating layer 115 exposed by the second opening OP2 and the sidewall of the third insulating layer 117 exposed by the third opening OP3 may also correspond to each other.

As shown in FIG. 11F to be described below, because the first opening OP1 of the first insulating layer 111 is formed by using the second insulating layer 115 and the third insulating layer 117 as etching masks, the substantially planar shape of the first opening OP1 may substantially correspond to the substantially planar shapes of the second opening OP2 and the third opening OP3. Also, the sidewall of the first insulating layer 111 exposed by the first opening OP1 and the sidewall of the second insulating layer 115 exposed by the second opening OP2 may also correspond to each other. The sidewall of the first insulating layer 111 exposed by the first opening OP1 and the sidewall of the third insulating layer 117 exposed by the third opening OP3 may also correspond to each other.

As the third opening OP3 is disposed in the second portion 117b of the third insulating layer 117, a total thickness of insulating layers present in the pad portion PAD may be reduced. The reduced total thickness of the insulating layers present in the pad portion PAD may facilitate electrical contact between the pad electrodes PE and a printed circuit board or a driver IC chip.

In an embodiment, the pixel-defining layer 119 may at least partially expose the upper surface of the third insulating layer 117. As a result, the upper surface of the third insulating layer 117 at least partially exposed by the pixel-defining layer 119 may be in contact with or direct contact with the opposite electrode 330. For example, as shown in FIG. 10, the pixel-defining layer 119 may expose the second portion 117b of the third insulating layer 117 and may partially expose the first portion 117a of the third insulating layer 117. The second portion 117b and the portion of the first portion 117a exposed by the pixel-defining layer 119 may be in contact with or direct contact with the opposite electrode 330.

In an embodiment, on a plane, the edge of the pixel-defining layer 119 may correspond to the edge of the pixel electrode 310. The pixel-defining layer 119 may be disposed to cover or overlap the edge of the pixel electrode 310 and may be disposed along the substantially planar shape of the edge of the pixel electrode 310. The upper surface of the third insulating layer 117 may be at least partially exposed by the pixel-defining layer 119 disposed along the substantially planar shape of the edge of the pixel electrode 310.

An insulating layer including an organic material may be partially removed by the thickness of the pixel-defining layer 119 and the step st of the third insulating layer 117. Because the pixel-defining layer 119 and the third insulating layer 117 adjacent to the light-emitting element 300 are partially removed, a volume of an organic material in the display apparatus 1 may be reduced and outgassing of the organic material may be minimized. Accordingly, even in case that the display apparatus 1 is exposed to sunlight for a long time, decomposition of the organic material due to the sunlight may be prevented or minimized, thereby preventing defects such as pixel shrinkage due to outgassing. The reliability of the display apparatus 1 may be improved.

Although FIG. 10 illustrates that the pixel-defining layer 119 at least partially overlaps the first portion 117a of the third insulating layer 117, the pixel-defining layer 119 may be disposed to at least partially overlap the second portion 117b of the third insulating layer 117.

FIGS. 11A to 11G are schematic cross-sectional views sequentially illustrating a method of manufacturing a display apparatus, according to an embodiment, based on FIG. 10.

In FIGS. 11A through 11G, the same elements as those in FIGS. 7A through 7K are denoted by the same reference numerals, and thus a repeated description thereof will be omitted. Also, FIGS. 11A to 11G correspond to partial modifications of FIGS. 7A to 7K and thus will be described by focusing on differences from FIGS. 7A to 7K.

Referring to FIG. 11A, the insulating material layer 117' may be disposed on the second insulating layer 115. The process before the insulating material layer 117' is disposed on the second insulating layer 115 may be the same as in FIGS. 7A to 7E.

The insulating material layer 117' may include a positive photoresist and may be formed by applying a positive photoresist solution to the second insulating layer 115 by using any of various methods such as spin coating, spraying, or dipping. Before the insulating material layer 117' is applied to the upper surface of the second insulating layer 115, a process of polishing the upper surface of the second insulating layer 115 to which the insulating material layer 117' is to be applied may be additionally performed.

A mask M may be disposed on the insulating material layer 117'. A first area AR1 and a second area AR2 of the mask M may not be shielded to be exposed to the insulating material layer 117', and other areas may be shielded not to be exposed to the insulating material layer 117'.

The insulating material layer 117' may be exposed in each area through the mask M, and the third insulating layer 117 may be formed by removing a portion of the insulating material layer 117' through a developing process. The third insulating layer 117 may have a single-layer or multilayer structure including an organic material or an inorganic material. A degree of adhesion of the second insulating layer 115 may be increased through a curing and drying process of the third insulating layer 117. The curing and drying process may include a heat treatment process. After the third insulating layer 117 is formed, chemical mechanical polishing may be performed to provide a flat upper surface.

Although it has been described in FIG. 11A that the insulating material layer 117' may include the positive photoresist, the insulating material layer 117' may include a negative photoresist. Unlike in a case where the insulating material layer 117' may include the positive photoresist, a portion of the insulating material layer 117' which is exposed to light remains after the developing process.

Referring to FIG. 11B, the third insulating layer 117 may include the fourth contact hole CNT4 to correspond to a portion exposed by the first area AR1 of the mask M. The third insulating layer 117 may include the third opening OP3 to correspond to a portion exposed by the second area AR2 of the mask M.

Referring to FIG. 11C, the third contact hole CNT3 exposing a portion of the third electrode E3 is formed by using the third insulating layer 117 as an etching mask, and the second opening OP2 corresponding to the third opening OP3 is formed. Because the second opening OP2 of the second insulating layer 115 is formed by using the third insulating layer 117 as an etching mask, the substantially planar shape of the second opening OP2 may substantially correspond to the substantially planar shape of the third opening OP3. The sidewall of the second insulating layer 115 may correspond to the sidewall of the third insulating layer 117. The side surface of the second insulating layer 115 exposed by the second opening OP2 and the side surface of the third insulating layer 117 exposed by the third opening OP3 may be located or disposed on the same etched surface s'.

Although FIG. 11C illustrates that only the second insulating layer 115 is etched, depending on the time of an etching process, only a portion of the second insulating layer 115 may be etched, or the first insulating layer 111 may also be partially etched.

Referring to FIG. 11D, the pixel electrode 310 is formed or disposed on the third insulating layer 117. The pixel electrode 310 may be formed by depositing a pixel electrode material layer or a pixel electrode layer on the entire upper surface of the third insulating layer 117 and performing a mask process or an etching process thereon.

The photoresist pattern PR, which is an organic material layer, is formed to correspond to the pixel electrode 310 to be formed or disposed on the pixel electrode material layer. The pixel electrode 310 may be formed by etching a portion of or part of the pixel electrode material layer in which the photoresist pattern PR is not present.

Figure 11E:
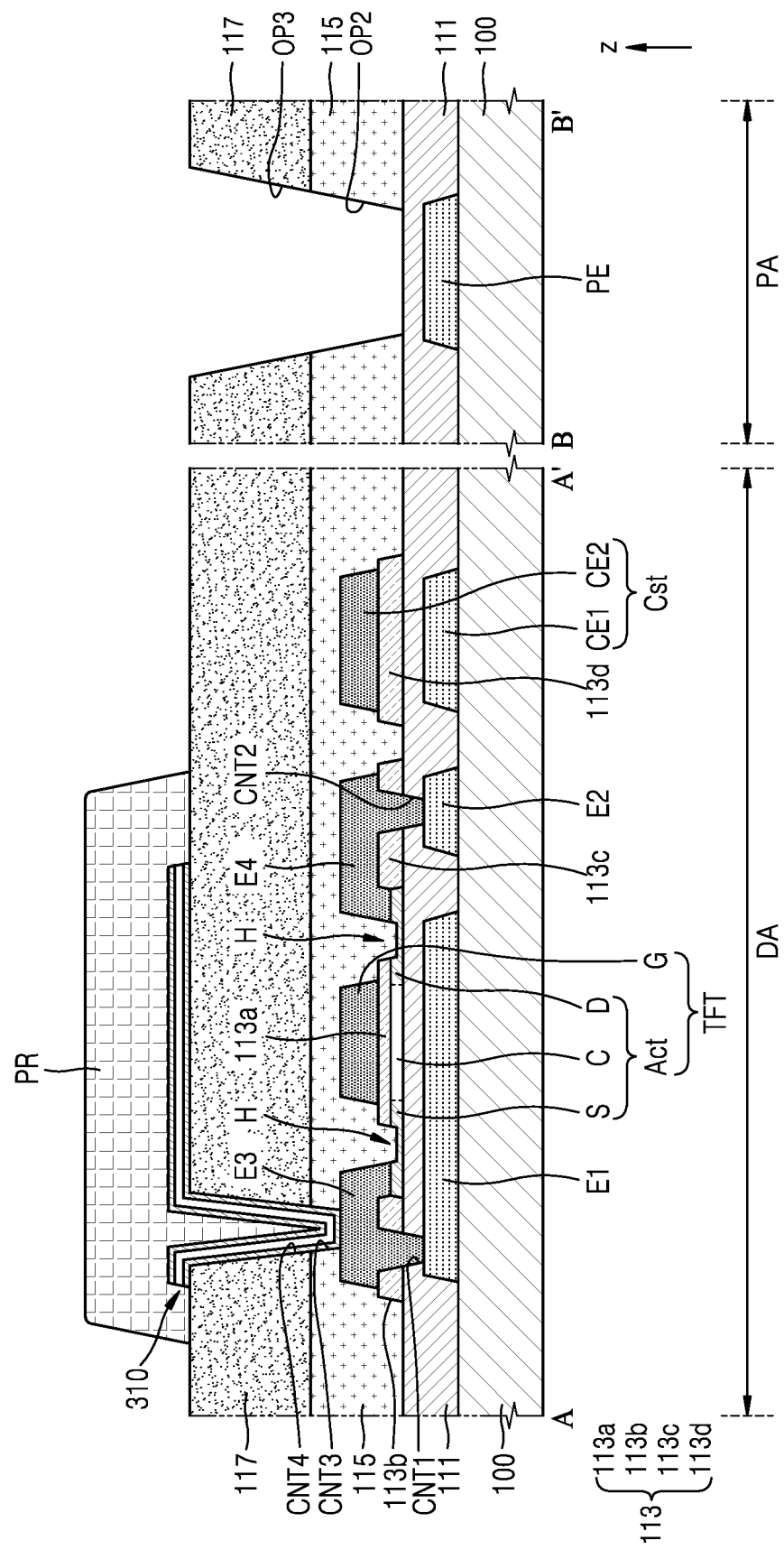
Figure 11F:
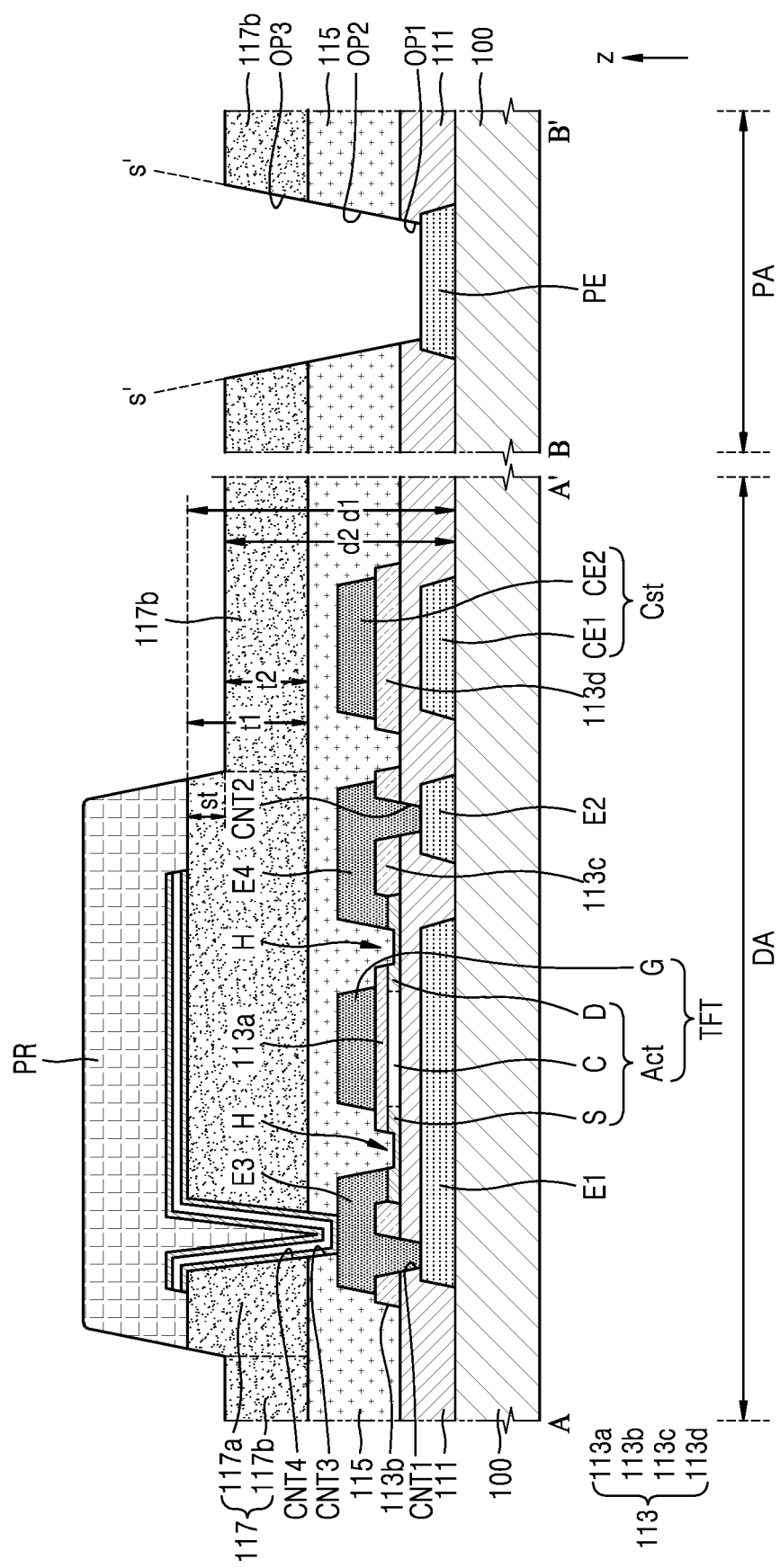

Referring to FIG. 11E, a process of applying heat to the photoresist pattern PR may be performed. The photoresist pattern PR may be partially reflowed by the heat treatment process to surround side surfaces of the pixel electrode 310. Because the side surfaces of the pixel electrode 310 are not exposed to the outside by the photoresist pattern PR, highly reducing silver (Ag) contained in the pixel electrode 310 may be prevented from reacting with external particles.

Referring to FIG. 11F, the first opening OP1 corresponding to the second opening OP2 and the third opening OP3 is formed by using a different etchant without removing the photoresist pattern PR. The first opening OP1 is formed by partially etching the first insulating layer 111.

The first insulating layer 111 and the second insulating layer 115 may have the same etched surface s', and the second insulating layer 115 and the third insulating layer 117 may have the same etched surface s'. The side surface of the first insulating layer 111 exposed by the first opening OP1 and the side surface of the second insulating layer 115 exposed by the second opening OP2 may be located or disposed on the same etched surface s'. The side surface of the second insulating layer 115 exposed by the second opening OP2 and the side surface of the third insulating layer 117 exposed by the third opening OP3 may be located or disposed on the same etched surface s'.

Because the first opening OP1 of the first insulating layer 111 is formed by using the third insulating layer 117 as an etching mask, the substantially planar shape of the first opening OP1 may substantially correspond to the substantially planar shape of the third opening OP3. Because the second opening OP2 of the second insulating layer 115 is formed by using the third insulating layer 117 as an etching mask, the substantially planar shape of the second opening OP2 may substantially correspond to the substantially planar shape of the third opening OP3.

In case that the first insulating layer 111 is partially etched, a portion of the photoresist pattern PR and a portion of the third insulating layer 117 may be etched together. As a result, the third insulating layer 117 may include the first portion 117a having the first thickness t1 and the second portion 117b having the second thickness t2 which is less than the first thickness t1. The step st between the first portion 117a and the second portion 117b may be provided or disposed on the upper surface of the third insulating layer 117. The vertical distance d1 between the upper surface of the substrate 100 and the upper surface of the first portion 117a may be different from the vertical distance d2 between the upper surface of the substrate 100 and the upper surface of the second portion 117b. For example, as shown in FIG. 11F, the vertical distance d1 between the upper surface of the substrate 100 and the upper surface of the first portion 117a may be greater than the vertical distance d2 between the upper surface of the substrate 100 and the upper surface of the second portion 117b.

Also, in case that the portion of the third insulating layer 117 is etched, a surface of the first portion 117a protected by the photoresist pattern PR may be maintained flat.

The pixel electrode 310 is formed by using the photoresist pattern PR as an etching mask, and the first portion 117a of the third insulating layer 117 is also formed by using the photoresist pattern PR as an etching mask. Thus, both the substantially planar shape of the pixel electrode 310 and the substantially planar shape of the first portion 117a may substantially correspond to the substantially planar shape of the photoresist pattern PR. Also, the edge of the pixel electrode 310 and the sidewall of the first portion 117a may correspond to each other.

As a comparative example, in case that a buffer layer and an inorganic insulating layer for exposing a portion of or a part of a pad electrode are partially etched, a planarization layer on which a pixel electrode is disposed may be used as a mask. In case that a foreign material exists on the surface of the planarization layer, a stepped portion may be formed or disposed between a portion on which the foreign material exists and a portion on which the foreign material does not exist during the etching process. In case that a light-emitting element is disposed on the surface of the planarization layer having the stepped portion, a short may occur between the pixel electrode and an opposite electrode, thereby resulting in dark spots on a display panel. Also, because the surface of the planarization layer is not protected during the etching process, a surface roughness of the planarization layer may be increased. In case that the pixel electrode is disposed on the surface of the planarization layer having the increased surface roughness, a reflectance of external light may be reduced, and luminous efficiency may be reduced.

However, as in the embodiment, after the pixel electrode 310 is formed, an etching process for partially exposing the pad electrode PE may be performed without removing the photoresist pattern PR. The surface of the third insulating layer 117 on which the pixel electrode 310 is disposed may be protected by the photoresist pattern PR. Accordingly, a stepped portion due to a foreign material is not formed or disposed on the surface of the third insulating layer 117, and a surface roughness of the third insulating layer 117 is not increased. For example, dark spots are not formed or disposed on the display panel, a reflectance of external light is not reduced, and thus luminous efficiency is not reduced.

Figure 11G:
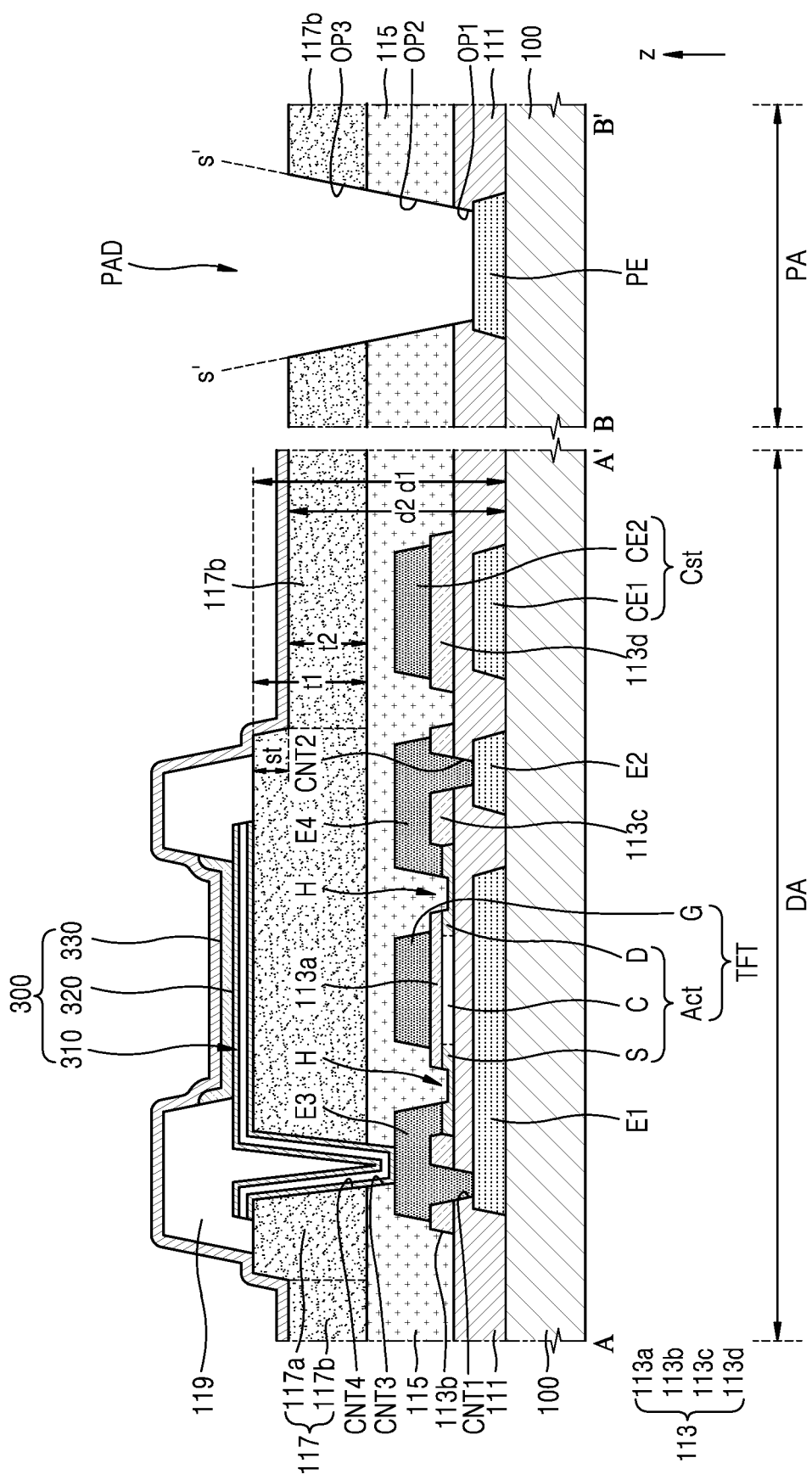

Referring to FIG. 11G, the pixel-defining layer 119 that covers or overlaps the edge of the pixel electrode 310 and may include an opening exposing a central portion thereof is formed or disposed on the entire upper surface of the third insulating layer 117. The pixel-defining layer 119 may include at least one organic insulating material selected from the group consisting of polyimide, polyamide, an acrylic resin, benzocyclobutene, and a phenolic resin by using spin coating or the like within the spirit and the scope of the disclosure.

The intermediate layer 320 is formed or disposed on the pixel electrode 310, for example, in an opening of the pixel-defining layer 119. The intermediate layer 320 may include a low molecular weight material or a polymer material. The intermediate layer 320 may be formed by using vacuum deposition, screen printing, inkjet printing, or LITI.

Although FIG. 11G illustrates that the pixel-defining layer 119 at least partially overlaps the first portion 117a of the third insulating layer 117, the pixel-defining layer 119 may be disposed to at least partially overlap the second portion 117b of the third insulating layer 117.

The opposite electrode 330 is formed or disposed to correspond to a plurality of light-emitting elements 300. The opposite electrode 330 may be formed or disposed to cover or overlap the display area DA of the substrate 100 through an open mask. The opposite electrode 330 may be formed by using a deposition method such as CVD, PECVD, LPCVD, PVD, sputtering, or ALD.

Figure 12:
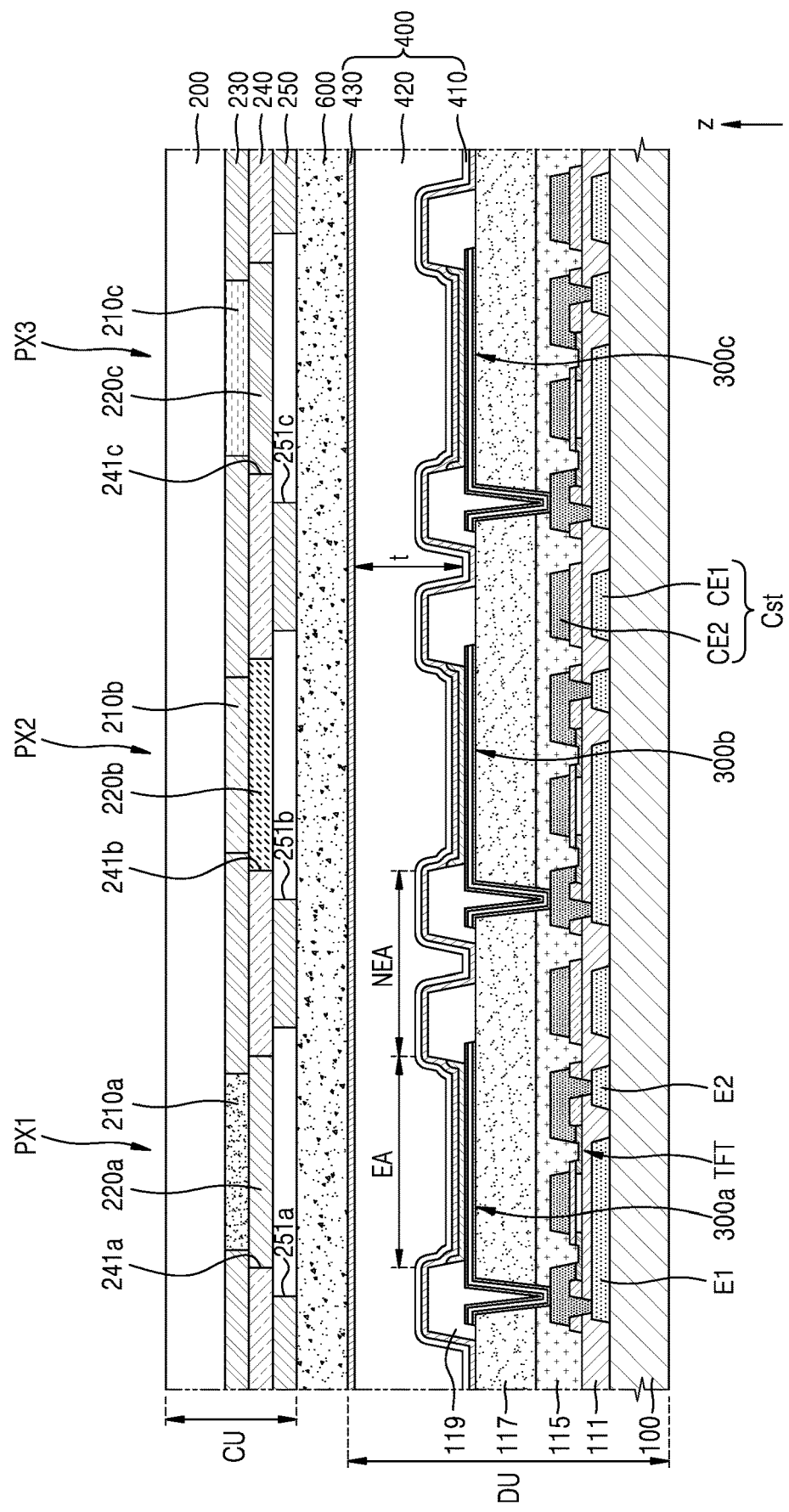
FIG. 12 is a schematic cross-sectional view of a display apparatus according to an embodiment.

FIG. 12 is a schematic cross-sectional view of a display apparatus according to an embodiment. In FIG. 12, the same elements as those in FIG. 4 are denoted by the same reference numerals, and thus a repeated description thereof will be omitted.

Referring to FIG. 12, according to an embodiment, at least one thin-film transistor TFT and a display element electrically connected to the at least one thin-film transistor TFT may be disposed on the display area DA of the display apparatus 1 (see FIG. 1).

According to an embodiment, the display area DA of the display apparatus 1 may include a first pixel PX1, a second pixel PX2, and a third pixel PX3. However, this is merely an example, and the display apparatus 1 may include more pixels. Although the first to third pixels PX1, PX2, and PX3 are adjacent to one another in FIG. 12, embodiments are not limited thereto. For example, elements such as other wirings may be between the first to third pixels PX1, PX2, and PX3. Accordingly, for example, the first pixel PX1 and the second pixel PX2 may not be adjacent to each other. Also, in FIG. 12, cross-sections of the first to third pixels PX1, PX2, and PX3 may not be cross-sections in the same direction.

Each of the first to third pixels PX1, PX2, and PX3 may include an emission area EA. The emission area EA may be an area where light is generated and is emitted to the outside. The non-emission area NEA may be between the emission areas EA, and thus the emission areas EA may be divided by the non-emission area NEA.

The first to third pixels PX1, PX2, and PX3 may emit light of different colors. For example, the first pixel PX1 may emit red light, the second pixel PX2 may emit green light, and the third pixel PX3 may emit blue light. In a plan view, the emission areas EA may have any of various substantially polygonal shapes or a substantially circular shape and may be disposed in any of various patterns such as a stripe pattern or a PenTile® pattern.

According to an embodiment, the display apparatus 1 may include the first quantum dot layer 220a, the second quantum dot layer 220b, and the transmissive layer 220c to respectively correspond to the emission areas EA. The first quantum dot layer 220a, the second quantum dot layer 220b, and the transmissive layer 220c may include quantum dots and metal nano-particles.

For example, the first pixel PX1 may include the first quantum dot layer 220a, the second pixel PX2 may include the second quantum dot layer 220b, and the third pixel PX3 may include the transmissive layer 220c.

In an embodiment, average sizes of quantum dots included in the first quantum dot layer 220a and the second quantum dot layer 220b may be different from each other.

Hereinafter, the display apparatus 1 according to an embodiment will be described in detail according to a stacking order of FIG. 12.

The substrate 100 (hereinafter, referred to as the lower substrate) may include a glass material, a ceramic material, a metal material, or a flexible or bendable material. A barrier layer (not shown) may be further included in the lower substrate 100 and the first insulating layer 111.

The first electrode E1, the second electrode E2, the thin-film transistor TFT, and the storage capacitor Cst may be disposed on the lower substrate 100.

The second insulating layer 115 may be provided or disposed on the thin-film transistor TFT. The third insulating layer 117 may be disposed on the second insulating layer 115, and the first to third light-emitting elements 300a, 300b, and 300c may be disposed on the third insulating layer 117. Each of the first to third light-emitting elements 300a, 300b, and 300c commonly may include a pixel electrode, an intermediate layer including an organic emission layer, and an opposite electrode. The pixel-defining layer 119 may be disposed on the third insulating layer 117.

In an embodiment, the pixel-defining layer 119 may at least partially expose the upper surface of the third insulating layer 117. The pixel-defining layer 119 may at least partially overlap the third insulating layer 117. As a result, as shown in FIG. 12, the upper surface of the third insulating layer 117 at least partially exposed by the pixel-defining layer 119 may be in contact with or direct contact with the opposite electrode 330.

In an embodiment, on a plane, the edge of the pixel-defining layer 119 may correspond to the edge of the pixel electrode 310. The pixel-defining layer 119 may be disposed to cover or overlap the edge of the pixel electrode 310 and may be disposed along the substantially planar shape of the edge of the pixel electrode 310. The upper surface of the third insulating layer 117 may be at least partially exposed by the pixel-defining layer 119 disposed along the substantially planar shape of the edge of the pixel electrode 310.

An insulating layer including an organic material may be partially removed by the thickness of the pixel-defining layer 119. Because the pixel-defining layer 119 adjacent to each of the first to third light-emitting elements 300a, 300b, and 300c is partially removed, a volume of an organic material in the display apparatus 1 may be reduced and outgassing of the organic material may be minimized. Accordingly, even in case that the display apparatus 1 is exposed to sunlight for a long time, decomposition of the organic material due to the sunlight may be prevented or minimized, thereby preventing defects such as pixel shrinkage due to outgassing. The reliability of the display apparatus 1 may be improved.

Because the first to third light-emitting elements 300a, 300b, and 300c may be easily damaged by external moisture or oxygen, the first to third light-emitting elements 300a, 300b, and 300c may be covered or overlapped and protected by the thin-film encapsulation layer 400. The thin-film encapsulation layer 400 may cover or overlap the display area DA and may extend to the outside of the display area DA. The thin-film encapsulation layer 400 may include at least one organic encapsulation layer and at least one inorganic encapsulation layer. For example, the thin-film encapsulation layer 400 may include the first inorganic encapsulation layer 410, the organic encapsulation layer 420, and the second inorganic encapsulation layer 430.

The first inorganic encapsulation layer 410 may cover or overlap the opposite electrode 330 and may include silicon oxide, silicon nitride, and/or silicon trioxynitride. Although not shown in FIG. 12, other layers such as a capping layer may be between the first inorganic encapsulation layer 410 and the opposite electrode 330 when necessary. Because the first inorganic encapsulation layer 410 is formed along a structure under or below the first inorganic encapsulation layer 410, an upper surface of the first inorganic encapsulation layer 410 is not flat. The organic encapsulation layer 420 covers or overlaps the first inorganic encapsulation layer 410, and unlike the first inorganic encapsulation layer 410, the organic encapsulation layer 420 may have a substantially flat upper surface.

Even in case that cracks occur in the thin-film encapsulation layer 400, the cracks may not be connected between the first inorganic encapsulation layer 410 and the organic encapsulation layer 420 or between the organic encapsulation layer 420 and the second inorganic encapsulation layer 430 due to the multilayer structure. Accordingly, the formation of a path through which external moisture or oxygen penetrates into the display area DA may be prevented or minimized.

As described above, the insulating layer including the organic material may be partially removed by the thickness of the pixel-defining layer 119. The organic encapsulation layer 420 may be further disposed by an amount by which the insulating layer is removed. Because a thickness t of the organic encapsulation layer 420 may be increased by the amount by which the insulating layer is removed, it is difficult for a foreign material introduced from the outside to reach the opposite electrode 330. In case that the foreign material introduced from the outside reaches the opposite electrode 330, deterioration of the light-emitting element 300 may occur. However, because it is difficult for the foreign material to reach the opposite electrode 330 due to the organic encapsulation layer 420 having the increased thickness, deterioration of the light-emitting element 300 may be prevented. For example, a problem that the thin-film encapsulation layer 400 is damaged by the foreign material introduced from the outside and the light-emitting element 300 deteriorates due to damage to the thin-film encapsulation layer 400 may be prevented.

Although FIG. 12 illustrates that only the pixel-defining layer 119 is partially removed, as shown in FIGS. 8 and 10 described above, the insulating layer including the organic material may be partially removed by the thickness of the pixel-defining layer 119 and the step st of the third insulating layer 117. The thickness t of the organic encapsulation layer 420 may be increased by the step st of the third insulating layer 117.

The upper substrate 200 may be located or disposed over the lower substrate 100, and the opposite electrode 330 may be between the upper substrate 200 and the lower substrate 100. The upper substrate 200 may include glass, a metal, or a polymer resin. In case that the upper substrate 200 is flexible or bendable, the upper substrate 200 may include a polymer resin such as a polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the upper substrate 200 may have a multilayer structure including two layers each including a polymer resin and a barrier layer between the two layers, the barrier layer including an inorganic material, such as silicon oxide, silicon nitride, or silicon oxynitride.

A light-shielding layer 230 is disposed on a bottom surface of the upper substrate 200 facing the lower substrate 100. The light-shielding layer 230 has openings respectively corresponding to the first to third light-emitting elements 300a, 300b, and 300c, and the first to third filter layers 210a, 210b, and 210c are respectively located or disposed in the openings. The light-shielding layer 230 that is a black matrix may be a layer for improving color sharpness and contrast. The light-shielding layer 230 may include at least one of a black pigment, a black dye, and black particles. In an embodiment, the light-shielding layer 230 may include a material such as Cr or $CrO_X$, $Cr/CrO_X$, $Cr/CrO_X/CrN_Y$, a resin (carbon pigment, RGB mixed pigment), graphite, or a non-Cr based material.

The first filter layer 210a may pass therethrough only light having a wavelength ranging from about 630 nm to about 780 nm, the second filter layer 210b may pass therethrough only light having a wavelength ranging from about 495 nm to about 570 nm, and the third filter layer 210c may pass therethrough only light having a wavelength ranging from about 450 nm to about 495 nm. The first to third filter layers 210a, 210b, and 210c may reduce reflection of external light in the display apparatus 1.

A first upper insulating layer 240 is disposed on the light-shielding layer 230. The first upper insulating layer 240 has a $1\text{-}1^{st}$ opening 241a corresponding to the first light-emitting element 300a, a $1\text{-}2^{nd}$ opening 241b corresponding to the second light-emitting element 300b, and a $1\text{-}3^{rd}$ opening 241c corresponding to the third light-emitting element 300c. The first quantum dot layer 220a is located or disposed in the $1\text{-}1^{st}$ opening 241a, the second quantum dot layer 220b is located or disposed in the $1\text{-}2^{nd}$ opening 241b, and the transmissive layer 220c is located or disposed in the $1\text{-}3^{rd}$ opening 241c. The first quantum dot layer 220a and the second quantum dot layer 220b may be formed by using inkjet printing.

The first upper insulating layer 240 may include, for example, an organic material. When necessary, the first upper insulating layer 240 may include a light-shielding material to function as a light-shielding layer. The light-shielding material may include at least one of, for example, a black pigment, a black dye, black particles, and metal particles. In an embodiment, the first upper insulating layer 240 may have a blue color.

The first quantum dot layer 220a may convert light in a first wavelength band generated by the intermediate layer 320 on the pixel electrode 310 into light in a second wavelength band. For example, in case that light having a wavelength ranging from about 450 nm to about 495 nm is generated by the intermediate layer 320 on the pixel electrode 310, the first quantum dot layer 220a may convert the light into light having a wavelength ranging from about 630 nm to about 780 nm. Accordingly, in the first pixel PX1, the light having the wavelength ranging from about 630 nm to about 780 nm is emitted through the upper substrate 200 to the outside.

The second quantum dot layer 220b may convert light in the first wavelength band generated by the intermediate layer 320 on the pixel electrode 310 into light in a third wavelength band. For example, in case that light having a wavelength ranging from about 450 nm to about 495 nm is generated by the intermediate layer 320 on the pixel electrode 310, the second quantum dot layer 220b may convert the light into light having a wavelength ranging from about 495 nm to about 570 nm. Accordingly, in the second pixel PX2, the light having the wavelength ranging from about 495 nm to about 570 nm is emitted through the upper substrate 200 to the outside.

Each of the first quantum dot layer 220a and the second quantum dot layer 220b may be formed by dispersing quantum dots in a resin. The quantum dots include a semiconductor material such as cadmium sulfide (CdS), cadmium telluride (CdTe), zinc sulfide (ZnS), or indium phosphide (InP). The quantum dots may have a size of several nanometers, and a wavelength of light after conversion varies according to the size of the quantum dots. Any transmissive material may be used as the resin of the first quantum dot layer 220a and the second quantum dot layer 220b. For example, a polymer resin such as acryl, BCB, or HMDSO may be used as a material for forming the first quantum dot layer 220a and the second quantum dot layer 220b.

In the third pixel PX3, light in the first wavelength band generated by the intermediate layer 320 may be emitted to the outside without wavelength conversion. Accordingly, the third pixel PX3 may not include a quantum dot layer. Because a quantum dot layer is not required in the 1-3$^{rd}$ opening 241c, the transmissive layer 220c formed of a transmissive resin may be located or disposed in the 1-3$^{rd}$ opening 241c. The transmissive layer 220c may include an organic material such as acryl, BCB, or HMIVDSO. Of course, in some cases, unlike in FIG. 12, the transmissive layer 220c may not be present in the 1-3$^{rd}$ opening 241c.

In the display apparatus according to an embodiment, light in the second wavelength band is emitted to the outside in the first pixel PX1, light in the third wavelength band is emitted to the outside in the second pixel PX2, and light in the first wavelength band is emitted to the outside in the third pixel PX3. Accordingly, the display apparatus 1 according to an embodiment may display a full-color image.

A second upper insulating layer 250 is disposed on the first upper insulating layer 240. The second upper insulating layer 250 may include a 2-1$^{st}$ opening 251a corresponding to the 1-1$^{st}$ opening 241a, a 2-2$^{nd}$ opening 251b corresponding to the 1-2$^{nd}$ opening 241b, and a 2-3$^{rd}$ opening 251c corresponding to the 1-3$^{rd}$ opening 241c.

The first quantum dot layer 220a and the second quantum dot layer 220b respectively located or disposed in the 1-1$^{st}$ opening 241a and the 1-2$^{nd}$ opening 241b may be formed by using inkjet printing, and the 2-1$^{st}$ opening 251a and the 2-2$^{nd}$ opening 251b may be paths through which ink sprayed via a nozzle falls and moves during the inkjet printing. Ink moving through the second upper insulating layer 250 including the 2-1$^{st}$ opening 251a and the 2-2$^{nd}$ opening 251b may reach the 1-1$^{st}$ opening 241a and the 1-2$^{nd}$ opening 241b, and may form the first quantum dot layer 220a and the second quantum dot layer 220b.

The second upper insulating layer 250 may include a light-shielding material. For example, the light-shielding material may include at least one of a black pigment, a black dye, black particles, and metal particles. Also, in an embodiment, the second upper insulating layer 250 may have a blue color. Although the first upper insulating layer 240 may also include a light-shielding material as described above, in order to form the first quantum dot layer 220a and the second quantum dot layer 220b by using inkjet printing, materials constituting the first upper insulating layer 240 and the second upper insulating layer 250 may be different from each other.

For example, the second upper insulating layer 250, which is a path through which ink sprayed via a nozzle moves during inkjet printing, may include a material having no affinity for the ink. Also, the first upper insulating layer 240 in which the first quantum dot layer 220a and the second quantum dot layer 220b are formed by accumulating ink may include a material having affinity for the ink.

Although both the first upper insulating layer 240 and the second upper insulating layer 250 are illustrated in FIG. 12, the second upper insulating layer 250 may be omitted and only the first upper insulating layer 240 may be disposed on the upper substrate 200.

A filler 600 may be further disposed between the lower substrate 100 and the upper substrate 200. The filler 600 may function as a buffer against external pressure, etc. within the spirit and the scope of the disclosure. The filler 600 may include an organic material such as methyl silicone, phenyl silicone, or polyimide. However, embodiments are not limited thereto, and the filler 600 may include an organic sealant such as a urethane-based resin, an epoxy-based resin, or an acrylic resin, or an inorganic sealant such as silicon.

Figure 13A:
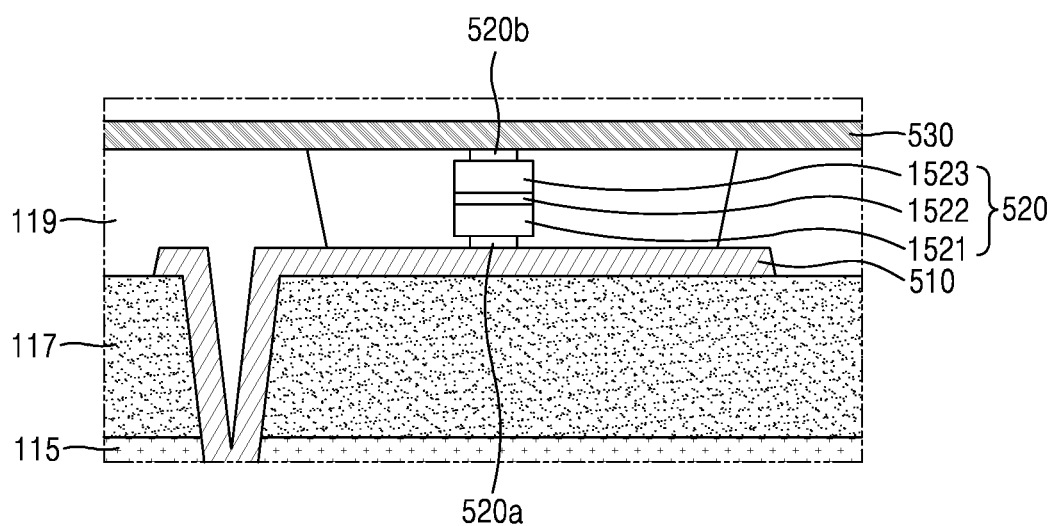
FIG. 13A is a schematic cross-sectional view of an inorganic light-emitting diode according to an embodiment.
Figure 13B:
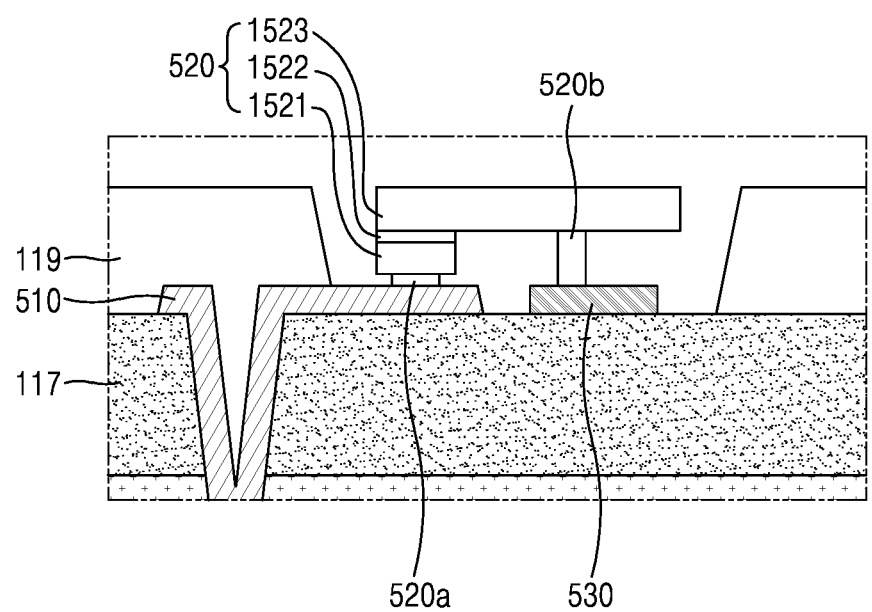
FIG. 13B is a schematic cross-sectional view of an inorganic light-emitting diode according to an embodiment.

FIG. 13A is a schematic cross-sectional view of an inorganic light-emitting diode according to an embodiment, and FIG. 13B is a schematic cross-sectional view of an inorganic light-emitting diode according to an embodiment.

The display apparatus 1 (see FIG. 1) may include an inorganic light-emitting diode (or micro-LED (m-LED)) as a light-emitting element. Each inorganic light-emitting diode (in-LED) may emit blue light, and the emitted light may pass through the color filter or color filter unit CU (see FIG. 12). The display apparatus 1 may display an image by using light having passed through the color filter or color filter unit CU, for example, red light, green light, and blue light.

A pixel electrode 510 shown in FIGS. 13A and 13B may be electrically connected to a pixel circuit including the thin-film transistor TFT (see FIG. 12) and the storage capacitor Cst (see FIG. 12).

Referring to FIG. 13A, an emission layer 520 may be disposed on the pixel electrode 510 (or a first electrode), and an opposite electrode 530 (or a second electrode) may be disposed on the emission layer 520.

The emission layer 520 may include a first semiconductor layer 1521, a second semiconductor layer 1523, and an intermediate layer 1522 between the first semiconductor layer 1521 and a second semiconductor layer 1523.

The first semiconductor layer 1521 may be implemented as, for example, a p-type semiconductor layer. The p-type semiconductor layer may be selected from among semiconductor materials having a composition formula, which is InxAlyGa1-x-yN ($0 \leq x \leq 1$, $0 \leq y \leq 1$, $0 \leq x+y \leq 1$), for example, GaN, AlN, AlGaN, InGaN, InN, InAlGaN, AlInN, or the like, and may be doped with a p-type dopant such as Mg, Zn, calcium (Ca), strontium (Sr), barium (Ba), or the like within the spirit and the scope of the disclosure. The first semiconductor layer 1521 may be electrically connected to the pixel electrode 510 through a first conductive pad electrode 520a.

The second semiconductor layer 1523 may include, for example, an n-type semiconductor layer. The n-type semiconductor layer may be selected from among semiconductor materials having a composition formula, which is InxAlyGa1-x-yN ($0 \leq x \leq 1$, $0 \leq y \leq 1$, $0 \leq x+y \leq 1$), for example, GaN, AlN, AlGaN, InGaN, InN, InAlGaN, AlInN, or the like, and may be doped with an n-type dopant such as silicon (Si), Ge, Sn, or the like within the spirit and the scope of the disclosure. The second semiconductor layer 1523 may be electrically connected to the opposite electrode 530 through a second conductive pad electrode 520b. Embodiments are not limited thereto, and in an embodiment, the first semiconductor layer 1521 may include an n-type semiconductor layer and the second semiconductor layer 1523 may include a p-type semiconductor layer.

The intermediate layer 1522, which is an area where electrons and holes are recombined, transitions to a low energy level as the electrons and holes are recombined, and may emit light (for example, blue light) having a wavelength corresponding thereto. The intermediate layer 1522 may include a semiconductor material having a composition formula, which is InxAlyGa1-x-yN ($0 \leq x \leq 1$, $0 \leq y \leq 1$, $0 \leq x+y \leq 1$), and may have a single quantum well structure of a multi-quantum well (MQW) structure. Also, the intermediate layer 1522 may have a quantum wire structure or a quantum dot structure.

Although FIG. 13A illustrates that the first conductive pad electrode 520a and the second conductive pad electrode 520b are located or disposed opposite each other with respect to the emission layer 520, embodiments are not limited thereto.

Referring to FIG. 13B, the first conductive pad electrode 520a and the second conductive pad electrode 520b may be disposed on one side or on a side of the emission layer 520, for example, under or below the emission layer 520. The pixel electrode 510 and the opposite electrode 530 having a polarity different from that of the pixel electrode 510 may be disposed on the same layer or on a same layer.

Also, in the case of a horizontal or flip-type light-emitting diode shown in FIG. 13B, the emission layer 520 may include the first semiconductor layer 1521, the second semiconductor layer 1523, and the intermediate layer 1522, and features thereof as described above.

According to the embodiments described above, a display apparatus and a method of manufacturing the same, in which a surface of an insulating layer on which a pixel electrode is disposed is prevented from being damaged and a light-emitting element is prevented from deteriorating due to damage to a thin-film encapsulation layer, may be implemented. However, the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
a substrate including a display area and a peripheral area adjacent to the display area;
a pixel circuit comprising a thin-film transistor disposed in the display area of the substrate, the thin-film transistor including:
a semiconductor layer; and
a gate electrode which overlaps a channel region of the semiconductor layer, wherein the semiconductor layer is disposed between the gate electrode and the substrate;
a conductive layer electrically connected to the pixel circuit and disposed between the substrate and the semiconductor layer and including:
a first electrode electrically connected to the pixel circuit and disposed in the display area and overlapping the gate electrode and the semiconductor layer; and
a pad electrode disposed in the peripheral area;
a first insulating layer disposed between the conductive layer and the semiconductor layer and including a first opening exposing at least part of an upper surface of the pad electrode; and
a second insulating layer disposed on the thin-film transistor and including a second opening coinciding with the first opening, wherein an opening area of the second opening of the second insulating layer is greater than an opening area of the first opening of the first insulating layer.

2. The display apparatus of claim 1, wherein
the first insulating layer includes a first sidewall defining the first opening,
the second insulating layer includes a second sidewall defining the second opening, and
the second sidewall is disposed outside of the first sidewall.

3. The display apparatus of claim 1, further comprising a third insulating layer disposed on the second insulating layer and exposing at least part of an upper surface of the second insulating layer in the peripheral area.

4. The display apparatus of claim 3, further comprising:
a pixel electrode disposed on the third insulating layer and electrically connected to the thin-film transistor;
a pixel-defining layer disposed on the third insulating layer and exposing at least part of the pixel electrode;
an intermediate layer disposed on the at least part of the pixel electrode; and
an opposite electrode disposed on the intermediate layer.

5. The display apparatus of claim 4, wherein the pixel-defining layer at least partially exposes an upper surface of the third insulating layer.

6. The display apparatus of claim 5, wherein at least part of the opposite electrode directly contacts the upper surface of the third insulating layer at least partially exposed by the pixel-defining layer.

7. The display apparatus of claim 3, wherein the third insulating layer includes:
a first portion having a first thickness; and
a second portion having a second thickness less than the first thickness of the first portion.

8. The display apparatus of claim 7, further comprising:
a pixel electrode disposed on the first portion of the third insulating layer and electrically connected to the thin-film transistor;
a pixel-defining layer disposed on the third insulating layer and exposing at least part of the pixel electrode and at least part of the second portion of the third insulating layer;
an intermediate layer disposed on the at least part of the pixel electrode; and
an opposite electrode disposed on the intermediate layer.

9. The display apparatus of claim 8, wherein at least part of the opposite electrode directly contacts the second portion of the third insulating layer at least partially exposed by the pixel-defining layer.

10. The display apparatus of claim 1, wherein the second opening of the second insulating layer defines a pad portion including pad electrodes disposed in the peripheral area.

11. The display apparatus of claim 10, wherein
the first opening of the first insulating layer is provided in plural such that a plurality of first openings expose at least part of each of the pad electrodes, and
the plurality of first openings overlap the second opening of the second insulating layer.

12. The display apparatus of claim 1, wherein the pad electrode includes:
a first layer; and
a second layer disposed on the first layer and at least partially exposed by the first opening of the first insulating layer.

13. The display apparatus of claim 1, wherein the conductive layer further includes a second electrode disposed in the display area.

\* \* \* \* \*